United States Patent
Iwashita et al.

(10) Patent No.: US 8,232,040 B2
(45) Date of Patent: Jul. 31, 2012

(54) POSITIVE RESIST COMPOSITION AND METHOD OF FORMING RESIST PATTERN

(75) Inventors: Jun Iwashita, Kawasaki (JP); Takeyoshi Mimura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 392 days.

(21) Appl. No.: 12/620,339

(22) Filed: Nov. 17, 2009

(65) Prior Publication Data

US 2010/0143845 A1    Jun. 10, 2010

(30) Foreign Application Priority Data

Nov. 28, 2008 (JP) ............... P2008-305362
Nov. 28, 2008 (JP) ............... P2008-305363
Nov. 28, 2008 (JP) ............... P2008-305364

(51) Int. Cl.
G03F 7/004 (2006.01)
G03F 7/30 (2006.01)

(52) U.S. Cl. .................. 430/270.1; 430/326; 430/905; 430/910

(58) Field of Classification Search ............... 430/270.1, 430/326, 905, 910
See application file for complete search history.

(56) References Cited

U.S. PATENT DOCUMENTS

| | | | |
|---|---|---|---|
| 5,443,690 A * | 8/1995 | Takechi et al. ............. | 430/286.1 |
| 5,851,727 A * | 12/1998 | Choi et al. ................. | 430/270.1 |
| 5,945,517 A | 8/1999 | Nitta et al. | |
| 5,962,184 A * | 10/1999 | Allen et al. ................. | 430/270.1 |
| 5,968,713 A * | 10/1999 | Nozaki et al. ............... | 430/326 |
| 6,153,733 A | 11/2000 | Yukawa et al. | |
| 6,280,897 B1 * | 8/2001 | Asakawa et al. ............ | 430/270.1 |
| 7,074,543 B2 | 7/2006 | Iwai et al. | |
| 7,482,108 B2 | 1/2009 | Matsumaru et al. | |
| 7,998,654 B2 * | 8/2011 | Nishiyama et al. ......... | 430/270.1 |
| 2004/0170918 A1 * | 9/2004 | Maesawa et al. ........... | 430/270.1 |

FOREIGN PATENT DOCUMENTS

| | | |
|---|---|---|
| JP | H08-101509 | 4/1996 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2000-267286 | 9/2000 |
| JP | 2003-241385 | 8/2003 |
| JP | 2006-45311 | 2/2006 |
| WO | WO 2004/074242 | 9/2004 |

OTHER PUBLICATIONS

Nozaki et al., High etch-resistant EB resists employing adamantyl protective groups and their application for 248-nm lithography, *Journal of Photopolymer Science and Technology* 13(3):397-404, 2000.

* cited by examiner

*Primary Examiner* — John Chu
(74) *Attorney, Agent, or Firm* — Knobbe Martens Olson & Bear LLP

(57) ABSTRACT

A positive resist composition including a base material component (A) that exhibits increased solubility in an alkali developing solution under action of an acid; and an acid generator component (B) that generates an acid upon exposure, wherein the base material component (A) includes a polymeric compound (A1) having a structural unit (a10) derived from hydroxystyrene and a structural unit (a11) represented by general formula (a11-1) shown below:

[Chemical Formula 1]

(a11-1)

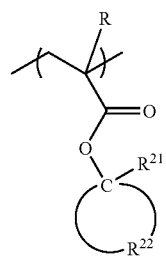

wherein R represents a hydrogen atom, an alkyl group of 1 to 5 carbon atoms, or a halogenated alkyl group of 1 to 5 carbon atoms; $R^{21}$ represents an alkyl group; and $R^{22}$ represents a group that forms an aliphatic monocyclic group of 7 to 10-membered ring together with the carbon atom to which this $R^{22}$ group is bonded.

15 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition and a method of forming a resist pattern.

Priority is claimed on Japanese Patent Applications No. 2008-305362, No. 2008-305363 and No. 2008-305364, filed Nov. 28, 2008, the contents of which are incorporated herein by reference.

2. Description of Related Art

In lithography techniques, for example, a resist film composed of a resist material is formed on a substrate, and the resist film is subjected to selective exposure of radial rays such as light or electron beam, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production of semiconductor elements. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under the action of acid and an acid generator that generates acid upon exposure. For example, a chemically amplified positive resist contains, as a base resin, a resin which exhibits increased solubility in an alkali developing solution under the action of acid, and an acid generator. In the formation of a resist pattern, when acid is generated from the acid generator upon exposure, the exposed portions become soluble in an alkali developing solution.

Currently, as a chemically amplified positive resist, a resin is typically used in which hydrophilic groups are protected with groups which dissociate by action of acid generated from the acid generator (i.e., acid dissociable, dissolution inhibiting groups), and as such resins, polyhydroxystyrene-based resins in which a portion of the hydroxyl groups has been protected with acid dissociable, dissolution inhibiting groups, copolymers of hydroxystyrene and (meth)acrylate esters having an acid dissociable, dissolution inhibiting group (for example, refer to Patent Documents 1 and 2 and Non-Patent Document 1), acrylic resins having an acid dissociable, dissolution inhibiting group (for example, refer to Patent Document 3), or the like are known.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

[Patent Document 1] Japanese Unexamined Patent Application, First Publication No. Hei 8-101509
[Patent Document 2] Japanese Unexamined Patent Application, First Publication No. 2000-267286
[Patent Document 3] Japanese Unexamined Patent Application, First Publication No. 2003-241385
[Non-Patent Document 1] Journal of Photopolymer Science and Technology, Vol. 13, No. 3, (2000), pages 397 to 404

With the expectation of further progress in lithography techniques and further expansion in the potential fields of application for such lithography techniques in the future, there are growing demands for the development of novel materials that can be used in lithography applications. For example, as miniaturization of resist patterns progress, improvement will be demanded for resist materials with respect to resolution. Furthermore, as the resolution improves, improvement will also be demanded for resist materials with respect to other various lithography properties. For example, when the rectangularity of the cross sectional shape of the resist pattern is low, the formation of very fine semiconductor elements or the like may be adversely affected. Accordingly, improvements in the resist pattern shape become more and more important as the resist pattern is miniaturized. In particular, since the lithography processes using electron beams or EUV are targeting the formation of very fine patterns with dimensions of several tens of nanometers, improvements in the resist pattern shape are becoming extremely important.

The present invention takes the above circumstances into consideration, with a first object of providing a positive resist composition capable of forming a resist pattern with a high level of resolution and an excellent shape, and a method of forming a resist pattern.

Further, as a second object, the present invention provides a positive resist composition capable of forming a very fine resist pattern with an excellent shape, and a method of forming a resist pattern.

SUMMARY OF THE INVENTION

In order to achieve the above first object, the present invention employs the following aspects.

Specifically, a first aspect of the present invention is a positive resist composition that includes a base material component (A) that exhibits increased solubility in an alkali developing solution under the action of acid, and an acid generator component (B) that generates an acid upon exposure, wherein the base material component (A) includes a polymeric compound (A1) having a structural unit (a10) derived from hydroxystyrene and a structural unit (a11) represented by general formula (a11-1) shown below.

[Chemical Formula 1]

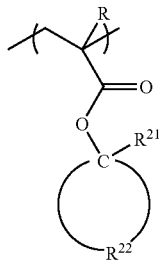

(a11-1)

In the formula, R represents a hydrogen atom, an alkyl group of 1 to 5 carbon atoms, or a halogenated alkyl group of 1 to 5 carbon atoms; $R^{21}$ represents an alkyl group; and $R^{22}$ represents a group that forms an aliphatic monocyclic group of 7 to 10-membered ring together with the carbon atom to which this $R^{22}$ group is bonded.

A second aspect of the present invention is a method of forming a resist pattern, including applying a positive resist composition according to the first aspect on a substrate to form a resist film on the substrate, subjecting the resist film to exposure, and subjecting the resist film to alkali developing to form a resist pattern.

A third aspect of the present invention is a positive resist composition that includes a base material component (A)' that exhibits increased solubility in an alkali developing solution under action of an acid, and an acid generator component (B) that generates acid upon exposure.

wherein the base material component (A)' includes a polymeric compound (A1)' having a structural unit (a10) derived from hydroxystyrene, a structural unit (a11)' represented by general formula (a11-1)' shown below, and a structural unit (a13) represented by general formula (a13-1) shown below.

[Chemical Formula 2]

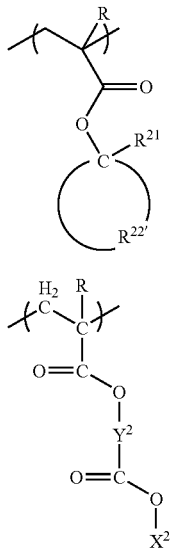

(a11-1)'

(a13-1)

In the formulas, R represents a hydrogen atom, an alkyl group of 1 to 5 carbon atoms, or a halogenated alkyl group of 1 to 5 carbon atoms; $R^{21}$ represents an alkyl group; $R^{22'}$ represents a group that forms an aliphatic monocyclic group together with the carbon atom to which this $R^{22'}$ group is bonded; $Y^2$ represents a divalent linking group; and $X^2$ represents an acid dissociable, dissolution inhibiting group.

A fourth aspect of the present invention is a method of forming a resist pattern, including applying a positive resist composition according to the third aspect on a substrate to form a resist film on the substrate, subjecting the resist film to exposure, and subjecting the resist film to alkali developing to form a resist pattern.

In order to achieve the above second object, the present invention employs the following aspects.

Specifically, a fifth aspect of the present invention is a positive resist composition that includes a base material component (A)" that exhibits increased solubility in an alkali developing solution under the action of acid, and an acid generator component (B) that generates acid upon exposure.

wherein the base material component (A)" includes a polymeric compound (A1)" having a structural unit (a10) derived from hydroxystyrene, a structural unit (a11)' represented by general formula (a11-1)' shown below, and a structural unit (a12) represented by general formula (a12-1) shown below.

[Chemical Formula 3]

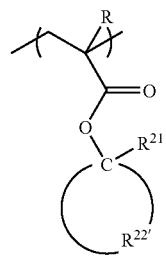

(a11-1)'

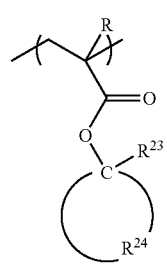

(a12-1)

In the formulas, R represents a hydrogen atom, an alkyl group of 1 to 5 carbon atoms, or a halogenated alkyl group of 1 to 5 carbon atoms; $R^{21}$ represents an alkyl group; $R^{22'}$ represents a group that forms an aliphatic monocyclic group together with the carbon atom to which this $R^{22'}$ group is bonded; $R^{23}$ represents an alkyl group; $R^{24}$ represents a group that forms an aliphatic polycyclic group together with the carbon atom to which this $R^{24}$ group is bonded.

A sixth aspect of the present invention is a method of forming a resist pattern, including applying a positive resist composition according to the fifth aspect on a substrate to form a resist film on the substrate, subjecting the resist film to exposure, and subjecting the resist film to alkali developing to form a resist pattern.

In the present description and claims, the term "alkyl group" includes linear, branched or cyclic monovalent saturated hydrocarbon groups, unless otherwise specified.

An "alkylene group" includes linear, branched or cyclic, divalent saturated hydrocarbon groups, unless otherwise specified.

A "halogenated alkyl group" is a group in which a part or all of the hydrogen atoms of an alkyl group is substituted with halogen atoms. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the first to fourth aspects of the present invention, there are provided a positive resist composition which is capable of forming a resist pattern with a high level of resolution and an excellent shape, and a method of forming a resist pattern.

According to the fifth and sixth aspects of the present invention, there are provided a positive resist composition which is capable of forming a very fine resist pattern with an excellent shape, and a method of forming a resist pattern.

DETAILED DESCRIPTION OF THE INVENTION

First, the first and second aspects of the present invention will be described.

<<Positive Resist Composition of the First Aspect>>

The positive resist composition according to the first aspect of the present invention (hereafter, frequently referred to simply as "resist composition") includes a base material component (A) (hereafter, frequently referred to as "component (A)") which exhibits increased solubility in an alkali developing solution under the action of acid and an acid generator component (B) (hereafter, frequently referred to as "component (B)") which generates acid upon irradiation.

In the positive resist composition of the first aspect, an acid is generated from the component (B) upon irradiation (i.e., exposure), and the action of this acid causes an increase in the solubility of the component (A) in an alkali developing solution. As a result, in the formation of a resist pattern, when a resist film obtained using the positive resist composition according to the first aspect is subjected to selective exposure, the solubility in an alkali developing solution of the exposed portions of the resist film increases, whereas the solubility in the alkali developing solution of the unexposed portions remains unchanged, meaning alkali developing can then be used to form a resist pattern.

In the first to sixth aspect of the present invention, the term "base material component" refers to an organic compound with a film forming capability. As the base material component, an organic compound having a molecular weight of 500 or more is preferably used. When the organic compound has a molecular weight of 500 or more, the film-forming ability is improved, and a nano level resist pattern can be readily formed.

The "organic compound having a molecular weight of 500 or more" which can be used as a base material component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

In general, as a polymer, any of those which have a molecular weight of 2,000 or more is used. Hereafter, a polymer having a molecular weight of 2,000 or more is referred to as a polymeric compound. With respect to a polymeric compound, the "molecular weight" refers to the weight average molecular weight in terms of the polystyrene equivalent value determined by gel permeation chromatography (GPC). Hereafter, a polymeric compound is frequently referred to simply as a "resin".

<Component (A)>

In the positive resist composition according to the first aspect of the present invention, the base material component (A) includes a polymeric compound (A1).

[Polymeric Compound (A1)]

The polymeric compound (A1) (hereafter, referred to as "component (A1)") includes a structural unit (a10) derived from hydroxystyrene and a structural unit (a11) represented by general formula (a11-1) shown below.

The component (A1) may further include a structural unit (a15) derived from styrene, in addition to the structural units (a10) and (a11).

Structural Unit (a10):

In the present description and claims, the term "structural unit derived from hydroxystyrene" refers to a structural unit which is formed by the cleavage of the ethylenic double bond of the hydroxystyrene.

The term "hydroxystyrene" is a general concept that includes both the narrow definition of hydroxystyrene (i.e., a compound in which at least one hydroxyl group is bonded to the benzene ring of vinylbenzene; hereafter, frequently referred to as "unsubstituted hydroxystyrene"), as well as compounds in which the hydrogen atom bonded to the α-position carbon atom of the unsubstituted hydroxystyrene has been substituted with a substituent group (i.e., α-substituted hydroxystyrene), and derivatives thereof. In other words, when simply referred to as "hydroxystyrene" without any particular limitations, the "hydroxystyrene" may be any of an unsubstituted hydroxystyrene, an α-substituted hydroxystyrene or a derivative thereof. Furthermore, unless stated otherwise, the "α-position carbon atom" of a hydroxystyrene refers to the carbon atom to which the benzene ring is bonded.

With respect to the aforementioned α-substituted hydroxystyrene, examples of the substituent which may be bonded to the α-position carbon atom include an alkyl group of 1 to 5 carbon atoms, and an alkyl group of 1 to 5 carbon atoms is particularly desirable. As the above-mentioned alkyl group, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the aforementioned derivative include compounds in which a substituent is bonded to the benzene ring of an unsubstituted hydroxystyrene or α-substituted hydroxystyrene.

Preferred examples of the structural unit (a10) include structural units represented by general formula (a10-1) shown below.

[Chemical Formula 4]

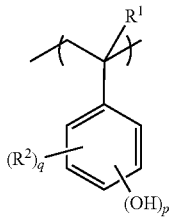

(a10-1)

In the formula, $R^1$ represents a hydrogen atom or an alkyl group of 1 to 5 carbon atoms; $R^2$ represents a halogen atom, an alkyl group of 1 to 5 carbon atoms or a halogenated alkyl group of 1 to 5 carbon atoms; p represents an integer of 1 to 3 and q represents an integer of 0 to 4, with the proviso that p+q is 1 to 5.

In formula (a10-1), $R^1$ represents a hydrogen atom or an alkyl group of 1 to 5 carbon atoms.

As the alkyl group for $R^1$, the same alkyl groups as those described above, which may be bonded to the α-position carbon atom of an α-substituted hydroxystyrene, in connection with the hydroxystyrene can be exemplified.

p represents an integer of 1 to 3 and q represents an integer of 0 to 4, with the proviso that p+q is 1 to 5.

p is most preferably 1.

q is preferably an integer of 0 to 2, more preferably 0 or 1, and particularly preferably 0 from an industrial point of view.

In formula (a10-1), the bonding positions of the hydroxyl groups within the phenyl group are not particularly limited. If p is 1, the bonding position may be any one of the o-position, the m-position, or the p-position, and the p-position is preferred in terms of availability and low cost. If p is 2 or 3, any combination of the bonding positions is suitable.

Further, the bonding positions of $R^2$ within the phenyl group are not particularly limited. If q is 1, the bonding position may be any one of the o-position, the m-position, or the p-position. If q is an integer of 2 or more, any combination of the bonding positions is suitable.

When q is an integer of 2 or more, the plurality of $R^2$ may be the same or different from each other.

$R^2$ represents a halogen atom, an alkyl group of 1 to 5 carbon atoms or a halogenated alkyl group of 1 to 5 carbon atoms.

Examples of the halogen atom for $R^2$ include a fluorine atom, a chlorine atom, a bromine atom and an iodine atom, and a fluorine atom is particularly desirable.

As the alkyl group for $R^2$, the same as the alkyl groups for $R^1$ can be exemplified.

As the halogenated alkyl group for $R^2$, the same alkyl groups as those mentioned above for $R^2$ in which some or all of the hydrogen atoms of the alkyl group have been substituted with halogen atoms can be exemplified, and examples of the halogen atom include the same halogen atoms as those mentioned above for $R^2$. As the halogenated alkyl group for $R^2$, a fluorinated alkyl group is preferable.

As the structural unit (a10), one type of structural unit may be used alone, or two or more types of structural units may be used in combination.

In the component (A1), the amount of the structural unit (a10) based on the combined total of all structural units constituting the component (A1) is preferably 5 to 95 mol %, more preferably 40 to 90 mol %, still more preferably 50 to 85 mol %, and most preferably 55 to 80 mol %. By making the amount of the structural unit (a10) within the above range, a suitable level of alkali solubility can be achieved using a resist composition prepared from the component (A1). Further, the lithographic properties such as the resolution and sensitivity are also improved.

Structural Unit (a11):

The structural unit (a11) is represented by general formula (a11-1) shown below.

In the component (A1), the group within the structural unit (a11) which is formed by $R^{21}$, $R^{22}$ and the carbon atom having $R^{21}$ and $R^{22}$ bonded thereto functions as an acid dissociable, dissolution inhibiting group. Here, an "acid dissociable, dissolution inhibiting group" is a group having an alkali dissolution inhibiting effect that renders the entire component (A1) insoluble in an alkali developing solution prior to dissociation, and then following dissociation under action of acid (the acid generated from the component (B) upon exposure), increases the solubility of the entire component (A1) in the alkali developing solution.

[Chemical Formula 5]

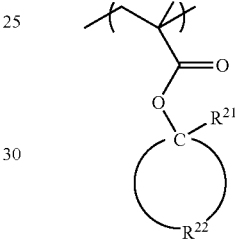

(a11-1)

In the formula, R represents a hydrogen atom, an alkyl group of 1 to 5 carbon atoms, or a halogenated alkyl group of 1 to 5 carbon atoms; $R^{21}$ represents an alkyl group; and $R^{22}$ represents a group that forms an aliphatic monocyclic group of 7 to 10-membered ring together with the carbon atom to which this $R^{22}$ group is bonded.

In general formula (a11-1), R represents a hydrogen atom, an alkyl group of 1 to 5 carbon atoms, or a halogenated alkyl group of 1 to 5 carbon atoms.

As the alkyl group for R, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

As an example of the halogenated alkyl group for R, a group in which part of or all of the hydrogen atoms of the aforementioned alkyl group have been substituted with halogen atoms can be given. Examples of the halogen atom within the halogenated alkyl group include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is most preferable in terms of industrial availability.

In general formula (a11-1), the alkyl group for $R^{21}$ may be a linear, branched or cyclic alkyl group.

The above-mentioned linear alkyl group preferably has 1 to 5 carbon atoms, and more preferably 2 to 4 carbon atoms. Specific examples thereof include a methyl group, an ethyl group, an n-propyl group, an n-butyl group, and an n-pentyl group. Of these, a methyl group, an ethyl group or an n-butyl group is preferred, and an ethyl group is particularly desirable.

The above-mentioned branched alkyl group preferably has 3 to 10 carbon atoms, and more preferably 3 to 5 carbon atoms. Specific examples thereof include an isopropyl group, an isobutyl group, a tert-butyl group, an isopentyl group and a neopentyl group. Of these, an isopropyl group is most preferable.

The above-mentioned cyclic alkyl group preferably has 3 to 10 carbon atoms, and more preferably 5 or 6 carbon atoms. Specific examples thereof include a cyclopentyl group and a cyclohexyl group.

As the above-mentioned alkyl group for $R^{21}$, a linear or branched alkyl group is preferred among the various examples described above, and a methyl group, an ethyl group or an isopropyl group is particularly desirable.

In general formula (a11-1), $R^{22}$ represents a group that, together with the carbon atom to which this $R^{22}$ group is bonded, forms an aliphatic monocyclic group of 7 to 10-membered ring. The aliphatic monocyclic group is preferably an 8 to 10-membered ring, and most preferably an 8-membered ring.

When the above-mentioned aliphatic monocyclic group is a ring constituted of 7 members or more, the effects of the present invention can be satisfactorily obtained. Further, when the above-mentioned aliphatic monocyclic group is a ring constituted of 10 members or less, the heat resistance improves.

Here, the term "aliphatic monocyclic group" refers to a monocyclic group that has no aromaticity.

The basic ring of the "aliphatic monocyclic group" exclusive of substituents is not limited to be constituted from only carbon and hydrogen (not limited to hydrocarbon rings), but is preferably a hydrocarbon ring. Further, the ring may have part of the carbon atoms constituting the ring structure of the above hydrocarbon ring replaced with an ethereal oxygen atom (—O—). The hydrocarbon ring may be either saturated or unsaturated, but in general, the hydrocarbon ring is preferably saturated. Specific examples of the hydrocarbon ring include cycloheptane, cyclooctane, cyclononane and cyclodecane.

The aliphatic monocyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

As an example of $R^{22}$ constituting such an aliphatic monocyclic group, an alkylene group of 6 to 9 carbon atoms which may have a substituent mentioned above or a group in which some of the carbon atoms constituting the alkyl group have been substituted with an ethereal oxygen atom (—O—) can be given.

In the structural unit (a11), examples of the group formed by $R^{21}$, $R^{22}$ and the carbon atom having $R^{21}$ and $R^{22}$ bonded thereto include a 1-methyl-1-cycloheptyl group, a 1-ethyl-1-cycloheptyl group, a 1-isopropyl-1-cycloheptyl group, a 1-methyl-1-cyclooctyl group, a 1-ethyl-1-cyclooctyl group, a 1-isopropyl-1-cyclooctyl group, a 1-methyl-1-cyclodecyl group, a 1-ethyl-1-cyclodecyl group and a 1-isopropyl-1-cyclodecyl group. These groups may have a substituent, such as an alkyl group of 1 to 5 carbon atoms and an alkoxy group of 1 to 5 carbon atoms.

More specifically, examples of the structural unit represented by general formula (a11-1) include structural units represented by general formulas (a11-11) and (a11-12) shown below. These structural units may have a substituent, such as an alkyl group of 1 to 5 carbon atoms and an alkoxy group of 1 to 5 carbon atoms.

In the formulas, h represents an integer of 3 to 6, and is preferably an integer of 4 to 6, and is most preferably 4.

[Chemical Formula 6]

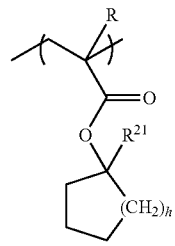

(a11-11)

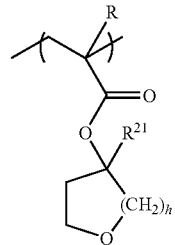

(a11-12)

In the formulas, R represents a hydrogen atom, a lower alkyl group of 1 to 5 carbon atoms, or a halogenated lower alkyl group of 1 to 5 carbon atoms; $R^{21}$ represents an alkyl group; and h represents an integer of 3 to 6.

In general formulas (a11-11) and (a11-12), R and $R^{21}$ are as defined above for R and $R^{21}$ respectively in general formula (a11-1).

As the structural unit (a11), one type of structural unit may be used alone, or two or more types of structural units may be used in combination.

In the component (A1), the amount of the structural unit (a11) based on the combined total of all structural units constituting the component (A1) is preferably 5 to 60 mol %, more preferably 10 to 55 mol %, still more preferably 15 to 50 mol %, and most preferably 20 to 45 mol %. By making the amount of the structural unit (a11) at least as large as the lower limit of the above-mentioned range, an excellent resist pattern can be formed using a resist composition prepared from the component (A1). On the other hand, by making the amount of the structural unit (a11) no more than the upper limit of the above-mentioned range, a good balance can be achieved with the other structural units and the lithography properties are improved.

Structural Unit (a15):

As described above, the component (A) may further include a structural unit (a15) derived from styrene, in addition to the structural units (a10) and (a11). Including the structural unit (a15) enables improvements in the heat resistance and dry etching resistance when a resist composition is prepared. Further, by adjusting the content of the structural unit (a15), the solubility in an alkali developing solution can be adjusted.

In the present descriptions, the term "structural unit derived from styrene" refers to a structural unit which is formed by the cleavage of the ethylenic double bond of the styrene.

The term "styrene" is a general concept that includes both the narrow definition of styrene (i.e., vinylbenzene; hereafter, frequently referred to as "unsubstituted styrene"), as well as compounds in which the hydrogen atom bonded to the α-position carbon atom of the unsubstituted styrene has been substituted with a substituent group (i.e., α-substituted styrene), and derivatives thereof. In other words, when simply referred to as "styrene" without any particular limitations, the "styrene" may be any of an unsubstituted styrene, an α-substituted styrene or a derivative thereof. Furthermore, unless stated otherwise, the "α-position carbon atom" of a styrene refers to the carbon atom to which the benzene ring is bonded.

With respect to the aforementioned α-substituted styrene, examples of the substituent which may be bonded to the α-position carbon atom include an alkyl group of 1 to 5 carbon atoms, and an alkyl group of 1 to 5 carbon atoms is particularly desirable. As the alkyl group, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the aforementioned derivative include those in which a substituent is bonded to the benzene ring of an unsubstituted styrene or α-substituted styrene.

Preferred examples of the structural unit (a15) include structural units represented by general formula (a15-1) shown below.

[Chemical Formula 7]

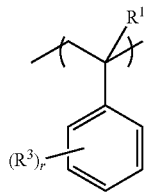

(a15-1)

In the formula, $R^1$ represents a hydrogen atom or an alkyl group of 1 to 5 carbon atoms; $R^3$ represents a halogen atom, an alkyl group of 1 to 5 carbon atoms or a halogenated alkyl group of 1 to 5 carbon atoms; and r represents an integer of 0 to 5.

In general formula (a15-1), $R^1$ is as defined above for $R^1$ in general formula (a10-1).

Examples of $R^3$ include the same halogen atoms, alkyl groups of 1 to 5 carbon atoms or halogenated alkyl groups of 1 to 5 carbon atoms exemplified above for $R^2$ in general formula (a10-1).

r is preferably an integer of 0 to 3, more preferably 0 or 1, and from an industrial viewpoint, 0 is most preferred.

As the structural unit (a15), one type of structural unit may be used alone, or two or more types of structural units may be used in combination.

In the component (A1), the amount of the structural unit (a15) based on the combined total of all structural units constituting the component (A1) is preferably 0 to 30 mol %, more preferably 0 to 20 mol %, and still more preferably 0 to 10 mol %.

The component (A1) may also have an additional structural unit which is other than the above-mentioned structural units (a10), (a11) and (a15), as long as the effects of the present invention are not impaired.

As the additional structural unit, any other structural unit which cannot be classified as one of the above structural units (a10), (a11) and (a15) can be used without any particular limitations, and any of the multitude of conventional structural units used within resist resins for ArF excimer lasers, KrF excimer lasers, EUV, EB or the like can be used.

Preferred examples of the above-mentioned additional structural unit include the structural units (a3), (a4) and (a18) shown below. By combining these structural units, the lithography properties are improved.

Structural Unit (a3):

The structural unit (a3) is a structural unit derived from an acrylate ester containing a polar group-containing aliphatic hydrocarbon group. When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (aliphatic polycyclic groups). These aliphatic polycyclic groups can be selected appropriately from the multitude of groups that have been proposed for the resins of resist compositions designed for use with ArF excimer lasers. The aliphatic polycyclic group preferably has 7 to 30 carbon atoms. Examples of the aliphatic polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), of the various possibilities, structural units derived from an acrylate ester that include an aliphatic polycyclic group that contains a hydroxyl group, a cyano group, a carboxyl group or a hydroxyalkyl group in which a part of the hydrogen atoms of the alkyl group have been substituted with fluorine atoms are particularly desirable.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group within the polar group-containing aliphatic hydrocarbon group is a polycyclic group, structural units represented by formulas (a3-1), (a3-2), and (a3-3) shown below or the like are preferable.

[Chemical Formula 8]

(a3-1)
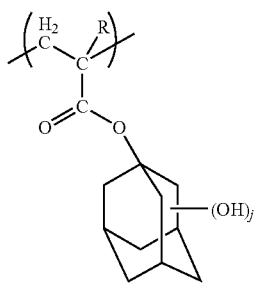

(a3-2)
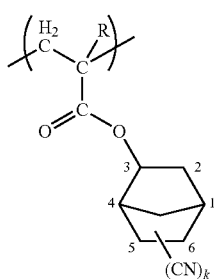

(a3-3)
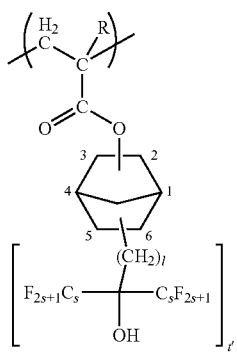

In the formulas, R represents a hydrogen atom, a lower alkyl group of 1 to 5 carbon atoms or a halogenated lower alkyl group of 1 to 5 carbon atoms; j represents an integer of 1 to 3; k represents an integer of 1 to 3; t' represents an integer of 1 to 3; l represents an integer of 1 to 5; and s represents an integer of 1 to 3.

In general formulas (a3-1) to (a3-3), R is as defined above for R in general formula (a11-1).

In general formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In general formula (a3-2), k is preferably 1. The cyano group is preferably bonded to the 5th or 6th position of the norbonyl group.

In general formula (a3-3), t' is preferably 1, l is preferably 1 and s is preferably 1. Further, in formula (a3-3), it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

Structural Unit (a4):

The structural unit (a4) is a structural unit derived from an acrylate ester containing a non-acid dissociable, aliphatic polycyclic group. Here, the phrase "non-acid dissociable" used in the term "non-acid dissociable, aliphatic polycyclic group" means that the group does not dissociate from the component (A1) by the action of acid generated from the component (B) upon exposure.

Examples of the aliphatic polycyclic group within the structural unit (a4) include the same groups as those described above in connection with the aforementioned structural unit (a3), and any of the multitude of conventional polycyclic groups used within the resin component of resist compositions for ArF excimer lasers or KrF excimer lasers (and particularly for ArF excimer lasers) can be used. In consideration of industrial availability and the like, at least one polycyclic group selected from amongst a tricyclodecanyl group, adamantyl group, tetracyclododecanyl group, isobornyl group, and norbornyl group is particularly desirable. These aliphatic polycyclic groups may be substituted with a linear or branched alkyl group of 1 to 5 carbon atoms.

Specific examples of the structural unit (a4) include structural units represented by general formulas (a-4-1) to (a-4-5) shown below.

[Chemical Formula 9]

(a4-1)
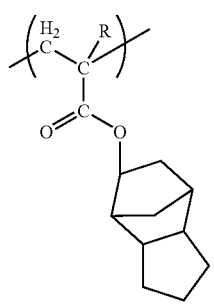

(a4-2)
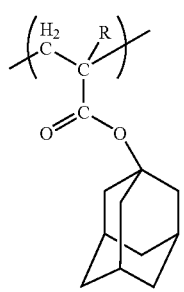

(a4-3)
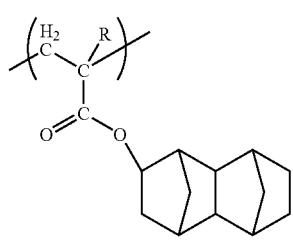

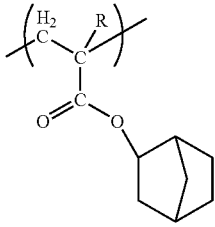
(a4-4)

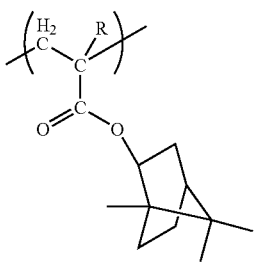
(a4-5)

In the formulas, R represents a hydrogen atom, a lower alkyl group of 1 to 5 carbon atoms or a halogenated lower alkyl group of 1 to 5 carbon atoms.

In general formulas (a-4-1) to (a-4-5), R is as defined above for R in general formula (a11-1).

Structural Unit (a18):

A structural unit (18) is a structural unit having a portion that generates acid upon exposure.

As the structural unit (18), for example, the structural units disclosed in Japanese Unexamined Patent Application, First Publication No. 2006-45311 can be used.

In the component (A1), one type of these other structural units may be used alone, or two or more types of structural units may be used in combination.

However, in terms of achieving the effects of the present invention, the combined amount of the structural units (a10), (a11) and (a15) within the component (A1), relative to the combined total of all the structural units that constitute the component (A1), is preferably at least 70 mol %, more preferably at least 90 mol %, and most preferably 100 mol %. In other words, it is particularly desirable that the component (A1) contain no structural unit other than the structural units (a10), (a11) and (a15).

The component (A1) is preferably a copolymer having the structural units (a10) and (a11). Examples of such copolymers include a binary copolymer composed of the structural units (a10) and (a11) and a ternary copolymer composed of the structural units (a10), (a11) and (a15).

The component (A1) is particularly preferably a copolymer having two types of structural units represented by general formula (A1-11) shown below, and most preferably a copolymer formed solely from these two types of structural units.

[Chemical Formula 10]

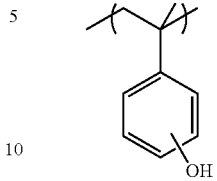 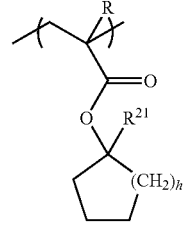
(A1-11)

In the formulas, $R^1$ represents a hydrogen atom or an alkyl group of 1 to 5 carbon atoms; R represents a hydrogen atom, an alkyl group of 1 to 5 carbon atoms, or a halogenated alkyl group of 1 to 5 carbon atoms; $R^{21}$ represents an alkyl group; and h represents an integer of 3 to 6.

In general formula (A1-11), $R^1$ is as defined above for $R^1$ in general formula (a10-1), and R and $R^{21}$ are as defined above for R and $R^{21}$ respectively in general formula (a11-11).

The component (A1) can be produced by a known production method, for example, a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers which derive the respective structural units, commercially available monomers may be used, or the monomers may be synthesized by a conventional method.

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 4,000 to 10,000. By making the weight average molecular weight no more than the upper limit of the above-mentioned range, the component (A1) exhibits satisfactory solubility in a resist solvent when used for a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type of component may be used alone, or two or more types may be used in combination.

In terms of enhancing the effects of the present invention, the proportion of the component (A1) within the component (A), relative to the total weight of the component (A), is preferably at least 50% by weight, more preferably 75% by weight or greater, still more preferably 80% by weight or greater, and may be 100% by weight.

With respect to the resist composition according to the first aspect of the present invention, the component (A) may also include a base material component that exhibits increased solubility in an alkali developing solution under the action of acid other than the aforementioned component (A1) (hereafter also referred to as the component (A2)).

There are no particular limitations on this component (A2), which may be selected appropriately from the multitude of components known as base material components for chemically amplified positive resist compositions (such as conventional base resins for ArF excimer lasers, KrF excimer lasers, EB, EUV or the like). Further, the component (A2) may also include a non-polymer (low molecular weight compound) that has a molecular weight of at least 500 but less than 4,000.

As the component (A2), either a single type of component may be used, or two or more types may be used in combination.

In the resist composition according to the first aspect of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, a compound represented by general formula (b-1) or (b-2) shown below can be used.

[Chemical Formula 11]

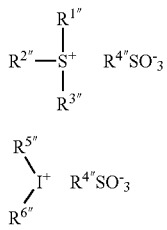

(b-1)

(b-2)

In the formula, $R^{1'''}$ to $R^{3'''}$, $R^{5'''}$ and $R^{6'''}$ each independently represents an aryl group or alkyl group which may have a substituent, wherein two of $R^{1'''}$ to $R^{3'''}$ in formula (b-1) may be bonded to each other to form a ring with the sulfur atom in the formula; and $R^{4'''}$ represents an alkyl group which may have a substituent, a halogenated alkyl group, an aryl group or an alkenyl group, with the proviso that at least one of $R^{1'''}$ to $R^{3'''}$ represents an aryl group, and at least one of $R^{5'''}$ and $R^{6'''}$ represents an aryl group.

In general formula (b-1), $R^{1'''}$ to $R^{3'''}$ each independently represents an aryl group or alkyl group which may have a substituent. Two of $R^{1'''}$ to $R^{3'''}$ in general formula (b-1) may be bonded to each other to form a ring with the sulfur atom in the formula.

Further, among $R^{1'''}$ to $R^{3'''}$, at least one group represents an aryl group. Among $R^{1'''}$ to $R^{3'''}$, two or more groups are preferably aryl groups, and it is particularly desirable that all of $R^{1'''}$ to $R^{3'''}$ are aryl groups.

The aryl group for $R^{1'''}$ to $R^{3'''}$ is not particularly limited, and examples thereof include an aryl group having 6 to 20 carbon atoms. The aryl group is preferably an aryl group having 6 to 10 carbon atoms because it can be synthesized at a low cost. Specific examples thereof include a phenyl group and a naphthyl group.

The aryl group may have a substituent. The expression "having a substituent" means that some or all of the hydrogen atoms of the aryl group are substituted with substituents, and examples of the substituent include an alkyl group, an alkoxy group, a halogen atom, a hydroxyl group, an alkoxyalkyloxy group, and a group represented by general formula: —O—$R^{50}$—CO—O—$R^{51}$ [wherein $R^{50}$ represents an alkylene group, and $R^{51}$ represents an acid dissociable group].

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group, with which hydrogen atoms of the aryl group may be substituted, include a group represented by general formula: —O—C($R^{47}$)($R^{48}$)—O—$R^{49}$ [wherein each of $R^{47}$ and $R^{48}$ independently represents a hydrogen atom or a linear or branched alkyl group; $R^{49}$ represents an alkyl group; and $R^{48}$ and $R^{49}$ may be bonded to each other to form one ring structure, with the proviso that at least one of $R^{47}$ and $R^{48}$ is a hydrogen atom].

The alkyl group for $R^{47}$ and $R^{48}$ preferably has 1 to 5 carbon atoms, and is preferably an ethyl group or a methyl group, and most preferably a methyl group.

It is preferable that either one of $R^{47}$ and $R^{48}$ be a hydrogen atom, and the other be a hydrogen atom or a methyl group, and it is particularly desirable that both of $R^{47}$ and $R^{48}$ be hydrogen atoms.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with alkyl groups of 1 to 5 carbon atoms, fluorine atoms or fluorinated alkyl groups. Examples of the monocycloalkane include cyclopentane and cyclohexane. Examples of polycycloalkane include adamantane, norbornane, isobornane, tricyclodecane and tetracyclododecane. Of these, a group in which one or more hydrogen atoms have been removed from adamantane is preferable.

$R^{48}$ and $R^{49}$ may be bonded to each other to form a ring structure. In such a case, a cyclic group is constituted of $R^{48}$, $R^{49}$, the oxygen atom to which $R^{49}$ is bonded, and the carbon atom to which the oxygen atom and $R^{48}$ are bonded. As the cyclic group, a 4- to 7-membered ring is preferable, and a 4- to 6-membered ring is more preferable.

In the group represented by general formula: —O—$R^{50}$—CO—O—$R^{51}$, with which hydrogen atoms of the aryl group may be substituted, the alkylene group for $R^{50}$ is preferably a linear or branched alkylene group, and is preferably an alkylene group of 1 to 5 carbon atoms. Examples of the alkylene group include a methylene group, an ethylene group, a trimethylene group, a tetramethylene group and a 1,1-dimethyl ethylene group.

The acid dissociable group for $R^{51}$ is not particularly limited as long as it is an organic group which can be dissociated by the action of acid (the acid generated from the component (B) upon exposure).

As the acid dissociable group, any of the groups that have been proposed as acid dissociable, dissolution inhibiting groups for the base resins of chemically amplified positive resists can be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. In the present invention, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom. The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon and hydrogen (not limited to hydrocarbon groups), but is preferably a hydrocarbon group. Further, the "hydrocarbon group" may be either saturated or unsaturated, but in general, the hydrocarbon group is preferably saturated.

Examples of the aliphatic branched acid dissociable, dissolution inhibiting group include groups represented by a formula —C($R^{71}$)($R^{72}$)($R^{73}$). In this formula, $R^{71}$ to $R^{73}$ each independently represents a linear alkyl group of 1 to 5 carbon atoms. The group represented by —C($R^{71}$)($R^{72}$)($R^{73}$) preferably contains from 4 to 8 carbon atoms, and specific examples include a tert-butyl group, a 2-methyl-2-butyl group, a 2-methyl-2-pentyl group and a 3-methyl-3-pentyl group, and a tert-butyl group is particularly desirable.

With respect to the aliphatic cyclic group-containing acid dissociable, dissolution inhibiting group, the term "aliphatic cyclic group" refers to a monocyclic group or polycyclic group that has no aromaticity.

The basic ring of the "aliphatic cyclic group" exclusive of substituents is not limited to be constituted from only carbon and hydrogen (not limited to hydrocarbon rings), but is preferably a hydrocarbon ring. Further, the ring may have part of the carbon atoms constituting the ring structure of the hydrocarbon ring replaced with an ethereal oxygen atom (—O—). The hydrocarbon ring may be either saturated or unsaturated, but in general, the hydrocarbon ring is preferably saturated. Specific examples of the hydrocarbon ring include monocycloalkanes, and polycycloalkanes such as bicycloalkanes, tricycloalkanes, and tetracycloalkanes. More specifically, examples of the monocycloalkane include cyclopentane and cyclohexane. Further, specific examples of polycycloalkane include adamantane, norbornane, isobornane, tricyclodecane and tetracyclododecane.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

Examples of acid dissociable, dissolution inhibiting groups containing an aliphatic cyclic group include (i) a group which has a tertiary carbon atom on the ring structure of a monovalent aliphatic cyclic group; and (ii) a group which has a monovalent aliphatic cyclic group and a branched alkylene group containing a tertiary carbon atom bonded to the monovalent aliphatic cyclic group.

Specific examples of (i) a group which has a tertiary carbon atom on the ring structure of a monovalent aliphatic cyclic group include groups represented by general formulas (1-1) to (1-9) shown below.

Specific examples of (ii) a group which has a monovalent aliphatic cyclic group and a branched alkylene group containing a tertiary carbon atom bonded to the monovalent aliphatic cyclic group include groups represented by general formulas (2-1) to (2-6) shown below.

[Chemical Formula 12]

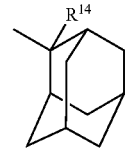
(1-1)

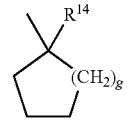
(1-2)

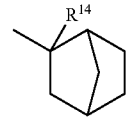
(1-3)

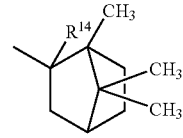
(1-4)

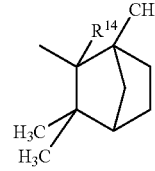
(1-5)

(1-6)
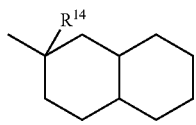

(1-7)
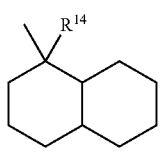

(1-8)
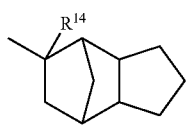

(1-9)
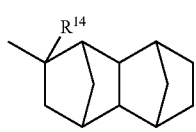

In the formula, R$^{14}$ represents an alkyl group, and g represents an integer of 0 to 8.

[Chemical Formula 13]

(2-1)
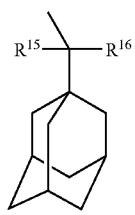

(2-2)
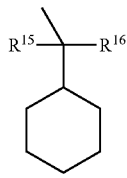

(2-3)
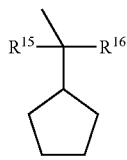

(2-4)
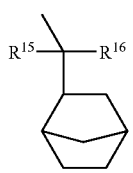

(2-5)
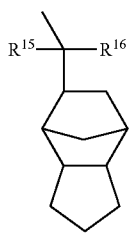

(2-6)
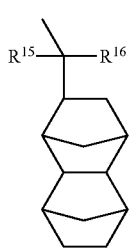

In the formulas, R$^{15}$ and R$^{16}$ each independently represents an alkyl group.

As the alkyl group for R$^{14}$ above, a linear or branched alkyl group is preferable.

The above-mentioned linear alkyl group preferably has 1 to 5 carbon atoms, more preferably 1 to 4 carbon atoms, and still more preferably 1 or 2 carbon atoms.

Specific examples thereof include a methyl group, an ethyl group, an n-propyl group, an n-butyl group, and an n-pentyl group. Of these, a methyl group, an ethyl group or an n-butyl group is preferred, and a methyl group or an ethyl group is particularly desirable.

The above-mentioned branched alkyl group preferably has 3 to 10 carbon atoms, and more preferably 3 to 5 carbon atoms. Specific examples of alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

As the alkyl group for R$^{15}$ and R$^{16}$, the same as the alkyl groups for R$^{14}$ can be exemplified.

In the above formulas (1-1) to (1-9) and (2-1) to (2-6), part of the carbon atoms constituting the ring may be replaced with an ethereal oxygen atom (—O—).

Further, in the above formulas (1-1) to (1-9) and (2-1) to (2-6), the hydrogen atom bonded to the carbon atom constituting the ring may be replaced with a substituent. Examples of the substituent include an alkyl group of 1 to 5 carbon atoms, a fluorine atom, and a fluorinated alkyl group.

Examples of "acetal-type acid dissociable, dissolution inhibiting groups" include groups represented by general formula (p1) shown below.

[Chemical Formula 14]

(p1)
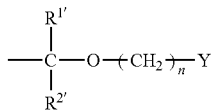

In the formula, R$^{1'}$ and R$^{2'}$ each independently represents a hydrogen atom or an alkyl group; n represents an integer of 0 to 3; and Y represents a linear or branched alkyl group or an aliphatic cyclic group, or $R^{1'}$ and Y each independently represents a linear or branched alkylene group, wherein the terminal of $R^{1'}$ may be bonded to the terminal of Y to form a ring.

In general formula (p1) above, n is preferably an integer of 0 to 2, more preferably 0 or 1, and most preferably 0.

The alkyl group for $R^{1'}$ and $R^{2'}$ may be either linear or branched, and the number of carbon atoms within the alkyl group is preferably within a range from 1 to 15, and more preferably from 1 to 5. Of these, the alkyl group for $R^{1'}$ and $R^{2'}$ is preferably an ethyl group or a methyl group, and most preferably a methyl group.

In general formula (p1), it is preferable that at least one of $R^{1'}$ and $R^{2'}$ be a hydrogen atom.

As the alkyl group for Y, the same as the alkyl groups for $R^{1'}$ and $R^{2'}$ above can be exemplified.

As the aliphatic cyclic group for Y, the same groups described above in connection with the "aliphatic cyclic group" can be exemplified.

Further, in general formula (p1) above, $R^{1'}$ and Y may each independently represent a linear or branched alkylene group (preferably an alkylene group of 1 to 5 carbon atoms), and the terminal of $R^{1'}$ may be bonded to the terminal of Y. In such a case, a cyclic group is formed by $R^{1'}$, Y, the oxygen atom having Y bonded thereto and the carbon atom having the oxygen atom and $R^{1'}$ bonded thereto. As the cyclic group, a 4- to 7-membered ring is preferable, and a 4- to 6-membered ring is more preferable. Specific examples of the cyclic group include a tetrahydropyranyl group and a tetrahydrofuranyl group.

Specific examples of acetal-type acid dissociable, dissolution inhibiting groups include groups represented by formulas (p3-1) to (p3-12) shown below.

[Chemical Formula 15]

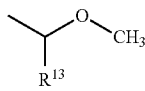
(p3-1)

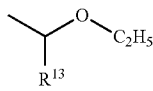
(p3-2)

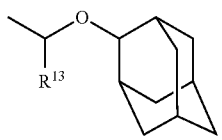
(p3-3)

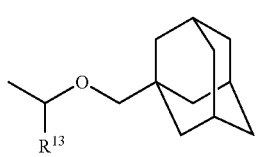
(p3-4)

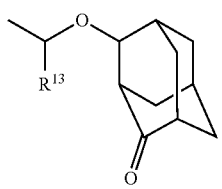
(p3-5)

-continued

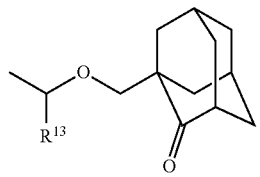
(p3-6)

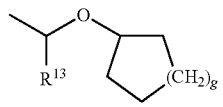
(p3-7)

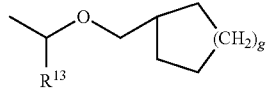
(p3-8)

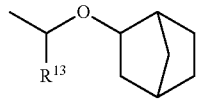
(p3-9)

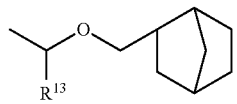
(p3-10)

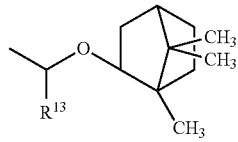
(p3-11)

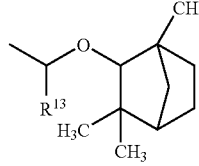
(p3-12)

In the formulas, $R^{13}$ represents a hydrogen atom or a methyl group, and g represents an integer of 0 to 8.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

The alkyl group may have a substituent. The expression "have a substituent" means that some or all of the hydrogen atoms of the alkyl group are substituted with substituents. As the substituent, the same groups as those which the aforementioned aryl group may have as a substituent can be used.

When two of $R^{1'''}$ to $R^{3'''}$ in general formula (b-1) are bonded to each other to form a ring with the sulfur atom in the formula, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom.

When two of $R^{1'''}$ to $R^{3'''}$ in general formula (b-1) are bonded to each other to form a ring with the sulfur atom in the formula, the remaining one of $R^{1'''}$ to $R^{3'''}$ is preferably an aryl group. As examples of the aryl group, the same as the above-mentioned aryl groups for $R^{1'''}$ to $R^{3'''}$ can be exemplified.

Among various cation moieties of the compound represented by general formula (b-1), in those cases where all of $R^{1'''}$ to $R^{3'''}$ are phenyl groups which may have a substituent, that is, in those cases where the cation moiety includes a triphenylmethane structure, specific examples of preferred cation moieties include those represented by general formulas (I-1-1) to (I-1-8) shown below.

[Chemical Formula 16]

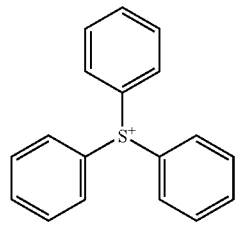
(I-1-1)

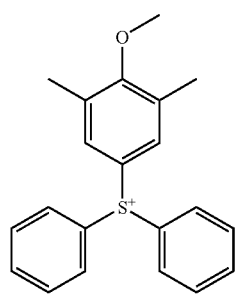
(I-1-2)

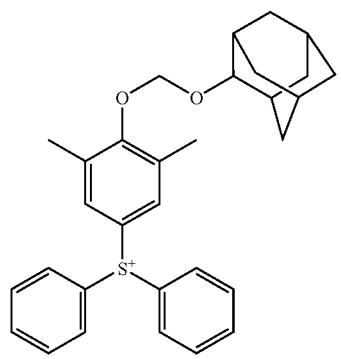
(I-1-3)

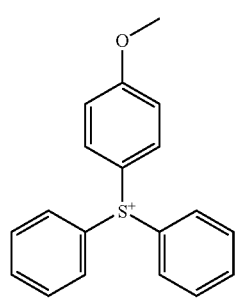
(I-1-4)

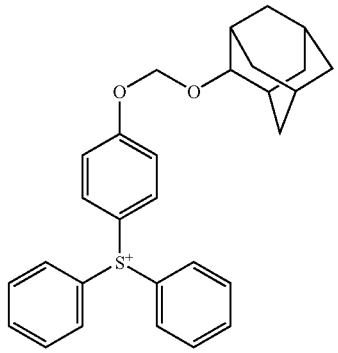
(I-1-5)

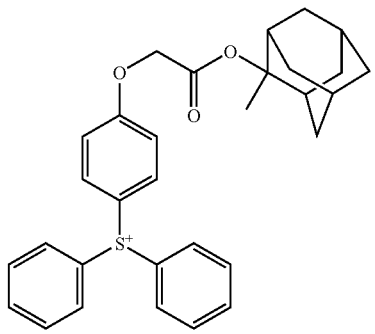
(I-1-6)

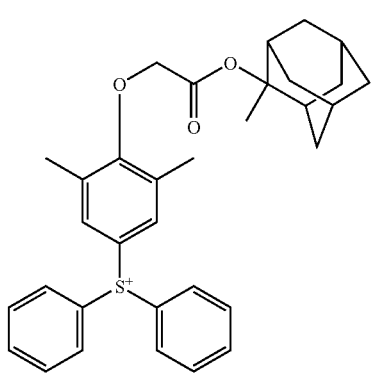
(I-1-7)

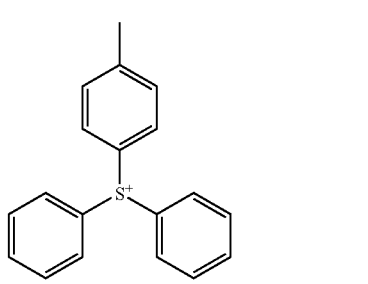
(I-1-8)

Further, among various cation moieties of the compound represented by general formula (b-1), in those cases where two of $R^{1'''}$ to $R^{3'''}$ are bonded to each other to form a ring with the sulfur atom in the formula, specific examples of preferred cation moieties include those represented by general formulas (I-1-10) and (I-1-11) shown below.

In general formula (I-1-10) shown below, $R^9$ represents a phenyl group which may have a substituent, a naphthyl group, or an alkyl group of 1 to 5 carbon atoms.

In general formula (I-1-11) shown below, $R^{10}$ represents a phenyl group which may have a substituent, a naphthyl group, an alkyl group of 1 to 5 carbon atoms, an alkoxy group or a hydroxyl group.

u represents an integer of 1 to 3, and is most preferably 1 or 2.

[Chemical Formula 17]

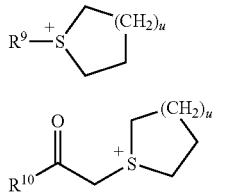

(I-1-10)

(I-1-11)

In the formulas, $R^9$ represents a phenyl group which may have a substituent, a naphthyl group, or an alkyl group of 1 to 5 carbon atoms; $R^{10}$ represents a phenyl group which may have a substituent, a naphthyl group, an alkyl group of 1 to 5 carbon atoms, an alkoxy group or a hydroxyl group; and u represents an integer of 1 to 3.

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the ratio of the number of halogen atoms relative to the combined total of halogen atoms and hydrogen atoms within the halogenated alkyl group (namely, the halogenation ratio (%)) is preferably 10 to 100%, more preferably 50 to 100%, and is most preferably 100%. Higher halogenation ratios are preferred, as they result in increased acid strength.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with a substituent (an atom other than a hydrogen atom or a group).

$R^{4''}$ may have one substituent, or two or more substituents.

Examples of the substituent include a halogen atom, a hetero atom, an alkyl group, and a group represented by formula X-$Q^1$- [wherein $Q^1$ represents a divalent linking group containing an oxygen atom; and X represents a hydrocarbon group of 3 to 30 carbon atoms which may have a substituent].

Examples of the halogen atom and alkyl group include the same halogen atoms and alkyl groups as those described above with respect to the halogenated alkyl group for $R^{4''}$.

Examples of the hetero atom include an oxygen atom, a nitrogen atom, and a sulfur atom.

In the group represented by formula X-$Q^1$-, $Q^1$ represents a divalent linking group containing an oxygen atom.

$Q^1$ may contain an atom other than the oxygen atom. Examples of the atom other than the oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate group (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)—, —C(=O)—O—$R^{93}$—, and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and the alkylene group preferably has 1 to 12 carbon atoms, more preferably 1 to 5 carbon atoms, and most preferably 1 to 3 carbon atoms.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

As $Q^1$, a divalent linking group containing an ester bond or an ether bond is preferable, and a group represented by formula —$R^{91}$—O—, —$R^{92}$—O—C(=O)—, —C(=O)—O—, —C(=O)—O—$R^{93}$— or —C(=O)—O—$R^{93}$—O—C(=O)— is more preferable.

In the group represented by formula X-$Q^1$-, the hydrocarbon group for X may be either an aromatic hydrocarbon group or an aliphatic hydrocarbon group.

An aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2, and most preferably 1.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group include a group in which a part of or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist solely of the above hetero atom, or may be a group containing a group or atom other than the above hetero atom.

Specific examples of the substituent group for substituting a part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 18]

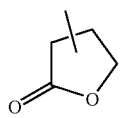
(L1)

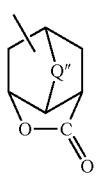
(L2)

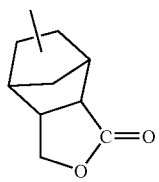
(L3)

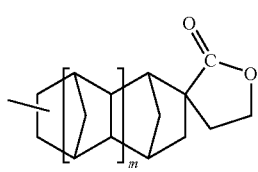
(L4)

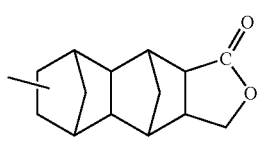
(L5)

(S1)

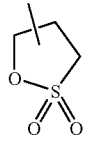
(S2)

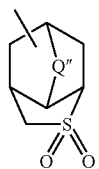
(S3)

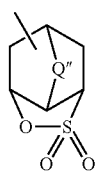
(S4)

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.

In the formula above, as the alkylene group for Q", R$^{94}$ and R$^{95}$, the same alkylene groups as those described above for R$^{91}$ to R$^{93}$ can be used.

In these aliphatic cyclic groups, a part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups for substituting a part or all of the hydrogen atoms can be used.

In the present invention, X is preferably a cyclic group which may have a substituent. The cyclic group may be either an aromatic hydrocarbon group which may have a substituent, or an aliphatic cyclic group which may have a substituent, and an aliphatic cyclic group which may have a substituent is preferable.

The aromatic hydrocarbon group is preferably a naphthyl group which may have a substituent or a phenyl group which may have a substituent.

As the aliphatic cyclic group which may have a substituent, an aliphatic polycyclic group which may have a substituent is preferable. As the aliphatic polycyclic group, the aforementioned groups in which one or more hydrogen atoms have been removed from polycycloalkanes, the aforementioned groups represented by formulas (L2) to (L5) and (S3) to (S4), and the like are preferable.

In the present invention, R$^{4"}$ preferably has a group represented by formula X-Q$^1$- as a substituent. In this case, R$^{4"}$ is preferably a group represented by formula X-Q$^1$-Y$^1$— (in the formula, Q$^1$ and X are the same as Q$^1$ and X in the formula X-Q$^1$- above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group for $Y^1$, groups in which part of or all of the hydrogen atoms in the alkylene group are substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, and —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, and —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, and —$CF(CF_2CF_3)CF_2$—; —$CH_2CF_2$—, —$CH_2CH_2CF_2$—, and —$CH_2CF_2CF_2$—; —$CH_2CF_2CF_2$—, —$CH_2CH_2CH_2CF_2$—, —$CH_2CH_2CF_2CF_2$—, and —$CH_2CF_2CF_2CF_2$—.

Among these, —$CF_2$—, —$CF_2CF_2$—, —$CF_2CF_2CF_2$—, and $CH_2CF_2CF_2$— are preferable, —$CF_2$—, —$CF_2CF_2$— and —$CF_2CF_2CF_2$— are more preferable, and —$CF_2$— is particularly desirable.

The alkylene group or fluorinated alkylene group for $Y^1$ may have a substituent. The alkylene group or fluorinated alkylene group "has a substituent" means that part or all of the hydrogen atoms or fluorine atoms in the alkylene group or fluorinated alkylene group have been substituted with atoms or groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In general formula (b-2), $R^{5'''}$ and $R^{6'''}$ each independently represents an aryl group or an alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

As $R^{4'''}$ in general formula (b-2), the same as those mentioned above for $R^{4'''}$ in general formula (b-1) can be exemplified.

Specific examples of suitable onium salt-based acid generators represented by general formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalen-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by alkylsulfonates such as methanesulfonate, n-propanesulfonate, n-butanesulfonate, or n-octanesulfonate.

Furthermore, onium salts in which the anion moiety of these onium salts is replaced by an anion moiety represented by any one of formulas (b1) to (b8) shown below can also be used.

[Chemical Formula 19]

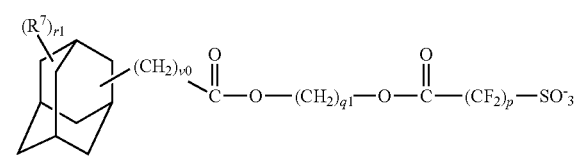

(b1)

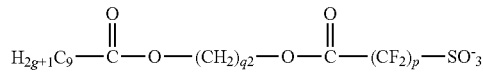

(b2)

-continued (b3)

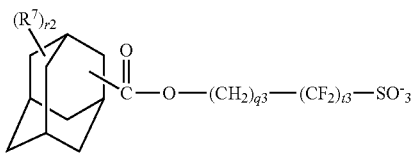

In the formulas, p represents an integer of 1 to 3; v0 represents an integer of 0 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; and $R^7$ represents a substituent.

[Chemical Formula 20]

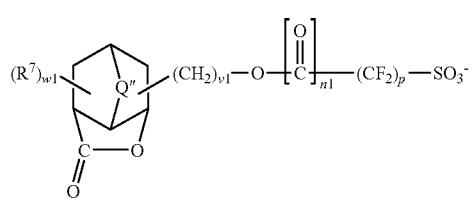
(b4)

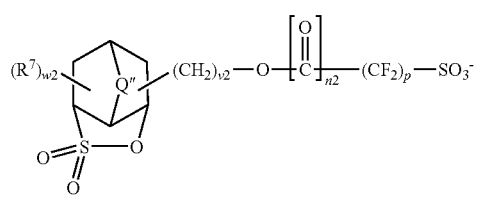
(b5)

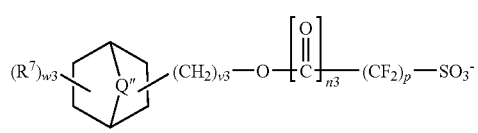
(b6)

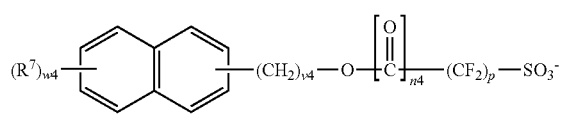
(b7)

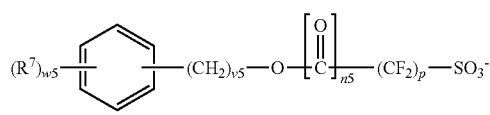
(b8)

In the formulas, p represents an integer of 1 to 3; $R^7$ represents a substituent; Q" is the same as Q" in the formulas (L1) to (L5) and (S1) to (S4) above; each of n1 to n5 independently represents 0 or 1; each of v1 to v5 independently represents an integer of 0 to 3; and each of w1 to w5 independently represents an integer of 0 to 3.

As the substituent for $R^7$, the same groups as those which the aforementioned aliphatic hydrocarbon group or aromatic hydrocarbon group for X may have as a substituent can be used.

When the subscripts of $R^7$ (namely, r1 and r2, and w1 to w5) represent an integer of 2 or more, the plurality of $R^7$ groups in the compound may be the same or different from each other.

Each of r1 and r2 and w1 to w5 is preferably an integer of 0 to 2, and more preferably 0 or 1.

t3 is preferably 1 or 2, and is most preferably 1.

q3 is preferably 1 to 5, more preferably 1 to 3, and most preferably 1. v0 to v5 are preferably 0 to 2, and most preferably 0 or 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 21]

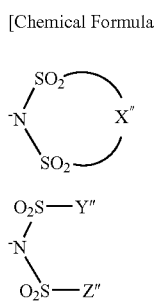

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved. Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The percentage of the fluorine atoms within the alkylene group or alkyl group, i.e., the fluorination ratio, is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may also be used.

[Chemical Formula 22]

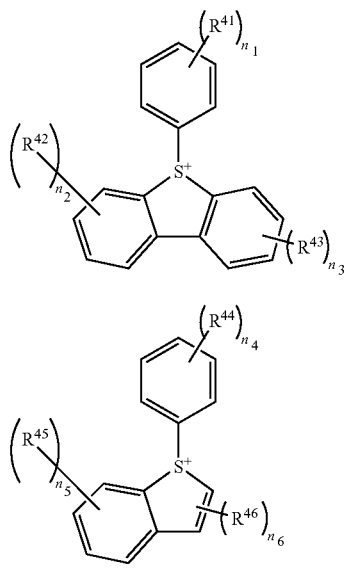

In the formulas, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably an aforementioned alkyl group in which one or more hydrogen atoms have been substituted with hydroxy groups, and examples thereof include a hydroxymethyl group, a hydroxyethyl group and a hydroxypropyl group.

When the subscripts $n_1$ to $n_6$ of $R^{41}$ to $R^{46}$ represent an integer of 2 or more, the plurality of $R^{41}$ to $R^{46}$ may be the same or different from each other.

$n_1$ is preferably 0 to 2, more preferably 0 or 1, and still more preferably 0.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 23]

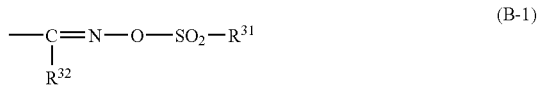

In general formula (B-1), $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or an aryl group is preferable. The alkyl group or the aryl group may have a substituent. The substituent is not particularly limited, and examples thereof include a fluorine atom and a linear, branched or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 24]

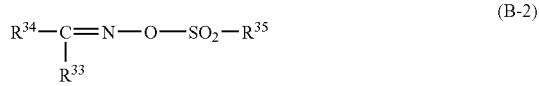

In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 25]

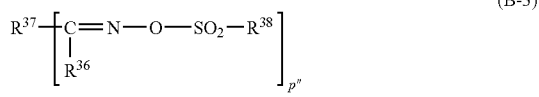

In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferred examples, the following can be mentioned.

[Chemical Formula 26]

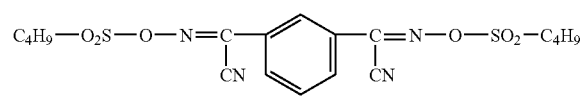

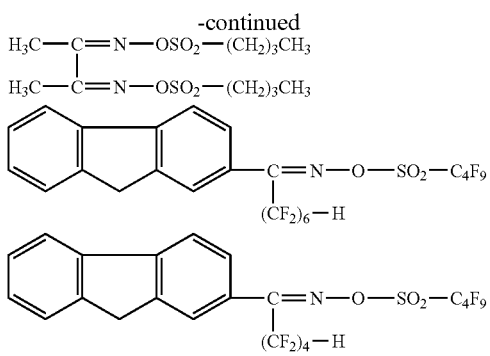

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be used.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety.

The amount of the component (B) within the positive resist composition according to the first aspect of the present invention is preferably from 0.5 to 50 parts by weight, and more preferably from 1 to 40 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

The positive resist composition according to the first aspect of the present invention may further contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. Here, an aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (that is, alkylamines or alkyl alcohol amines), and cyclic amines.

Specific examples of the alkylamines and alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyl diethanolamine and lauryl diethanolamine. Among these, trialkylamines and/or alkyl alcohol amines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, diphenylamine, triphenylamine and tribenzylamine.

Examples of other aliphatic amines include tris(2-methoxymethoxyethyl)amine, tris {2-(2-methoxyethoxy)ethyl} amine, tris {2-(2-methoxyethoxymethoxy)ethyl}amine, tris {2-(1-methoxyethoxy)ethyl} amine, tris {2-(1-ethoxyethoxy)ethyl}amine, tris {2-(1-ethoxypropoxy)ethyl} amine, and tris [2-{2-(2-hydroxyethoxy)ethoxy}ethyl] amine.

These compounds can be used either alone, or in combinations of two or more different compounds.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

Furthermore, in the positive resist composition according to the first aspect of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group.

Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of component may be used alone, or two or more types may be used in combination.

The component (E) is preferably used in an amount within a range from 0.01 to 5.0 parts by weight, relative to 100 parts by weight of the component (A).

If desired, other miscible additives can also be added to the positive resist composition according to the first aspect of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition according to the first aspect of the present invention can be prepared by dissolving the materials for the positive resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents may be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 1 to 20% by weight, and preferably from 2 to 15% by weight.

<<Method of Forming a Resist Pattern According to the Second Aspect>>

A method of forming a resist pattern according to the second aspect of the present invention includes: applying the aforementioned positive resist composition according to the first aspect of the present invention to a substrate to form a resist film on the substrate; subjecting the resist film to exposure; and developing the resist film to form a resist pattern.

More specifically, the method for forming a resist pattern according to the second aspect of the present invention can be performed, for example, as follows.

Firstly, the aforementioned positive resist composition according to the first aspect of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Following selective exposure of the formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, post exposure baking (PEB) is conducted under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of substrates include a silicon wafer, a copper substrate, a chromium substrate, an iron substrate, an aluminum substrate and a glass substrate. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to EB and EUV.

The exposure of the resist film can be either a general exposure (dry exposure) conducted in air or an inert gas such as nitrogen, or immersion exposure (liquid immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environmental friendliness and versatility.

According to the present invention, a resist pattern having an excellent shape can be formed with a high level of resolution. Further, the sensitivity, the line width roughness (LWR) or the like are also excellent. LWR is a phenomenon in which the line width of a line pattern becomes heterogeneous when a resist pattern is formed using a resist composition, and it is required to improve the level of LWR since the level of LWR becomes an important issue as pattern miniaturization progresses.

The reason why the above-mentioned effects are achieved is considered as follows. Such the group within the structural unit (a11) represented by general formula (a11-1) which is formed by $R^{21}$, $R^{22}$ and the carbon atom having $R^{21}$ and $R^{22}$ bonded thereto dissociates readily since the energy (activation energy) required for the dissociation is relatively low, and thus the deprotection and dissolution behavior in a uniform manner can be easily achieved, thereby improving the LWR level. Further, it is assumed that the above-mentioned effects can be achieved because in the formation of a resist pattern, dissociation efficiency of the acid dissociable, dissolution inhibiting group in the exposed portions of the resist film is improved, thereby improving the difference in the solubility within the alkali developing solution of the unexposed portions and the exposed portions (solubility contrast).

Furthermore, the resist composition according to the first aspect of the present invention exhibits favorable dimensional stability under vacuum, and is thus highly useful as a composition for EB and EUV.

Next, the third and fourth aspects of the present invention will be described.

<<Positive Resist Composition of the Third Aspect>>

The positive resist composition according to the third aspect of the present invention (hereafter, frequently referred to simply as "resist composition") includes a base material component (A)' (hereafter, frequently referred to as "component (A)'") which exhibits increased solubility in an alkali developing solution under the action of acid and an acid generator component (B) (hereafter, frequently referred to as "component (B)") which generates acid upon irradiation.

In the positive resist composition of the third aspect, an acid is generated from the component (B) upon irradiation (i.e., exposure), and the action of this acid causes an increase in the solubility of the component (A)' in an alkali developing solution. As a result, in the formation of a resist pattern, when a resist film obtained using the positive resist composition according to the third aspect is subjected to selective exposure, the solubility in an alkali developing solution of the exposed portions of the resist film increases, whereas the solubility in the alkali developing solution of the unexposed portions remains unchanged, meaning alkali developing can then be used to form a resist pattern.

<Component (A)'>

In the positive resist composition according to the third aspect of the present invention, the base material component (A)' includes a polymeric compound (A1)'.

[Polymeric Compound (A1)']

The polymeric compound (A1)' (hereafter, referred to as "component (A1)'") includes a structural unit (a10) derived from hydroxystyrene, a structural unit (a11)' represented by the aforementioned general formula (a11-1)', and a structural unit (a13) represented by the aforementioned general formula (a13-1).

The component (A1)' may further include a structural unit (a15) derived from styrene, in addition to the structural units (a10), (a11)' and (a13).

Structural Unit (a10):

Examples of the structural unit (a10) included in the (A1)' component include the same structural units as those described above for the structural unit (a10) included in the (A1) component of the positive resist composition according to the first aspect.

As the structural unit (a10) above, one type of structural unit may be used alone, or two or more types of structural units may be used in combination.

The amount of the structural unit (a10) within the component (A1)' based on the combined total of all structural units constituting the component (A1)' is preferably 50 to 85 mol %, more preferably 55 to 80 mol %, and most preferably 60 to 75 mol %. By making the amount of the structural unit (a10) within the above range, a suitable level of alkali solubility can be achieved using a resist composition prepared from the component (A1)'. Further, the lithographic properties such as the resolution and sensitivity are also improved.

Structural Unit (a11)':

The structural unit (a11)' is represented by general formula (a11-1)' shown below.

In the component (A1)', the group within the structural unit (a11)' which is formed by $R^{21}$, $R^{22'}$ and the carbon atom having $R^{21}$ and $R^{22'}$ bonded thereto functions as an acid dissociable, dissolution inhibiting group. Here, an "acid dissociable, dissolution inhibiting group" is a group having an alkali dissolution inhibiting effect that renders the entire component (A1)' insoluble in an alkali developing solution prior to dissociation, and then following dissociation under action of acid (the acid generated from the component (B) upon exposure), increases the solubility of the entire component (A1)' in the alkali developing solution.

[Chemical Formula 27]

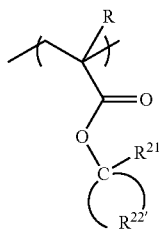

(a-11-1)'

In the formula, R represents a hydrogen atom, an alkyl group of 1 to 5 carbon atoms, or a halogenated alkyl group of 1 to 5 carbon atoms; $R^{21}$ represents an alkyl group; $R^{22'}$ represents a group that forms an aliphatic monocyclic group together with the carbon atom to which this $R^{22'}$ group is bonded.

In general formula (a11-1)', the group R is as defined for R in general formula (a11-1) above in the first aspect, and represents a hydrogen atom, an alkyl group of 1 to 5 carbon atoms, or a halogenated alkyl group of 1 to 5 carbon atoms.

In general formula (a1'-1)', examples of the group $R^{21}$ include the same groups as those described in relation to the alkyl groups represented by $R^{21}$ in general formula (a11-1) above in the first aspect.

As the alkyl group for $R^{21}$ in general formula (a1'-1)', a linear or branched alkyl group is preferred among the various examples described above, and an ethyl group or an isopropyl group is particularly desirable.

In general formula (a11-1)', $R^{22'}$ represents a group that forms an aliphatic monocyclic group together with the carbon atom to which this $R^{22'}$ group is bonded.

The aliphatic monocyclic group is preferably a 5- to 10-membered ring. Further, in terms of enhancing the effects of the present invention, the aliphatic monocyclic group is more preferably a 7- to 10-membered ring, still more preferably an 8- to 10-membered ring, and most preferably an 8-membered ring.

Here, the term "aliphatic monocyclic group" refers to a monocyclic group that has no aromaticity.

The basic ring of the "aliphatic monocyclic group" exclusive of substituents is not limited to be constituted from only carbon and hydrogen (not limited to hydrocarbon rings), but is preferably a hydrocarbon ring. Further, the ring may have part of the carbon atoms constituting the ring structure of the above hydrocarbon ring replaced with an ethereal oxygen atom (—O—). The hydrocarbon ring may be either saturated or unsaturated, but in general, the hydrocarbon ring is preferably saturated. Specific examples of the hydrocarbon ring include cyclopentane, cyclohexane, cycloheptane, cyclooctane, cyclononane and cyclodecane.

The aliphatic monocyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

As an example of $R^{22}$ constituting such an aliphatic monocyclic group, an alkylene group of 6 to 9 carbon atoms which may have a substituent mentioned above or a group in which some of the carbon atoms constituting the alkyl group have been substituted with an ethereal oxygen atom (—O—) can be given.

More specifically, examples of the structural unit represented by general formula (a11-1)' include structural units represented by general formulas (a11-11)' and (a11-12)' shown below.

In the formulas, h' represents an integer of 1 to 6, preferably an integer of 3 to 6, more preferably an integer of 4 to 6, and most preferably 4.

[Chemical Formula 28]

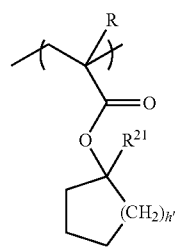

(a11-11)'

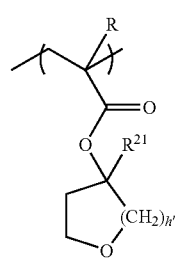

(a11-12)'

In the formula, R represents a hydrogen atom, a lower alkyl group of 1 to 5 carbon atoms, or a halogenated lower alkyl group of 1 to 5 carbon atoms; $R^{21}$ represents an alkyl group; and h' represents an integer of 1 to 6.

As the structural unit (a11)', one type of structural unit may be used alone, or two or more types of structural units may be used in combination.

The amount of the structural unit (a11)' within the component (A1)' based on the combined total of all structural units constituting the component (A1)' is preferably 1 to 50 mol %, more preferably 2 to 40 mol %, still more preferably 3 to 30 mol %, and most preferably 5 to 20 mol %. By making the amount of the structural unit (a11)' within the above-mentioned range, the effects of the present invention can be satisfactorily obtained.

Structural Unit (a13):

The structural unit (a13) is represented by general formula (a13-1) shown below.

[Chemical Formula 29]

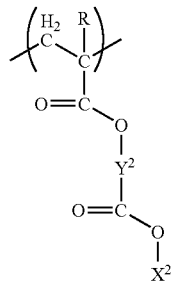

(a13-1)

In the formula, R represents a hydrogen atom, an alkyl group of 1 to 5 carbon atoms, or a halogenated alkyl group of 1 to 5 carbon atoms; $Y^2$ represents a divalent linking group; and $X^2$ represents an acid dissociable, dissolution inhibiting group.

In general formula (a13-1), R is as defined above for R in general formula (a11-1).

Preferable examples of $Y^2$ include a divalent hydrocarbon group which may have a substituent, and a divalent linking group containing a hetero atom.

With respect to the "divalent hydrocarbon group which may have a substituent" for $Y^2$, the description that the hydrocarbon group may "have a substituent" means that some or all of the hydrogen atoms of the hydrocarbon group may be substituted with groups or atoms other than hydrogen atoms.

The hydrocarbon group may be either an aliphatic hydrocarbon group or an aromatic hydrocarbon group. An aliphatic hydrocarbon group refers to a hydrocarbon group having no aromaticity.

The aliphatic hydrocarbon group may be either saturated or unsaturated, but in general, the aliphatic hydrocarbon group is preferably saturated.

More specific examples of the aliphatic hydrocarbon group include linear or branched aliphatic hydrocarbon groups, and aliphatic hydrocarbon groups that contain a ring within their structures.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, linear alkylene groups are preferred, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$— and —C($CH_3$)$_2$—$CH_2$; alkyltrimethylene groups such as —CH($CH_3$)$CH_2CH_2$— and —$CH_2$CH($CH_3$)$CH_2$—; and alkyltetramethylene groups such as —CH($CH_3$)$CH_2CH_2CH_2$— and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon groups may or may not have a substituent. Examples of the substituent include a fluorine atom, a fluorinated alkyl group of 1 to 5 carbon atoms which is substituted by a fluorine atom, and an oxygen atom (=O).

Examples of the aliphatic hydrocarbon groups that contain a ring within their structures include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an above-mentioned chain-like aliphatic hydrocarbon group or positioned partway along the chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

Examples of the aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which a part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

With respect to the "divalent linking group containing a hetero atom", a hetero atom refers to an atom other than a carbon atom or hydrogen atom, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{04}$— (in the formula, $R^{04}$ represents an alkyl group), —NH—C(=O)—, and =N—. Further, a combination of any of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

In the present invention, as the divalent linking group for $Y^2$, an alkylene group, a divalent aliphatic cyclic group, or a divalent linking group containing a hetero atom is preferable. Among these, an alkylene group is particularly desirable.

When $Y^2$ represents an alkylene group, it preferably has 1 to 10 carbon atoms, more preferably 1 to 6 carbon atoms, still more preferably 1 to 4 carbon atoms, and most preferably 1 to 3 carbon atoms. Specific examples of alkylene groups include the same alkylene groups as the aforementioned linear alkylene groups and branched alkylene groups.

When $Y^2$ represents a divalent aliphatic cyclic group, as the aliphatic cyclic group, the same cyclic aliphatic hydrocarbon groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, preferable examples of linking groups include —O—, —C(=O)—O—, —C(=O)—, —O—C(=O)—O—, —C(=O)—NH—, —NH— (in the formula, H may be replaced with a substituent such as an alkyl group, an acyl group or the like), —S—, —S(=O)$_2$—, —S(=O)$_2$—O—, a group represented by the general formula -A-O-B-, and a group represented by the general formula -[A-C(=O)—O]$_d$-B-. Here, each of A and B independently represents a divalent hydrocarbon group which may have a substituent, and d represents an integer of 0 to 3.

When $Y^2$ represents —NH—, H may be replaced with a substituent such as an alkyl group, an acyl group or the like. The substituent (an alkyl group, an acyl group or the like) preferably has 1 to 10 carbon atoms, more preferably 1 to 8 carbon atoms, and most preferably 1 to 5 carbon atoms.

In the group represented by the general formula -A-O-B- or -[A-C(=O)—O]$_d$-B-, each of A and B independently represents a divalent hydrocarbon group which may have a substituent.

Examples of divalent hydrocarbon groups for A and B which may have a substituent include the same groups as those described above for the "divalent hydrocarbon group which may have a substituent" for $Y^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the general formula -[A-C(=O)—O]$_d$-B-, d represents an integer of 0 to 3, preferably an integer of 0 to 2, more preferably 0 or 1, and most preferably 1.

As is the case of the group within the aforementioned structural unit (a11)' which is formed by $R^{21}$, $R^{22'}$ and the carbon atom having $R^{21}$ and $R^{22'}$ bonded thereto, the acid dissociable, dissolution inhibiting group for $X^2$ is a group having an alkali dissolution inhibiting effect that renders the entire component (A1)' insoluble in an alkali developing solution prior to dissociation, and then following dissociation under the action of acid generated from the component (B) upon exposure, increases the solubility of the entire component (A1)' in the alkali developing solution.

As the acid dissociable, dissolution inhibiting group, any of the groups that have been proposed as acid dissociable, dissolution inhibiting groups for the base resins of chemically amplified resists can be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon and hydrogen (not limited to hydrocarbon groups), but is preferably a hydrocarbon group. Further, the "hydrocarbon group" may be either saturated or unsaturated, but in general, the hydrocarbon group is preferably saturated.

As an example of the aliphatic branched, acid dissociable, dissolution inhibiting group, the same aliphatic branched, acid dissociable, dissolution inhibiting groups as those described above in relation to the compound represented by general formula (b-1) of the component (B) in the first aspect can be mentioned.

The term "aliphatic cyclic group" refers to a monocyclic group or polycyclic group that has no aromaticity.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but in general, the hydrocarbon group is preferably saturated.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

In the present invention, the aliphatic cyclic group is preferably a polycyclic group.

As an example of the acid dissociable, dissolution inhibiting groups containing an aliphatic cyclic group, the same acid dissociable, dissolution inhibiting groups containing an aliphatic cyclic group as those described above in relation to the compound represented by general formula (b-1) of the component (B) in the first aspect, such as (i) a group which has a tertiary carbon atom on the ring structure of a monovalent aliphatic cyclic group; and (ii) a group which has a monovalent aliphatic cyclic group and a branched alkylene group containing a tertiary carbon atom bonded to the monovalent aliphatic cyclic group, can be mentioned. Specific examples of the groups (i) include the same groups as those represented by general formulas (1-1) to (1-9) shown above. Specific examples of the groups (ii) include the same groups as those represented by general formulas (2-1) to (2-6) shown above.

An "acetal-type acid dissociable, dissolution inhibiting group" generally substitutes a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1)''' shown below.

[Chemical Formula 30]

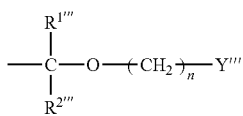

(p1)'''

In the formula, $R^{1'''}$ and $R^{2'''}$ each independently represents a hydrogen atom or an alkyl group of 1 to 5 carbon atoms; n represents an integer of 0 to 3; and Y''' represents an alkyl group of 1 to 5 carbon atoms or an aliphatic cyclic group.

In general formula (p1)''' above, n is preferably an integer of 0 to 2, more preferably 0 or 1, and most preferably 0.

As the lower alkyl group of 1 to 5 carbon atoms for $R^{1'''}$ and $R^{2'''}$, the same as the alkyl groups for R in general formula (a11-1) above in the first aspect can be mentioned, and a methyl group or an ethyl group is preferable, and a methyl group is particularly desirable.

In the present invention, it is preferable that at least one of $R^{1'''}$ and $R^2$ be a hydrogen atom. That is, it is preferable that the acid dissociable, dissolution inhibiting group (p1)''' is a group represented by general formula (p1-1) shown below.

[Chemical Formula 31]

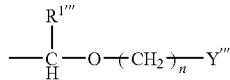

(p1-1)

In the formula, $R^{1'''}$, n and Y''' are respectively as defined for $R^{1'''}$, n and Y''' in general formula (p1)''' above.

As the alkyl group for Y''', the same as the alkyl groups for R in general formula (a11-1) above in the first aspect can be mentioned.

As the aliphatic cyclic group for Y''', any of the aliphatic monocyclic/polycyclic groups which have been proposed for conventional ArF resists and the like can be appropriately selected for use. For example, the same groups described above in connection with the "aliphatic cyclic group" can be mentioned.

Further, as the acetal-type, acid dissociable, dissolution inhibiting group, groups represented by general formula (p2) shown below can also be used.

[Chemical Formula 32]

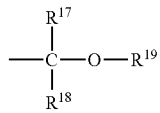

(p2)

In the formula, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. As the cyclic group, a 4- to 7-membered ring is preferable, and a 4- to 6-membered ring is more preferable. Specific examples of the cyclic group include a tetrahydropyranyl group and a tetrahydrofuranyl group.

Specific examples of acetal-type acid dissociable, dissolution inhibiting groups include the same groups as those represented by general formulas (p3-1) to (p3-12) above which are mentioned as examples of acetal-type acid dissociable, dissolution inhibiting groups in relation to the compound represented by general formula (b-1) of the component (B) in the first aspect.

Specific examples of the structural unit (a13) include structural units represented by general formula (a13-3) shown below and structural units represented by general formula (a13-4) shown below.

[Chemical Formula 33]

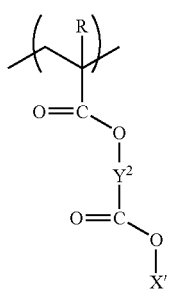

(a13-3)

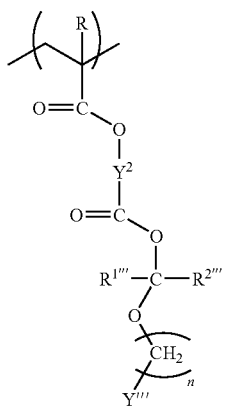

(a13-4)

In the formula, R and $Y^2$ are respectively as defined for R and $Y^2$ in general formula (a13-1) above; $R^{1'''}$, $R^{2'''}$, n and $Y'''$ are respectively as defined for $R^{1'''}$, $R^{2'''}$, n and $Y'''$ in general formula (p1)''' above; and X' represents a tertiary alkyl ester-type acid dissociable, dissolution inhibiting group.

Examples of the tertiary alkyl ester-type acid dissociable, dissolution inhibiting group for X' in the formula above are the same as the above-exemplified tertiary alkyl ester-type acid dissociable, dissolution inhibiting groups.

The tertiary alkyl ester-type acid dissociable, dissolution inhibiting group for X' is more preferably an above-mentioned group (i) which has a tertiary carbon atom on the ring structure of a monovalent aliphatic cyclic group, and a group in which the aliphatic cyclic group is a polycyclic group (aliphatic polycyclic group) is particularly desirable. Of these, a group represented by the aforementioned general formula (1-1) is preferable.

Further, Y''' is preferably an aliphatic cyclic group, and an aliphatic polycyclic group is particularly desirable.

Specific examples of structural units represented by the above general formula (a13-3) include structural units represented by general formulas (a1-3-1) to (a1-3-32) shown below.

Further, specific examples of structural units represented by the above general formula (a13-4) include structural units represented by general formulas (a1-4-1) to (a1-4-15) shown below.

In the formulas shown below, $R^\alpha$ represents a hydrogen atom, a methyl group or a trifluoromethyl group.

[Chemical Formula 34]

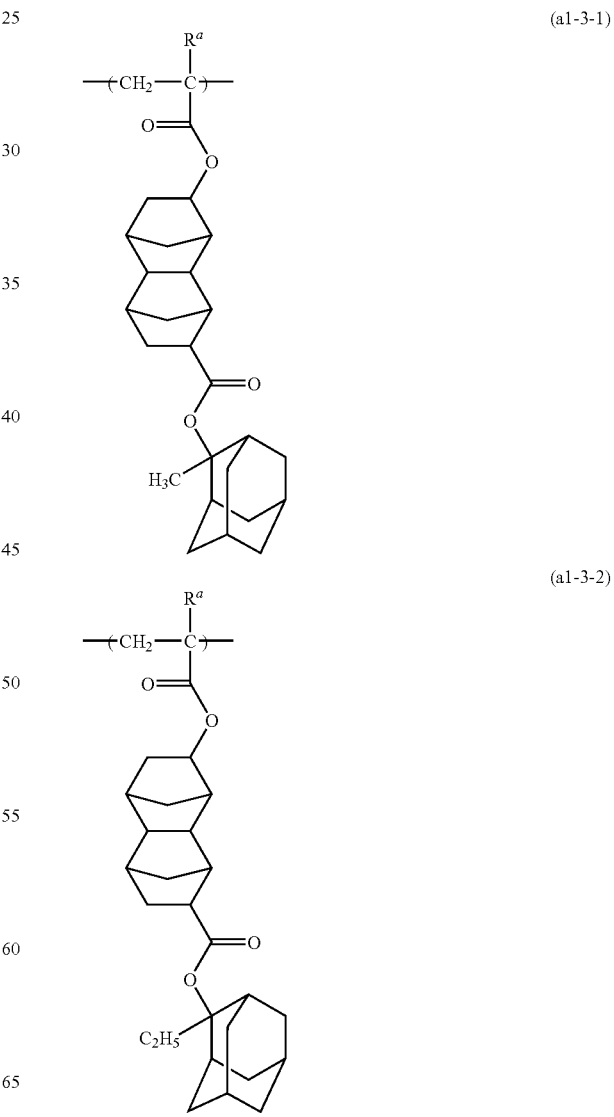

(a1-3-3)
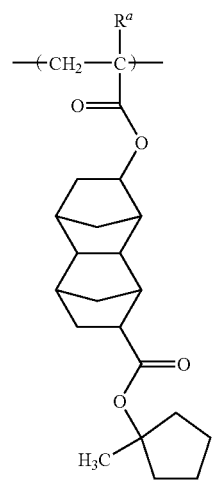
(a1-3-4)
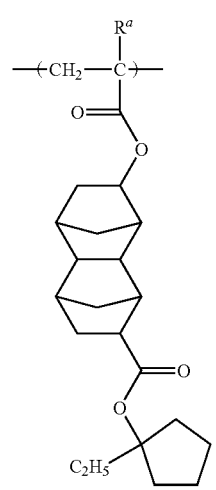
(a1-3-5)
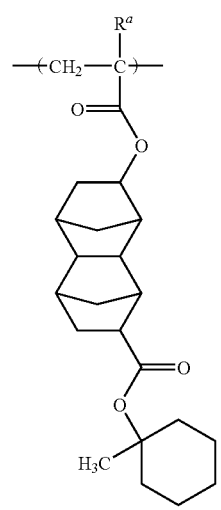
(a1-3-6)
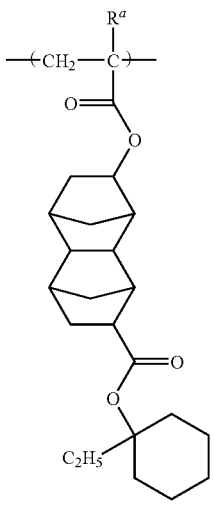
(a1-3-7)
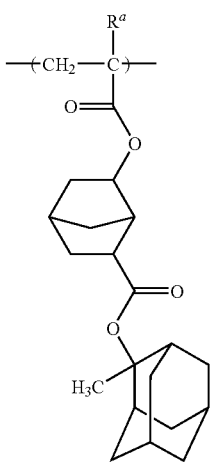
(a1-3-8)
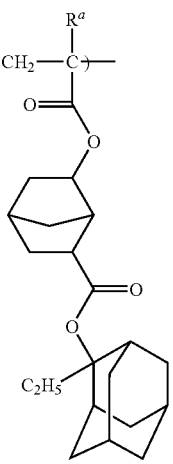

(a1-3-8)
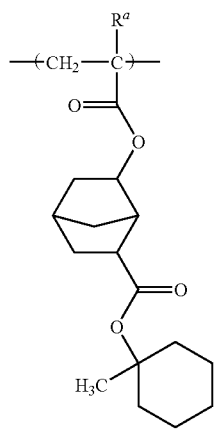
(a1-3-10)
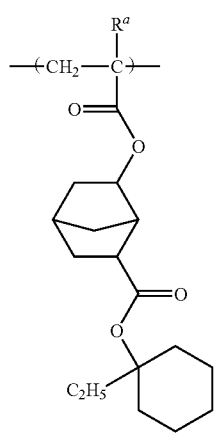
(a1-3-11)
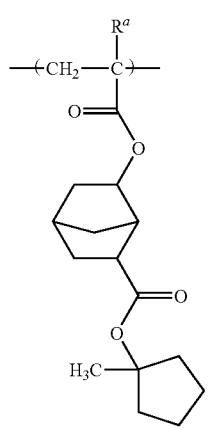
(a1-3-12)
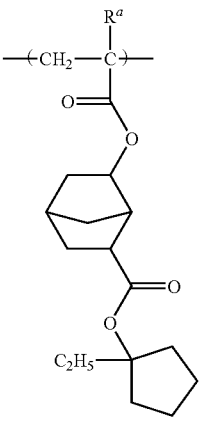
(a1-3-13)
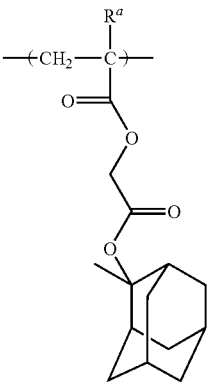
(a1-3-14)
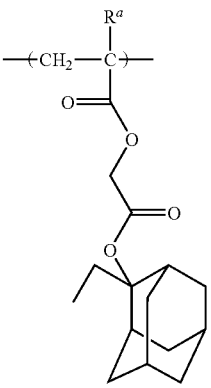
(a1-3-15)
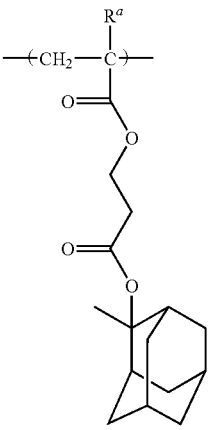

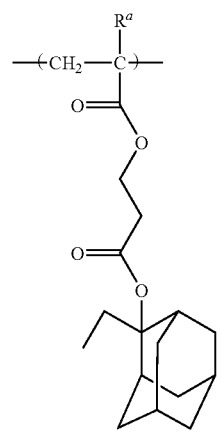 (a1-3-16)
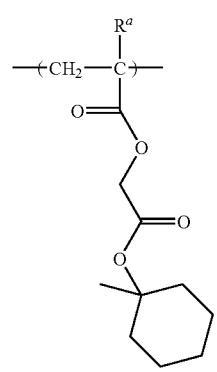 (a1-3-17)
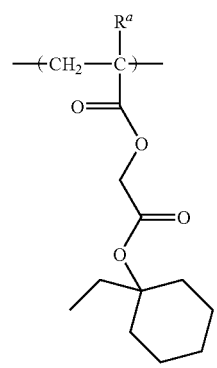 (a1-3-18)
[Chemical Formula 35]
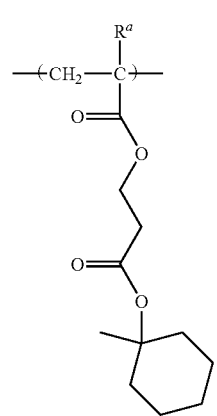 (a1-3-19)
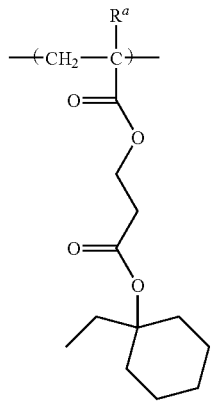 (a1-3-20)
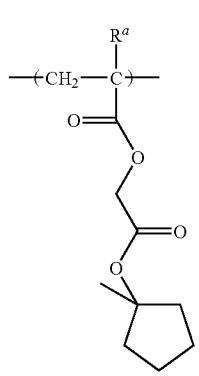 (a1-3-21)
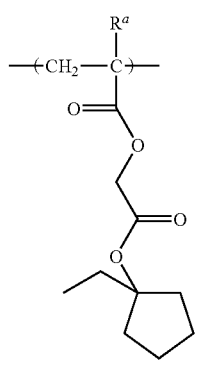 (a1-3-22)
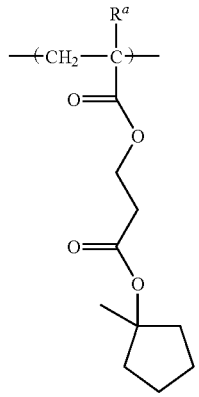 (a1-3-23)

(a1-3-24) 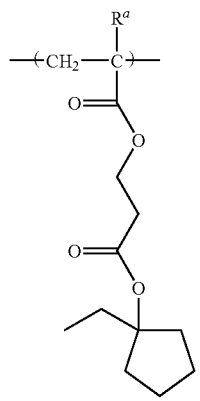
(a1-3-27) 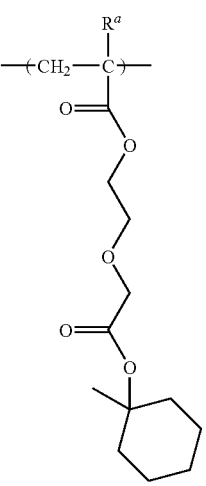
[Chemical Formula 36]
(a1-3-25) 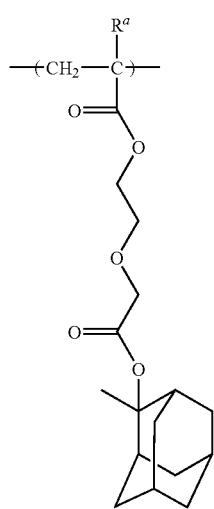
(a1-3-28) 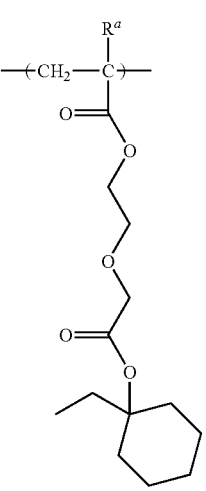
(a1-3-26) 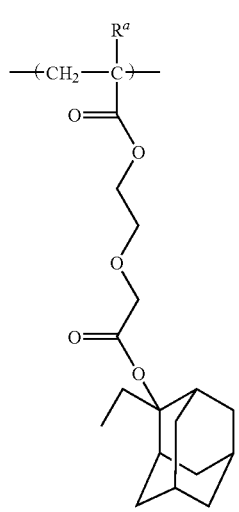
(a1-3-29) 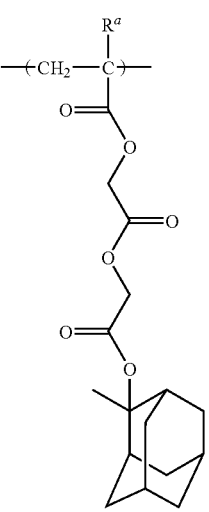

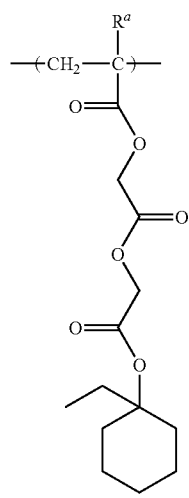
(a1-3-30)
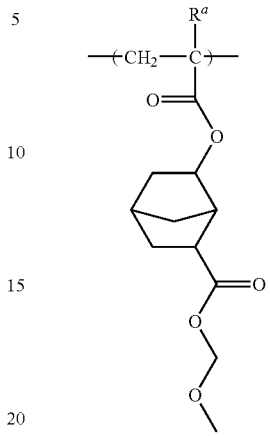
(a1-4-1)
[Chemical Formula 37]
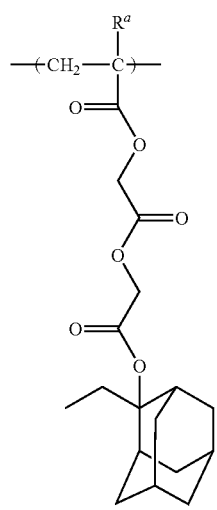
(a1-3-31)
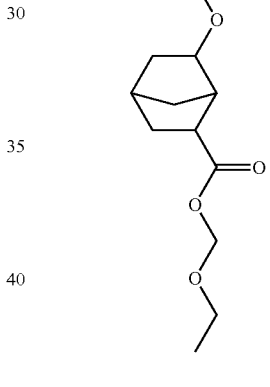
(a1-4-2)
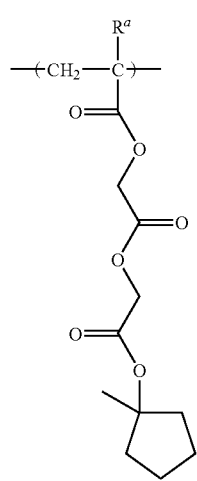
(a1-3-32)
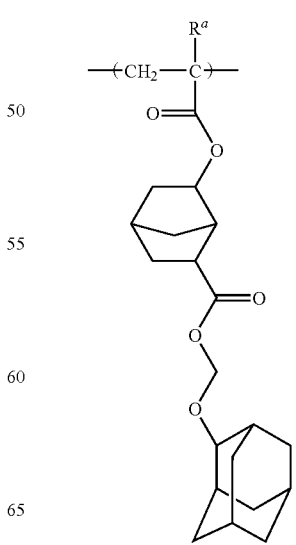
(a1-4-3)

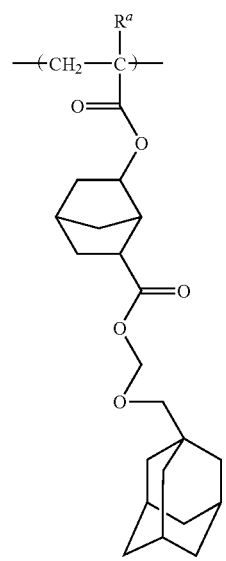 (a1-4-4)
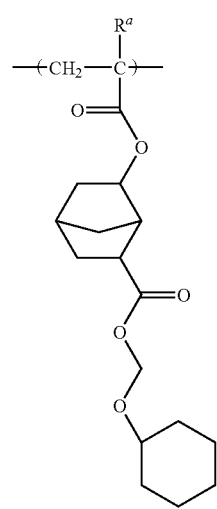 (a1-4-5)
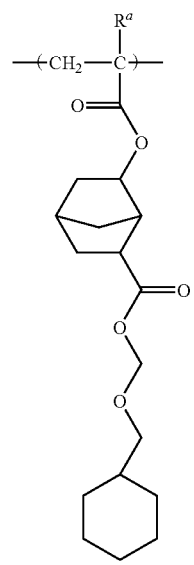 (a1-4-6)
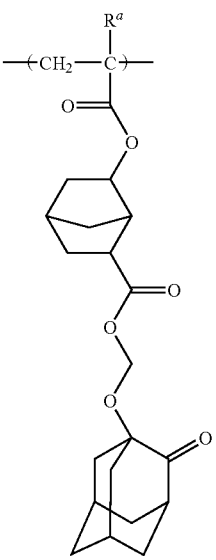 (a1-4-7)
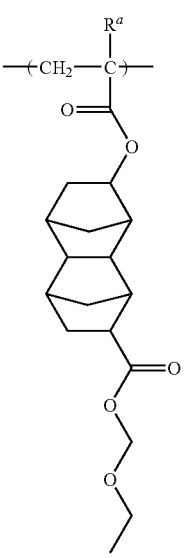 (a1-4-8)

(a1-4-9)
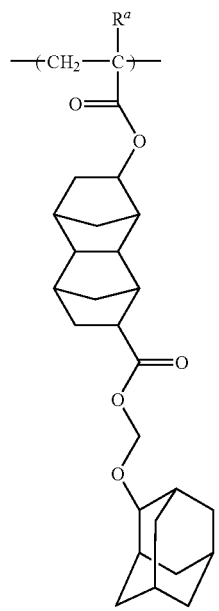
(a1-4-11)
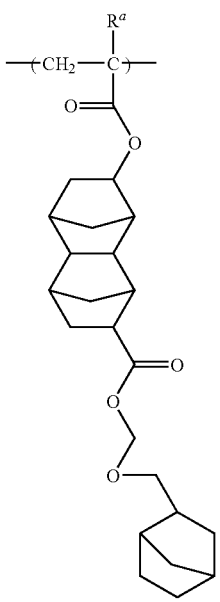
(a1-4-10)
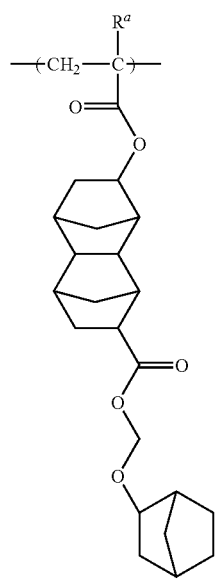
(a1-4-12)
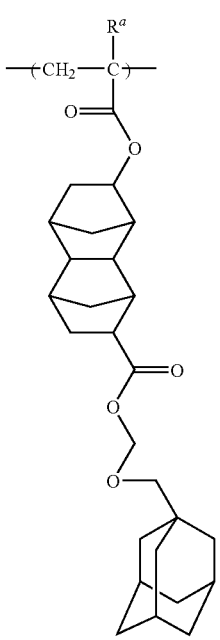

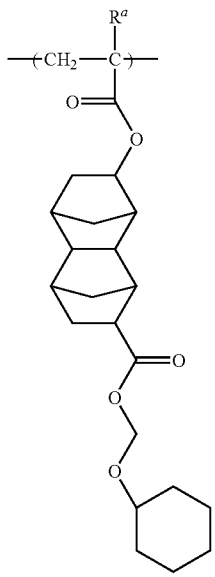
(a1-4-13)

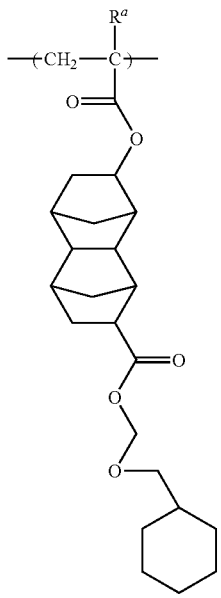
(a1-4-14)

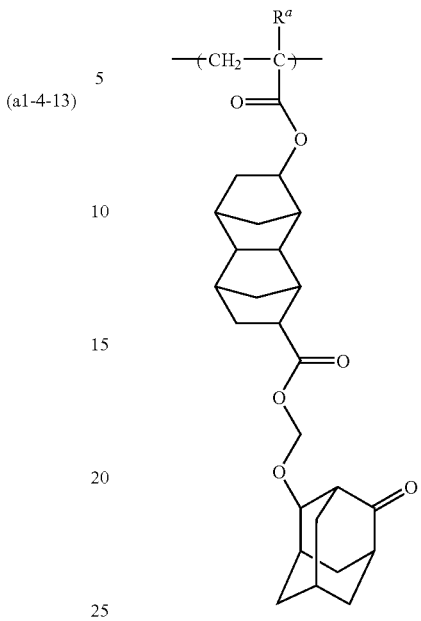
(a1-4-15)

As the structural unit (a13), those in which $Y^2$ in the aforementioned formula is an alkylene group, a group represented by the aforementioned general formula -[A-C(=O)—O]$_d$-B- or a group represented by the aforementioned general formula -A-O-B- are particularly desirable.

Preferable examples of such structural units include a structural unit represented by general formula (a13-31) shown below, a structural unit represented by general formula (a13-32) shown below, and a structural unit represented by general formula (a13-33) shown below.

[Chemical Formula 38]

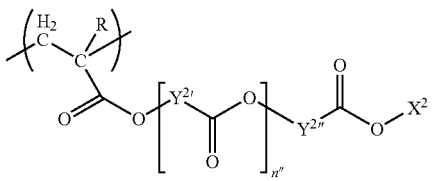
(a13-31)

In the formula, R and $X^2$ are the same as R and $X^2$ defined in general formula (a13-1) above; each of $Y^{2'}$ and $Y^{2''}$ independently represents a divalent linking group; and n" represents an integer of 0 to 3.

[Chemical Formula 39]

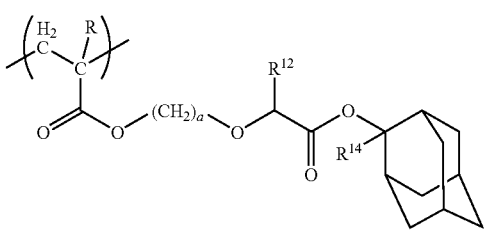
(a13-32)

In the formula, R is as defined above for R in the aforementioned general formula (a13-1); $R^{14}$ is as defined above for $R^{14}$ in the aforementioned general formulas (1-1) to (1-9); $R^{12}$ represents a hydrogen atom or a methyl group; and a represents an integer of 1 to 10.

[Chemical Formula 40]

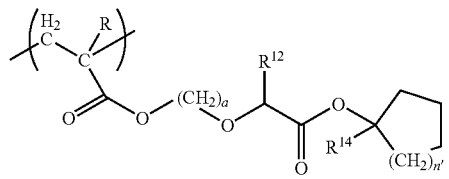

(a13-33)

In the formula, R is as defined above for R in the aforementioned general formula (a13-1); $R^{14}$ is as defined above for $R^{14}$ in the aforementioned general formulas (1-1) to (1-14); $R^{12}$ represents a hydrogen atom or a methyl group; a represents an integer of 1 to 10; and n' represents an integer of 0 to 3.

In general example (a13-31), as the divalent linking group for $Y^{2'}$ and $Y^{2''}$, the same divalent linking groups as those mentioned above for $Y^2$ in the aforementioned general formula (a13-1) can be mentioned.

$Y^{2'}$ is preferably a divalent hydrocarbon group that may have a substituent, more preferably a linear aliphatic hydrocarbon group, and still more preferably a linear alkylene group. Of these, $Y^{2'}$ is particularly preferably a linear alkylene group of 1 to 5 carbon atoms, and most preferably a methylene group or an ethylene group.

$Y^{2''}$ is preferably a divalent hydrocarbon group that may have a substituent, more preferably a linear aliphatic hydrocarbon group, and still more preferably a linear alkylene group. Of these, $Y^{2''}$ is particularly preferably a linear alkylene group of 1 to 5 carbon atoms, and most preferably a methylene group or an ethylene group.

Examples of the acid dissociable, dissolution inhibiting group for $X^2$ include the same as those described above.

$X^2$ in general formula (a13-31) is preferably a tertiary alkyl ester-type acid dissociable, dissolution inhibiting group, more preferably the group (i) which has a tertiary carbon atom on the ring structure of a monovalent aliphatic cyclic group, and the group (i) in which the aliphatic cyclic group is a polycyclic group (aliphatic polycyclic group) is particularly desirable. Of these, a group represented by the aforementioned general formula (1-1) is preferable.

n'' is an integer of 0 to 3, preferably an integer of 0 to 2, more preferably 0 or 1, and most preferably 0.

As the structural units represented by general formula (a13-31), structural units represented by general formula (a13-31-1) shown below which includes the structural units represented by the aforementioned general formulas (a1-3-13) to (a1-3-16), structural units represented by general formula (a13-31-2) shown below which includes the structural units represented by the aforementioned general formulas (a1-3-17) to (a1-3-24), structural units represented by general formula (a13-31-3) shown below which includes the structural units represented by the aforementioned general formulas (a1-3-29) and (a1-3-31), and structural units represented by general formula (a13-31-4) shown below which includes the structural units represented by the aforementioned general formulas (a1-3-30) and (a1-3-32) are preferable. Of the various possibilities, the structural units represented by general formula (a13-31-1) shown below are particularly desirable.

[Chemical Formula 41]

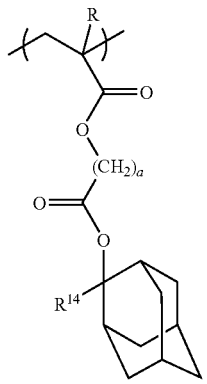

(a13-31-1)

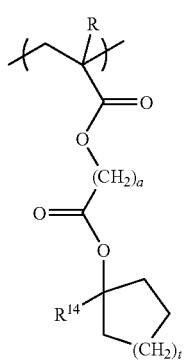

(a13-31-2)

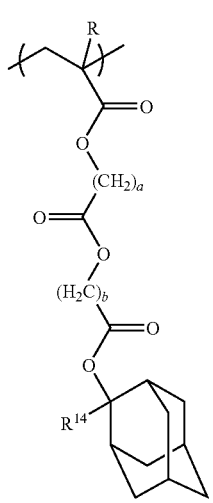

(a13-31-3)

-continued

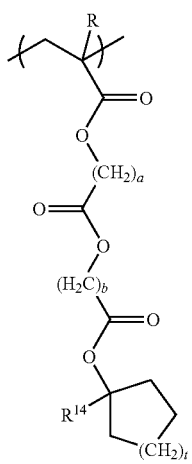

(a13-31-4)

In the formulas, R is as defined above for R in the aforementioned general formula (a13-1); $R^{14}$ is as defined above for $R^{14}$ in the aforementioned general formulas (1-1) to (1-9); a represents an integer of 1 to 10; b represents an integer of 1 to 10; and t represents an integer of 0 to 3.

In general formulas (a13-31-1) to (a13-31-4), a is preferably an integer of 1 to 8, more preferably an integer of 1 to 5, and most preferably 1 or 2.

b is preferably an integer of 1 to 8, more preferably an integer of 1 to 5, and most preferably 1 or 2.

t is preferably an integer of 1 to 3, and most preferably 1 or 2.

In general formulas (a13-32) and (a13-33), $R^{12}$ is preferably a hydrogen atom.

a is preferably an integer of 1 to 8, more preferably an integer of 1 to 5, and most preferably 1 or 2.

n' is preferably 1 or 2, and most preferably 2.

Specific examples of the structural units represented by general formula (a13-31) include structural units represented by the aforementioned general formulas (a1-3-25) and (a1-3-26).

Specific examples of the structural units represented by general formula (a13-32) include structural units represented by the aforementioned general formulas (a1-3-27) and (a1-3-28).

As the structural unit (a13), one type of structural unit may be used alone, or two or more types of structural units may be used in combination.

The amount of the structural unit (a13) within the component (A1)' based on the combined total of all structural units constituting the component (A1)' is preferably 1 to 55 mol %, more preferably 5 to 50 mol %, still more preferably 5 to 45 mol %, and most preferably 10 to 40 mol %. By making the amount of the structural unit (a13) within the above-mentioned range, the effects of the present invention can be satisfactorily obtained.

In the present invention, the combined amount of the structural units (a11)' and (a13) within the component (A1)', relative to the combined total of all the structural units that constitute the component (A1)', is preferably within a range from 20 to 50 mol %, more preferably from 25 to 45 mol %, and is most preferably from 30 to 40 mol %. By making the combined amount of the structural units (a11)' and (a13) at least as large as the lower limit of the above-mentioned range, an excellent resist pattern can be formed using a resist composition prepared from the component (A1)'. On the other hand, by making the combined amount of the structural units (a11)' and (a13) no more than the upper limit of the above-mentioned range, a good balance can be achieved with the other structural units and the lithography properties are improved.

Further, the ratio (molar ratio) between the structural unit (a11)' and the structural unit (a13) within the component (A1)', namely the ratio structural unit (a11)': structural unit (a13) is preferably within a range from 1:9 to 9:1, is more preferably from 2:8 to 8:2, and is still more preferably from 3:7 to 7:3.

Structural Unit (a15):

As described above, the component (A1)' may further include a structural unit (a15) derived from styrene, in addition to the structural units (a10), (a11)' and (a13). Including the structural unit (a15) enables improvements in the heat resistance and dry etching resistance when a resist composition is prepared. Further, by adjusting the content of the structural unit (a15), the solubility in an alkali developing solution can be adjusted.

Examples of the structural unit (a15) include the same structural units as those described above for the structural unit (a15) in the first aspect.

As the structural unit (a15), one type of structural unit may be used alone, or two or more types of structural units may be used in combination.

In the component (A1)', the amount of the structural unit (a15) based on the combined total of all structural units constituting the component (A1)' is preferably 0 to 30 mol %, more preferably 0 to 20 mol %, and still more preferably 0 to 15 mol %.

The component (A1)' may also have an additional structural unit which is other than the above-mentioned structural units (a10), (a11)', (a13) and (a15), as long as the effects of the present invention are not impaired.

As the additional structural unit, any other structural unit which cannot be classified as one of the above structural units (a10), (a11)', (a13) and (a15) can be used without any particular limitations, and any of the multitude of conventional structural units used within resist resins for ArF excimer lasers, KrF excimer lasers, EUV, EB or the like can be used.

Preferred examples of the above-mentioned additional structural unit include the structural units (a3), (a4) and (a18) shown below.

Structural Unit (a3):

The structural unit (a3) is a structural unit derived from an acrylate ester containing a polar group-containing aliphatic hydrocarbon group. When the component (A1)' includes the structural unit (a3), the hydrophilicity of the component (A1)' is improved, and hence, the compatibility of the component (A1)' with the developing solution is improved. As a result, the alkali solubility of the exposed portions improves, which contributes to favorable improvements in the resolution.

Examples of the structural unit (a3) include the same structural units as those described above for the structural unit (a3) in the first aspect.

Structural Unit (a4):

The structural unit (a4) is a structural unit derived from an acrylate ester containing a non-acid dissociable, aliphatic polycyclic group. Examples of the structural unit (a4) include the same structural units as those described above for the structural unit (a4) in the first aspect.

Structural Unit (a18):

A structural unit (18) is a structural unit having a portion that generates acid upon exposure.

As the structural unit (18), for example, the structural units disclosed in Japanese Unexamined Patent Application, First Publication No. 2006-45311 can be used.

In the component (A1)', one type of these other structural units may be used alone, or two or more types of structural units may be used in combination.

However, in terms of achieving the effects of the present invention, the combined amount of the structural units (a10), (a11)', (a13) and (a15) within the component (A1)', relative to the combined total of all the structural units that constitute the component (A1)', is preferably at least 70 mol %, more preferably at least 90 mol %, and most preferably 100 mol %. In other words, it is particularly desirable that the component (A1)' contain no structural unit other than the structural units (a10), (a11)', (a13) and (a15).

The component (A1)' is preferably a copolymer that includes the structural units (a10), (a11)' and (a13), and examples of such copolymers include a copolymer formed from the structural units (a10), (a11)' and (a13), and a copolymer formed from the structural units (a10), (a11)', (a13) and (a15). These copolymers may further include at least one of the structural units selected from the group consisting of the structural units (a3), (a4) and (a18).

The component (A1)' is particularly preferably a copolymer having three types of structural units represented by general formula (A1-11)' shown below, and most preferably a copolymer formed solely from these three types of structural units.

[Chemical Formula 42]

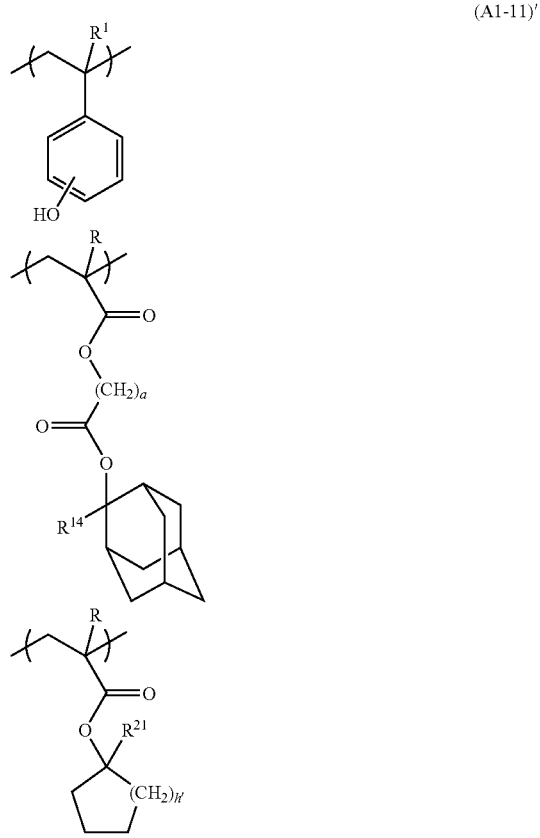

(A1-11)'

In the formulas, $R^1$ represents a hydrogen atom or an alkyl group of 1 to 5 carbon atoms; R represents a hydrogen atom, an alkyl group of 1 to 5 carbon atoms or a halogenated alkyl group of 1 to 5 carbon atoms; a represents an integer of 1 to 10; $R^{14}$ represents an alkyl group; $R^{21}$ represents an alkyl group; and h' represents an integer of 1 to 6.

In general formula (A1-11)', $R^1$ is as defined above for $R^1$ in general formula (a10-1), a and $R^{14}$ are as defined above for a and $R^{14}$ respectively in general formula (a13-31-1), and R, $R^{21}$ and h' are as defined above for R, $R^{21}$ and h' respectively in general formula (a11-11)'.

The component (A1)' can be produced by a known production method, for example, a conventional radical polymerization or the like of the monomers corresponding with each of the structural units, using a radical polymerization initiator such as azobisisobutyronitrile (AIBN).

Furthermore, in the component (A1)', by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1)'. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

The weight average molecular weight (Mw) (the polystyrene equivalent value determined by gel permeation chromatography) of the component (A1)' is not particularly limited, but is preferably 2,000 to 50,000, more preferably 3,000 to 30,000, and most preferably 4,000 to 10,000. By making the weight average molecular weight no more than the upper limit of the above-mentioned range, the component (A1)' exhibits satisfactory solubility in a resist solvent when used for a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A)', as the component (A1)', one type of component may be used alone, or two or more types may be used in combination.

In terms of enhancing the effects of the present invention, the proportion of the component (A1)' within the component (A)', relative to the total weight of the component (A)', is preferably at least 50% by weight, more preferably 75% by weight or greater, still more preferably 80% by weight or greater, and may be 100% by weight.

With respect to the resist composition according to the third aspect of the present invention, the component (A)' may also include a base material component that exhibits increased solubility in an alkali developing solution under the action of acid other than the aforementioned component (A1)' (hereafter also referred to as the component (A2)).

There are no particular limitations on the component (A2), and the same components as those described above for the component (A2) in the first aspect can be used. As the component (A2), either a single type of component may be used, or two or more types may be used in combination.

In the resist composition according to the third aspect of the present invention, the amount of the component (A)' can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, for example, the same acid generators as those mentioned in the first aspect, including onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators can be used.

As the component (B) in the third aspect, the same as that of the first aspect can be used. However, when at least one of $R^{1''}$ to $R^{3''}$ in general formula (b-1) represents the aryl group which has the substituent including the group represented by the general formula: $-O-R^{50}-CO-O-R^{51}$, $R^{51}$ is as defined above for the acid dissociable, dissolution inhibiting group of $X^2$ in the aforementioned general formula (a13-1).

Of the various possibilities, the acid dissociable group for $R^{51}$ is preferably a tertiary alkyl ester-type acid dissociable group.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety.

The amount of the component (B) within the positive resist composition according to the third aspect of the present invention is preferably from 0.5 to 50 parts by weight, and more preferably from 1 to 40 parts by weight, relative to 100 parts by weight of the component (A)'. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

The positive resist composition according to the third aspect of the present invention may further contain the same nitrogen-containing organic compound (D) (hereafter referred to as the component (D)) as those mentioned in the first aspect as an optional component.

As the component (D), one type may be used alone, or two or more types may be used in combination.

The component (D) is typically used in an amount within a range from 0.01 to 5.0 parts by weight, relative to 100 parts by weight of the component (A)'. By ensuring that the amount of the component (D) is within the above-mentioned range, the shape of the resist pattern and the post exposure stability of the latent image formed by the pattern-wise exposure of the resist layer are improved.

Furthermore, in the positive resist composition according to the third aspect of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of the same compounds as those mentioned in the first aspect such as an organic carboxylic acid, or a phosphorus oxo acid or derivative thereof can be added as an optional component. As the component (E), one type of component may be used alone, or two or more types may be used in combination.

The component (E) is preferably used in an amount within a range from 0.01 to 5.0 parts by weight, relative to 100 parts by weight of the component (A)'.

If desired, other miscible additives can also be added to the positive resist composition according to the third aspect of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition according to the third aspect of the present invention can be prepared by dissolving the materials for the positive resist composition in the same organic solvents as those described in the first aspect (hereafter, frequently referred to as "component (S)"). When the component (S) is a mixed solvent, the mixing ratio (weight ratio) of the mixed solvent is as defined in the first aspect.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 1 to 20% by weight, and preferably from 2 to 15% by weight.

<<Method of Forming a Resist Pattern According to the Fourth Aspect>>

A method of forming a resist pattern according to the fourth aspect of the present invention includes: applying the aforementioned positive resist composition according to the third aspect of the present invention to a substrate to form a resist film on the substrate; subjecting the resist film to exposure; and developing the resist film to form a resist pattern.

The method of forming a resist pattern according to the fourth aspect of the present invention can be conducted in the same manner as the method of forming a resist pattern according to the second aspect described above, except that the positive resist composition according to the third aspect is used as a positive resist composition.

According to the present invention, a resist pattern having an excellent shape can be formed with a high level of resolution. Further, the sensitivity, the line width roughness (LWR) or the like are also excellent. LWR is a phenomenon in which the line width of a line pattern becomes heterogeneous when a resist pattern is formed using a resist composition, and improvement in the level of LWR becomes an important issue as pattern miniaturization progresses.

The reason why the above-mentioned effects can be achieved have not been elucidated yet, but is presumed as follows. Because the structural unit (a13) includes a highly hydrophobic group (acid dissociable, dissolution inhibiting group) on the terminal of a relatively long side chain, when the component (A1)' includes the structural units (a10) and (a13), the compatibility of the formed resist film with an alkali developing solution is reduced, thereby causing deterioration of the resist pattern shape (i.e., formation of T-top shaped resist patterns). However, the formed resist film exhibits an adequate level of heat resistance, the compatibility of the long side chain with an acid generator is favorable, and uniformity of the distribution of acid generator within the film is improved, thereby reducing the level of LWR.

On the other hand, although the structural unit (a11)' exhibits a reduced level of carbon density as well as a reduced level of heat resistance, the activation energy required for deprotection is low, thereby causing a uniform deprotection reaction and contributing to the improvements in the LWR level.

It is thought that by including these two types of protective groups at the same time, the positive resist compositions are capable of exhibiting adequate levels of properties such as resolution, LWR and heat resistance, T-top shape of resist patterns can also be improved, and a pattern with a high level of rectangularity can be formed.

Further, especially when using EUV lithography, by combining two types of protective groups, the effect of reducing the quantity of out-gas can be achieved. Therefore, the resist composition of the present invention is highly useful for use in EUV lithography.

Next, the fifth and sixth aspects of the present invention will be described.

<<Positive Resist Composition of the Fifth Aspect>>

The positive resist composition according to the fifth aspect of the present invention (hereafter, frequently referred to simply as "resist composition") includes a base material component (A)" (hereafter, frequently referred to as "component (A)''") which exhibits increased solubility in an alkali developing solution under the action of acid and an acid generator component (B) (hereafter, frequently referred to as "component (B)") which generates acid upon irradiation.

In the positive resist composition of the fifth aspect, an acid is generated from the component (B) upon irradiation (i.e., exposure), and the action of this acid causes an increase in the solubility of the component (A)" in an alkali developing solution. As a result, in the formation of a resist pattern, when a resist film obtained using the positive resist composition according to the fifth aspect is subjected to selective exposure, the solubility in an alkali developing solution of the exposed portions of the resist film increases, whereas the solubility in the alkali developing solution of the unexposed portions remains unchanged, meaning alkali developing can then be used to form a resist pattern.

<Component (A)">

In the positive resist composition according to the fifth aspect of the present invention, the base material component (A)" includes a polymeric compound (A1)".

[Polymeric Compound (A1)"]

The polymeric compound (A1)" (hereafter, referred to as "component (A1)''") includes a structural unit (a10) derived from hydroxystyrene, a structural unit (a11)' represented by the aforementioned general formula (a11-1)', and a structural unit (a12) represented by the aforementioned general formula (a12-1).

The component (A1)" may further include a structural unit (a15) derived from styrene, in addition to the structural units (a10), (a11)' and (a12).

Structural Unit (a10):

Examples of the structural unit (a10) included in the (A1)" component include the same structural units as those described above for the structural unit (a10) in the first aspect.

As the structural unit (a10), one type of structural unit may be used alone, or two or more types of structural units may be used in combination.

The amount of the structural unit (a10) within the component (A1)" based on the combined total of all structural units constituting the component (A1)" is preferably 50 to 85 mol %, more preferably 55 to 80 mol %, and most preferably 60 to 75 mol %. By making the amount of the structural unit (a10) within the above range, a suitable level of alkali solubility can be achieved using a resist composition prepared from the component (A1)". Further, the lithographic properties such as the resolution and sensitivity are also improved.

Structural Unit (a11)':

Examples of the structural unit (a11)' include the same structural units as those described above for the structural unit (a11)' represented by general formula (a11-1)' in the third aspect.

As the structural unit (a11)', one type of structural unit may be used alone, or two or more types of structural units may be used in combination.

The amount of the structural unit (a11)' within the component (A1)" based on the combined total of all structural units constituting the component (A1)" is preferably 1 to 40 mol %, more preferably 2 to 35 mol %, still more preferably 3 to 30 mol %, and most preferably 5 to 25 mol %. By making the amount of the structural unit (a11)' within the above-mentioned range, the effects of the present invention can be satisfactorily obtained.

Structural Unit (a12):

The structural unit (a12) is represented by general formula (a12-1) shown below.

In the component (A1)", the group within the structural unit (a12) which is formed by $R^{23}$, $R^{24}$ and the carbon atom having $R^{23}$ and $R^{24}$ bonded thereto functions, as the group within the structural unit (a11)' which is formed by $R^{21}$, $R^{22'}$ and the carbon atom having $R^{21}$ and $R^{22'}$ bonded thereto, as an acid dissociable, dissolution inhibiting group.

[Chemical Formula 43]

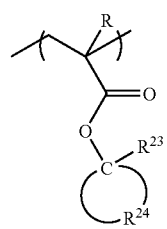

(a12-1)

In the formula, R represents a hydrogen atom, an alkyl group of 1 to 5 carbon atoms, or a halogenated alkyl group of 1 to 5 carbon atoms; $R^{23}$ represents an alkyl group; $R^{24}$ represents a group that forms an aliphatic monocyclic group together with the carbon atom to which this $R^{24}$ group is bonded.

In general formula (a12-1), R is as defined above for R in general formula (a11-1) in the first aspect.

As the alkyl group for $R^{23}$, the same alkyl groups as those mentioned above for $R^{21}$ in general formula (a11-1) in the first aspect can be used.

As the alkyl group for $R^{23}$, because superior effects can be achieved in improving the level of LWR or the like, a linear or branched alkyl group is preferred among the various examples described above, and an ethyl group or an isopropyl group is particularly desirable.

In general formula (a12-1), $R^{24}$ represents a group that forms an aliphatic monocyclic group together with the carbon atom to which this $R^{24}$ group is bonded.

Here, the term "aliphatic polycyclic group" refers to a polycyclic group that has no aromaticity.

The basic ring of the "aliphatic polycyclic group" exclusive of substituents is not limited to be constituted from only carbon and hydrogen (not limited to hydrocarbon rings), but is preferably a hydrocarbon ring. Further, the ring may have part of the carbon atoms constituting the ring structure of the hydrocarbon ring replaced with an ethereal oxygen atom (—O—). The hydrocarbon ring may be either saturated or unsaturated, but in general, the hydrocarbon ring is preferably saturated. Specific examples of the hydrocarbon ring include polycycloalkanes such as bicycloalkanes, tricycloalkanes, and tetracycloalkanes. More specifically, examples of polycycloalkane include adamantane, norbornane, isobornane, tricyclodecane and tetracyclododecane.

The aliphatic monocyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

Specific examples of the group within the structural unit (a12) which is formed by $R^{23}$, $R^{24}$ and the carbon atom having $R^{23}$ and $R^{24}$ bonded thereto include groups represented by general formulas (12-1) to (12-8) shown below. Of these, a group represented by general formula (12-1) is most preferable.

[Chemical Formula 44]

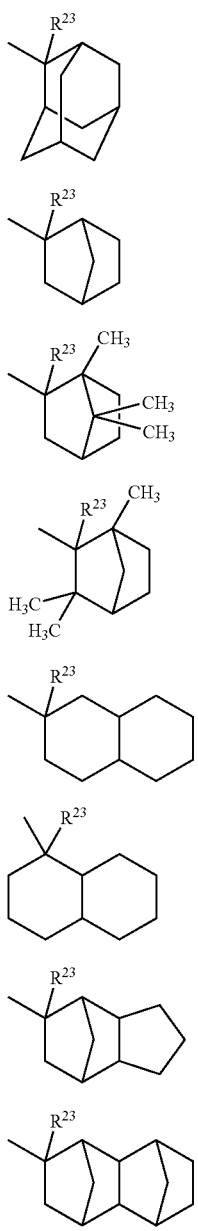

In the formulas, $R^{23}$ represents the aforementioned alkyl group.

Examples of the group $R^{23}$ include the same groups as those described above in relation to the alkyl groups for $R^{23}$ in general formula (a12-1).

As the structural unit (a12), one type of structural unit may be used alone, or two or more types of structural units may be used in combination.

The amount of the structural unit (a12) within the component (A1)" based on the combined total of all structural units constituting the component (A1)" is preferably 5 to 50 mol %, more preferably 10 to 40 mol %, still more preferably 10 to 30 mol %, and most preferably 10 to 25 mol %. By making the amount of the structural unit (a12) within the above-mentioned range, the effects of the present invention can be satisfactorily obtained.

In the present invention, the combined amount of the structural units (a11)' and (a12) within the component (A1)", relative to the combined total of all the structural units that constitute the component (A1)", is preferably within a range from 20 to 50 mol %, more preferably from 25 to 45 mol %, and is most preferably from 25 to 40 mol %. By making the combined amount of the structural units (a11)' and (a12) at least as large as the lower limit of the above-mentioned range, an excellent resist pattern can be formed using a resist composition prepared from the component (A1)". On the other hand, by making the combined amount of the structural units (a11)' and (a12) no more than the upper limit of the above-mentioned range, a good balance can be achieved with the other structural units and the lithography properties are improved.

Further, the ratio (molar ratio) between the structural unit (a11)' and the structural unit (a12) within the component (A1)", namely the ratio structural unit (a11)': structural unit (a12) is preferably within a range from 20:80 to 80:20, is more preferably from 25:75 to 75:25, and is still more preferably from 30:70 to 70:30.

Structural Unit (a15):

As described above, the component (A1)" may further include a structural unit (a15) derived from styrene, in addition to the structural units (a10), (a11)' and (a12). Including the structural unit (a15) enables improvements in the heat resistance and dry etching resistance when a resist composition is prepared. Further, by adjusting the content of the structural unit (a15), the solubility in an alkali developing solution can be adjusted.

Preferred examples of the structural unit (a15) include the same structural units as those described above for the structural unit (a15) in the first aspect.

As the structural unit (a15), one type of structural unit may be used alone, or two or more types of structural units may be used in combination.

In the component (A1)", the amount of the structural unit (a15) based on the combined total of all structural units constituting the component (A1)" is preferably 0 to 30 mol %, more preferably 0 to 20 mol %, and still more preferably 0 to 15 mol %.

The component (A1)" may also have an additional structural unit which is other than the above-mentioned structural units (a10), (a11)', (a12) and (a15), as long as the effects of the present invention are not impaired.

As the additional structural unit, any other structural unit which cannot be classified as one of the above structural units (a10), (a11)', (a12) and (a15) can be used without any particular limitations, and any of the multitude of conventional structural units used within resist resins for ArF excimer lasers, KrF excimer lasers, EUV, EB or the like can be used.

Preferred examples of the above-mentioned additional structural unit include the structural units (a3), (a4) and (a18) shown below.

Structural Unit (a3):

The structural unit (a3) is a structural unit derived from an acrylate ester containing a polar group-containing aliphatic hydrocarbon group. When the component (A1)" includes the structural unit (a3), the hydrophilicity of the component (A1)" is improved, and hence, the compatibility of the component (A1)" with the developing solution is improved. As a result, the alkali solubility of the exposed portions improves, which contributes to favorable improvements in the resolution.

Examples of the structural unit (a3) include the same structural units as those described above for the structural unit (a3) in the first aspect.

Structural Unit (a4):

The structural unit (a4) is a structural unit derived from an acrylate ester containing a non-acid dissociable, aliphatic polycyclic group. Examples of the structural unit (a4) include the same structural units as those described above for the structural unit (a4) in the first aspect.

Structural Unit (a18):

A structural unit (18) is a structural unit having a portion that generates acid upon exposure.

As the structural unit (18), for example, the structural units disclosed in Japanese Unexamined Patent Application, First Publication No. 2006-45311 can be used.

In the component (A1)", one type of these other structural units may be used alone, or two or more types of structural units may be used in combination.

However, in terms of achieving the effects of the present invention, the combined amount of the structural units (a10), (a11)', (a12) and (a15) within the component (A1)", relative to the combined total of all the structural units that constitute the component (A1)", is preferably at least 70 mol %, more preferably at least 90 mol %, and most preferably 100 mol %. In other words, it is particularly desirable that the component (A1)" contain no structural unit other than the structural units (a10), (a11)', (a12) and (a15).

The component (A1)" is preferably a copolymer that includes the structural units (a10), (a11)' and (a12), and examples of such copolymers include a copolymer formed from the structural units (a10), (a11)' and (a12), and a copolymer formed from the structural units (a10), (a11)', (a12) and (a15). These copolymers may further include at least one of the structural units selected from the group consisting of the structural units (a3), (a4) and (a18).

The component (A1)" is particularly preferably a copolymer having three types of structural units represented by general formula (A1-11)" shown below, and most preferably a copolymer formed solely from these three types of structural units.

[Chemical Formula 45]

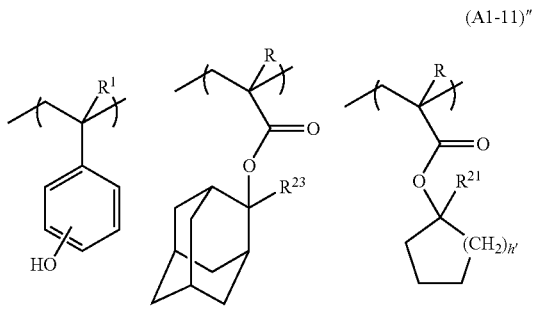

(A1-11)"

In the formulas, $R^1$ represents a hydrogen atom or an alkyl group of 1 to 5 carbon atoms; R represents a hydrogen atom, an alkyl group of 1 to 5 carbon atoms or a halogenated alkyl group of 1 to 5 carbon atoms; each of $R^{23}$ and $R^{21}$ represents an alkyl group; and h' represents an integer of 1 to 6.

In general formula (A1-11)", $R^1$ is as defined above for $R^1$ in general formula (a10-1), $R^{23}$ is as defined above for $R^{23}$ in general formula (a12-1), and R, $R^{21}$ and h' are as defined above for R, $R^{21}$ and h' respectively in general formula (a11-11)'.

The component (A1)" can be produced by a known production method, for example, a conventional radical polymerization or the like of the monomers corresponding with each of the structural units, using a radical polymerization initiator such as azobisisobutyronitrile (AIBN).

Furthermore, in the component (A1)", by using a chain transfer agent such as HS—$CH_2$—$CH_2$-$CH_2$—$C(CF_3)_2$—OH during the above polymerization, a —$C(CF_3)_2$—OH group can be introduced at the terminals of the component (A1)". Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

The weight average molecular weight (Mw) (the polystyrene equivalent value determined by gel permeation chromatography) of the component (A1)" is not particularly limited, but is preferably 2,000 to 50,000, more preferably 3,000 to 30,000, and most preferably 4,000 to 10,000. By making the weight average molecular weight no more than the upper limit of the above-mentioned range, the component (A1)" exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A)", as the component (A1)", one type of component may be used alone, or two or more types may be used in combination.

In terms of enhancing the effects of the present invention, the proportion of the component (A1)" within the component (A)", relative to the total weight of the component (A)", is preferably at least 50% by weight, more preferably 75% by weight or greater, still more preferably 80% by weight or greater, and may be 100% by weight.

With respect to the resist composition according to the fifth aspect of the present invention, the component (A)" may also include a base material component that exhibits increased solubility in an alkali developing solution under the action of acid other than the aforementioned component (A1)" (hereafter also referred to as the component (A2)).

There are no particular limitations on the component (A2), and the same components as those described above for the component (A2) in the first aspect can be used.

As the component (A2), either a single type of component may be used, or two or more types may be used in combination.

In the resist composition according to the fifth aspect of the present invention, the amount of the component (A)" can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, for example, the same acid generators as those mentioned in the first aspect, including onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators can be used.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety.

The amount of the component (B) within the positive resist composition according to the fifth aspect of the present invention is preferably from 0.5 to 50 parts by weight, and more preferably from 1 to 40 parts by weight, relative to 100 parts by weight of the component (A)". When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

The positive resist composition according to the fifth aspect of the present invention may further contain the same nitrogen-containing organic compound (D) (hereafter referred to as the component (D)) as those mentioned in the first aspect as an optional component.

As the component (D), one type may be used alone, or two or more types may be used in combination.

The component (D) is typically used in an amount within a range from 0.01 to 5.0 parts by weight, relative to 100 parts by weight of the component (A)". By ensuring that the amount of the component (D) is within the above-mentioned range, the shape of the resist pattern and the post exposure stability of the latent image formed by the pattern-wise exposure of the resist layer are improved.

Furthermore, in the positive resist composition according to the fifth aspect of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of the same compounds as those mentioned in the first aspect such as an organic carboxylic acid, or a phosphorus oxo acid or derivative thereof can be added as an optional component.

As the component (E), one type of component may be used alone, or two or more types may be used in combination.

The component (E) is preferably used in an amount within a range from 0.01 to 5.0 parts by weight, relative to 100 parts by weight of the component (A)".

If desired, other miscible additives can also be added to the positive resist composition according to the fifth aspect of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition according to the fifth aspect of the present invention can be prepared by dissolving the materials for the positive resist composition in the same organic solvents as those described in the first aspect (hereafter, frequently referred to as "component (S)"). When the component (S) is a mixed solvent, the mixing ratio (weight ratio) of the mixed solvent is as defined in the first aspect.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 1 to 20% by weight, and preferably from 2 to 15% by weight.

<<Method of Forming a Resist Pattern According to the Sixth Aspect>>

A method of forming a resist pattern according to the sixth aspect of the present invention includes: applying the aforementioned positive resist composition according to the fifth aspect of the present invention to a substrate to form a resist film on the substrate; subjecting the resist film to exposure; and developing the resist film to form a resist pattern.

The method of forming a resist pattern according to the sixth aspect of the present invention can be conducted in the same manner as the method of forming a resist pattern according to the second aspect described above, except that the positive resist composition according to the fifth aspect is used as a positive resist composition.

According to the fifth and sixth aspects of the present invention, a very fine resist pattern with an excellent shape can be formed. Further, the resolution, the exposure margin (EL), the sensitivity, the line width roughness (LWR) or the like are also excellent. The EL is the range of the exposure dose at which a resist pattern can be formed with a size within a predetermined range of variation from a target size, when exposure is conducted by changing the exposure dose, i.e., the range of the exposure dose at which a resist pattern faithful to the mask pattern can be formed. The larger the EL value, the smaller the variation in the pattern size depending on the change in the exposure dose, thereby resulting in favorable improvement in the process margin. LWR is a phenomenon in which the line width of a line pattern becomes heterogeneous when a resist pattern is formed using a resist composition, and improvement in the level of LWR becomes an important issue as pattern miniaturization progresses.

The reason why the above-mentioned effects can be achieved have not been elucidated yet, but is presumed as follows. First, it is thought that the combination of the structural units (a10) and (a12) in the component (A)" contributes to improvements in the resolution, sensitivity or the like. Because the structural unit (12) includes a bulky and highly hydrophobic group at the terminal thereof, superior effects in terms of improving the heat resistance of resist films and reducing the quantity of out-gas can be achieved. However, when the component (A)" includes the structural units (a10) and (a12), the compatibility of the formed resist film with an alkali developing solution is reduced. On the other hand, although the structural unit (a11)' has lower carbon density than the structural unit (a12), and thus reduces the level of heat resistance, the structural unit (a11)' exhibits high acid dissociability and is capable of causing deprotection with low activation energy, and hence contributes to the improvement in LWR.

In the present invention, by combining the structural unit (a11)' with the structural units (a10) and (a12), the compatibility of the resist composition with an alkali developing solution can be improved without impairing the resolution. Therefore, it is thought that the effects of improving roughness and heat resistance can be achieved, and favorable levels of sensitivity and EL margin are also achieved due to a synergistic effect resulting from the combination of the structural units (a11)' and (a12).

Further, especially when using EUV lithography, by combining two types of protective groups, the effect of reducing the quantity of out-gas can be achieved. Therefore, the resist composition of the present invention is highly useful for use in EUV lithography.

EXAMPLES

As follows is a more detailed description of the present invention based on a series of examples, although the scope of the present invention is in no way limited by these examples.

Polymer Synthesis Examples 1 to 7

Propylene glycol monomethyl ether acetate (PGMEA) was charged into a flask equipped with an inlet for nitrogen, a stirrer, a condenser and a thermometer in a nitrogen atmosphere, and the temperature of the water bath was elevated to 80° C. while stirring. Subsequently, 2,2'-azobisisobutyronitrile (AIBN) as a polymerization initiator and a PGMEA monomer solution containing a monomer mixture having the composition (in molar ratio) shown in Table 1, were dropwise added into the flask using a dripping apparatus at a constant rate over 4 hours, and then the temperature was maintained at 80° C. for 2 hours. Then, the temperature of the reaction solution was cooled to room temperature. Subsequently, the resulting reaction solution was dropwise added to methanol about 30 times in amount while stirring, to obtain a colorless precipitate. The obtained precipitate was separated by filtration, and the precipitate was washed in methanol in an amount about 30 times the amount of the monomers used in the polymerization. The resulting precipitate was separated by filtration, and the precipitate was dissolved in methanol. A 120 mol % aqueous solution of aniline was dropwise added to the obtained methanol solution, followed by stirring at 70° C. for 60 hours. Following the completion of the reaction, the resulting reaction solution was dropwise added to an excess amount of water to obtain a precipitate. The resulting precipitate was separated by filtration, followed by washing, and drying under reduced pressure at 50° C. for about 40 hours, thereby obtaining a target polymeric compound.

For each polymeric compound, the weight average molecular weight (Mw) and the dispersity (Mw/Mn) determined by the polystyrene equivalent value as measured by gel permeation chromatography (GPC) are shown in Table 1.

Further, each polymeric compound was analyzed by carbon 13 nuclear magnetic resonance spectroscopy (600 MHz, $^{13}$C-NMR) to determine the compositional ratio of the copolymer (ratio (molar ratio) of the respective structural units within the structural formula). The structural formula and compositional ratio of the copolymer for each polymeric compound are shown in Table 1.

TABLE 1

| Polymeric compound | Monomer composition (molar ratio) | | | | | Molecular weight | Dispersity | Structural formula | Compositional ratio of copolymers |
| --- | --- | --- | --- | --- | --- | --- | --- | --- | --- |
|  | (1) | (2) | (3) | (4) | (5) |  |  |  |  |
| 1H | 60 | 40 |  |  |  | 6,700 | 1.83 | A-1 | m/n = 59.5/40.5 |
| 1L | 75 | 25 |  |  |  | 6,700 | 1.79 | A-1 | m/n = 73.0/27.0 |
| 2H | 60 |  | 40 |  |  | 8,400 | 2.11 | A-2 | m/n = 63.7/36.3 |
| 2L | 75 |  | 25 |  |  | 7,200 | 1.85 | A-2 | m/n = 73.1/26.9 |
| 3H | 60 |  |  | 40 |  | 6,300 | 1.92 | A-3 | m/n = 60.3/39.7 |
| 3L | 75 |  |  | 25 |  | 5,600 | 2.11 | A-3 | m/n = 74.0/20.0 |
| 3M | 70 |  |  | 30 |  | 5,900 | 1.96 | A-3 | m/n = 67.3/32.7 |
| 4H | 60 |  |  |  | 40 | 6,400 | 2.11 | A-4 | m/n = 63.7/36.3 |
| 4L | 75 |  |  |  | 25 | 6,200 | 2.07 | A-4 | m/n = 73.1/26.9 |

The compounds (1) to (5) and structural formulas A-1 to A-4 shown in Table 1 indicate the following.

[Chemical Formula 46]

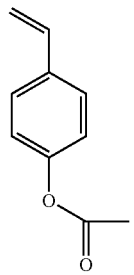

(1)

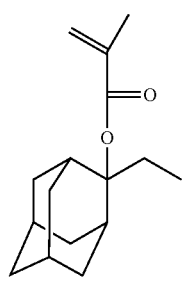

(2)

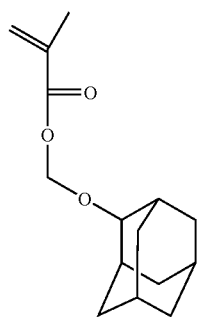

(3)

-continued (4)

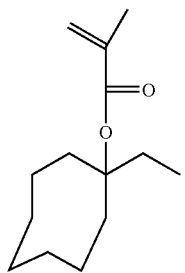

(5)

[Chemical Formula 47]

A-1

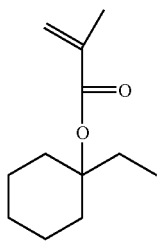

A-2

A-3

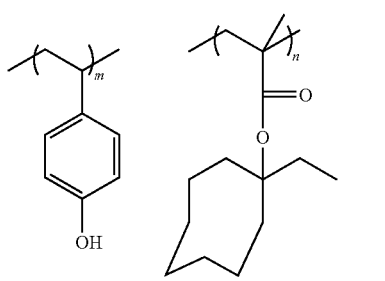

-continued

A-4

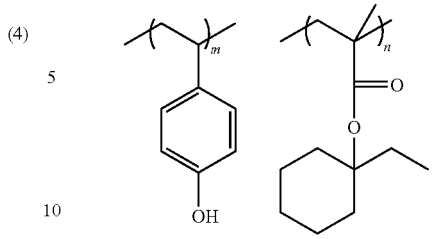

<Preparation of Positive Resist Composition Solution>

Examples 1 to 9, Comparative Examples 1 to 6

The components shown in Table 2 and 4,900 parts by weight of a mixed solvent of PGMEA/PGME=2,940/1,960 (weight ratio) were mixed together and dissolved to obtain positive resist composition solutions.

TABLE 2

|  | Component (A) | | Component (B) | | Component (D) | Component (E) |
|---|---|---|---|---|---|---|
| Ex. 1 | (A)-1 [100] | — | (B)-1 [23] | — | (D)-1 [1.0] | — |
| Ex. 2 | (A)-1 [100] | — | (B)-2 [14.6] | (B)-3 [12.4] | (D)-1 [1.9] | (E)-1 [0.75] |
| Ex. 3 | (A)-1 [100] | — | (B)-2 [29.2] | — | (D)-1 [1.5] | (E)-1 [0.60] |
| Ex. 4 | (A)-1 [100] | — | (B)-4 [29.5] | — | (D)-1 [1.9] | (E)-1 [0.75] |
| Ex. 5 | (A)-1 [100] | — | (B)-5 [40.1] | — | (D)-1 [1.9] | (E)-1 [0.75] |
| Ex. 6 | (A)-1 [100] | — | (B)-1 [23] | — | (D)-1 [1.5] | — |
| Ex. 7 | (A)-2 [100] | — | (B)-1 [23] | — | (D)-1 [1.5] | — |
| Ex. 8 | (A)-3 [100] | — | (B)-1 [23] | — | (D)-1 [1.5] | — |
| Ex. 9 | (A)-1 [33] | (A)-2 [67] | (B)-1 [23] | — | (D)-1 [1.5] | — |
| Comp. Ex. 1 | (A')-1 [100] | — | (B)-1 [23] | — | (D)-1 [1.0] | — |
| Comp. Ex. 2 | (A')-1 [33] | (A')-2 [67] | (B)-1 [23] | — | (D)-1 [1.0] | — |
| Comp. Ex. 3 | (A')-2 [100] | — | (B)-1 [23] | — | (D)-1 [1.0] | — |
| Comp. Ex. 4 | (A')-3 [100] | (A')-4 [67] | (B)-1 [23] | — | (D)-1 [1.0] | — |
| Comp. Ex. 5 | (A')-4 [100] | — | (B)-1 [23] | — | (D)-1 [1.5] | — |
| Comp. Ex. 6 | (A')-5 [100] | — | (B)-1 [23] | — | (D)-1 [1.5] | — |

In Table 2, the values in brackets [ ] indicate the amount (in terms of parts by weight) of the component added.
Further, in Table 2, the reference characters indicate the following.
(A)-1: the aforementioned polymeric compound 3H
(A)-2: the aforementioned polymeric compound 3L
(A)-3: the aforementioned polymeric compound 3M
(A')-1: the aforementioned polymeric compound 1H
(A')-2: the aforementioned polymeric compound 1L
(A')-3: the aforementioned polymeric compound 2H
(A')-4: the aforementioned polymeric compound 2L
(A')-5: the aforementioned polymeric compound 4H
(A')-6: the aforementioned polymeric compound 4L
(B)-1: a compound represented by chemical formula (B)-1 shown below
(B)-2: a compound represented by chemical formula (B)-2 shown below
(B)-3: a compound represented by chemical formula (B)-3 shown below
(B)-4: a compound represented by chemical formula (B)-4 shown below
(B)-5: a compound represented by chemical formula (B)-5 shown below
(D)-1: tri-n-octylamine
(F)-1: salicylic acid
[Chemical Formula 48]

TABLE 2-continued

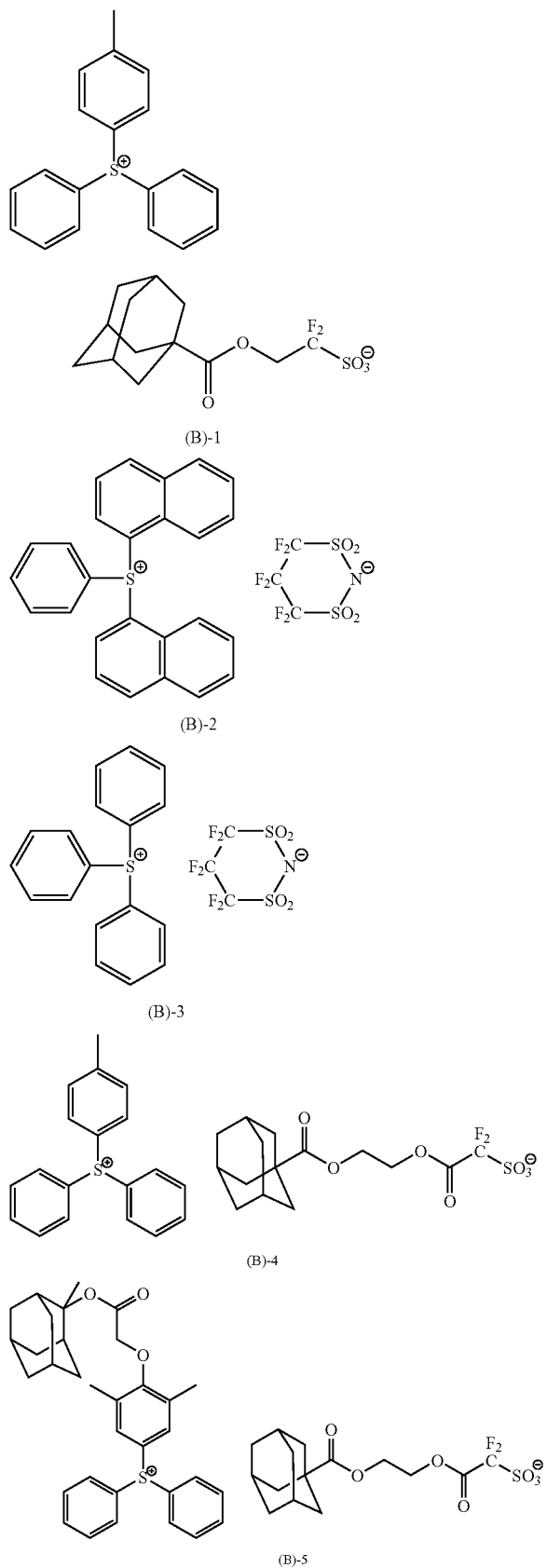

Using the obtained positive resist composition solutions, the following evaluations were conducted.

<Evaluation of Lithography Properties>

[Evaluation of Resist Pattern Formation]

Using a spinner, each of the resist compositions was uniformly applied onto an 8-inch silicon substrate which had been treated with hexamethyldisilazane (HMDS) at 90° C. for 30 seconds, and was then subjected to a bake treatment (PAB) at a temperature indicated in Table 3 for 60 seconds, thus forming a resist film (film thickness: 60 nm).

This resist film was then subjected to direct patterning (exposure) with an electron beam lithography apparatus HL-800D (VSB) (manufactured by Hitachi, Ltd.) at an accelerating voltage of 70 keV, and was subsequently subjected to a bake treatment (PEB) at a temperature indicated in Table 3 for 60 seconds, developed for 60 seconds in a 2.38% by weight aqueous tetramethylammonium hydroxide (TMAH) solution (product name: NMD-3; manufactured by Tokyo Ohka Kogyo Co., Ltd.) at 23° C., and then rinsed with pure water for 15 seconds.

As a result, in each of the examples, a line and space (L/S) pattern with a line width of 100 nm and a pitch of 200 nm was formed.

[Evaluation of Sensitivity and Resolution]

In the formation of the above-mentioned resist pattern, the optimum exposure dose Eop ($\mu C/cm^2$) for formation of an L/S pattern with a line width of 100 nm and a pitch of 200 nm was determined. The results are shown in Table 3.

Further, the critical resolution (nm) at the above Eop value was determined, and the results are shown in Table 3 as "Resolution".

The results are shown in Table 3.

[Evaluation of Line Width Roughness (LWR)]

With respect to each of the L/S patterns formed with the above Eop and having a line width of 100 nm and a pitch of 200 nm, the line width at 5 points in the lengthwise direction of the line were measured using a measuring scanning electron microscope (SEM) (product name: S-9220, manufactured by Hitachi, Ltd.), and from the results, the value of 3 times the standard deviation s (i.e., 3s) was calculated as a yardstick of LWR in nanometers. The smaller this 3s value is, the lower the level of roughness of the line width, indicating that an L/S pattern with a uniform width was obtained. The results are shown in Table 3.

[Evaluation of Pattern Shape]

Each of the L/S patterns having a line width of 100 nm and a pitch of 200 nm and formed with the above Eop was observed using a scanning electron microscope (product name: S-9220, manufactured by Hitachi, Ltd.), and the cross-sectional shape of the L/S pattern was evaluated with the following criteria. The results are shown in Table 3.

A: The line side walls were perpendicular with respect to the substrate surface at the interfacial portion with the substrate, and the rectangularity of the pattern was high.

B: Although the line side walls were perpendicular with respect to the substrate surface at the interfacial portion with the substrate, and the top portions of the pattern were slightly rounded.

C: The pattern had a T-top shape and the rectangularity of the pattern was low.

TABLE 3

| Positive resist composition | PAB (° C.) | PEB (° C.) | Eop ($\mu C/cm^2$) | Resolution (nm) | LWR (nm) | Pattern shape |
|---|---|---|---|---|---|---|
| Ex. 1 | 80 | 80 | 30 | 50 | 12.5 | A |
| Ex. 2 | 100 | 80 | 60 | 50 | 10.7 | A |
| Ex. 3 | 100 | 80 | 54 | 50 | 13.0 | A |
|  | 120 | 80 | 44 | 50 | 12.5 | A |

TABLE 3-continued

| Positive resist composition | PAB (° C.) | PEB (° C.) | Eop (µC/cm$^2$) | Resolution (nm) | LWR (nm) | Pattern shape |
|---|---|---|---|---|---|---|
| | 90 | 80 | 52 | 50 | 12.5 | A |
| | 80 | 80 | 54 | 50 | 13.3 | B |
| | 70 | 70 | 54 | 50 | 12.7 | B |
| Ex. 4 | 100 | 80 | 44 | 50 | 11.0 | A |
| Ex. 5 | 100 | 80 | 60 | 50 | 9.8 | A |
| Ex. 6 | 80 | 80 | 34 | 50 | 14.5 | A |
| Ex. 7 | 80 | 80 | 22 | 50 | 17.7 | B |
| Ex. 8 | 80 | 80 | 24 | 50 | 18.0 | A |
| Ex. 9 | 80 | 80 | 24 | 50 | 15.5 | A |
| Comp. Ex. 1 | 80 | 80 | 40 | 70 | 15.0 | C |
| Comp. Ex. 2 | 80 | 80 | 40 | 70 | 17.0 | C |
| Comp. Ex. 3 | 80 | 80 | 38 | 70 | 16.9 | C |
| Comp. Ex. 4 | 120 | 100 | 30 | 60 | 18.3 | B |
| Comp. Ex. 5 | 80 | 80 | 30 | 60 | 16.7 | B |
| Comp. Ex. 6 | 80 | 80 | 35 | 60 | 20.1 | B |

When the positive resist compositions obtained in Examples 1 to 6 and those obtained in Comparative Examples 1 and 5 were compared, in which the protection ratios for the components (A) used (i.e., the proportion of the structural unit having an acid dissociable, dissolution inhibiting group (mol %)) were equivalent (about 40 mol %), those obtained in Examples 1 to 6 were superior in terms of resolution, shape and LWR. Further, from the results of Example 3, according to the positive resist composition of the present invention, it was confirmed that even when a bake treatment is conducted at a relatively low temperature, a resist pattern having an excellent shape can be formed with a favorable level of resolution.

Likewise, when the positive resist compositions obtained in Example 7 and the positive resist compositions obtained in Comparative Examples 3 and 6 were compared, in which the protection ratios for the components (A) used were equivalent (about 25 mol %), the positive resist composition obtained in Example 7 was superior compared to the positive resist composition obtained in Comparative Example 3 in terms of resolution, shape, and sensitivity, and was also superior compared to the positive resist composition obtained in Comparative Example 6 in terms of LWR and sensitivity.

Furthermore, when the positive resist compositions obtained in Examples 8 and 9 and the positive resist compositions obtained in Comparative Examples 2 and 4 were compared, in which the protection ratios for the components (A) used were equivalent (about 30 mol %), the positive resist compositions obtained in Examples 8 and 9 were superior compared to the positive resist composition obtained in Comparative Example 2 in terms of resolution, shape and sensitivity. Although the positive resist composition obtained in Comparative Example 4 exhibited relatively favorable levels of resolution and shape, a bake treatment at a relatively high temperature was further required.

<Evaluation Using EUV Exposure>

Using the resist compositions of Example 1 and a resist composition that included the components indicated in Table 4 shown below (Comparative Example 7), evaluations were conducted using EUV exposure, thereby obtaining a line and space pattern (L/S pattern) with a line width of 34 nm and a pitch of 68 nm.

Note that the conditions for PAB, PEB, developing, and rinse treatments were the same as those described above in Example 1 for forming a resist pattern using an electron beam (EB).

In Table 4, (A')-7 refers to a polymeric compound represented by formula A-5 shown below having a molecular weight of 8,000 and a dispersity of 1.5.

The sensitivity and resolution were evaluated in the same method as described above, apart from the differences in the line width. The results are shown in Table 4.

From the results shown in Table 4, it was confirmed that the LWR level of the resist composition obtained in Example 1 was superior to that of the resist composition obtained in Comparative Example 7.

TABLE 4

| | Component (A) | Component (B) | Component (D) | Component (S) | Sensitivity (mJ/cm$^2$) | LWR (nm) |
|---|---|---|---|---|---|---|
| Ex. 1 | (A)-4 [100] | (B)-1 [23] | (D)-1 [1.0] | (S)-1 [4,900] | 13 | 5.5 |
| Comp. Ex. 7 | (A')-7 [100] | (B)-1 [23] | (D)-1 [1.0] | (S)-1 [4,900] | 13 | 7.7 |

[Chemical Formula 49]

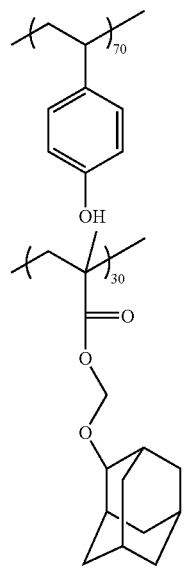

A-5

Synthesis Example of Component (B)

Synthesis of (B)-1 (Compound (I))

35.6 g of a compound (1-1) (TDPS-Br) was dissolved in 360 g of pure water, and 360 g of dichloromethane and 38.0 g of a compound (1-2) were added, followed by stirring at room temperature for 14 hours. Then, the dichloromethane layer was separated, and washed with a diluted hydrochloric acid and water in this order. Thereafter, the resultant was concentrated and solidified, thereby obtaining 58 g of an objective compound (I) in the form of a white solid.

[Chemical Formula 50]

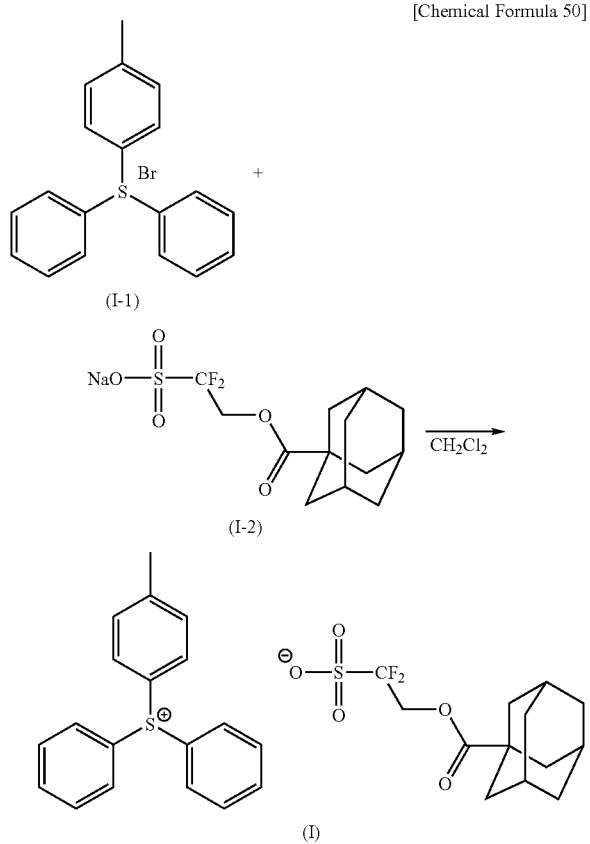

The obtained compound (I) was analyzed by NMR.

$^1$H-NMR (DMSO-d6, 400 MHz): δ (ppm)=1.64 (m, 6H, Ad), 1.82 (m, 6H, Ad), 1.94 (m, 3H, Ad), 3.35 (s, 3H, CH$_3$), 4.55 (t, 2H, CF$_2$CH$_2$), 7.56 (d, 2H, Ar), 7.72-7.84 (m, 12H, Ar).

$^{19}$F-NMR (DMSO-d6, 376 MHz): δ (ppm)=−111.2.

From the results of the analysis shown above, it was confirmed that the compound (I) had a structure as shown in chemical formula (1) above.

Synthesis of (B)-4 (Compound (VI))

(i)

4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction liquid was filtered, and 20 g of hexane was added to the residue and stirred. Thereafter, the resultant was filtered, and the residue was dried, thereby obtaining 1.41 g of a compound (III) (yield: 43.1%).

[Chemical Formula 51]

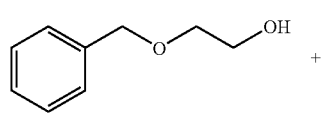

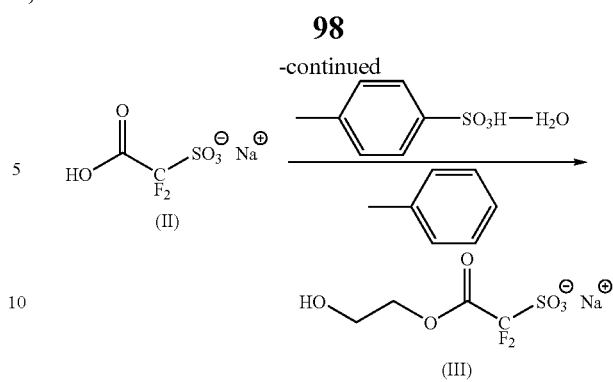

$^1$H-NMR (DMSO-d6, 400 MHz): δ (ppm)=4.74-4.83 (t, 1H, OH), 4.18-4.22 (t, 2H, H$^a$), 3.59-3.64 (q, 2H, H$^b$).
$^{19}$F-NMR (DMSO-d6, 376 MHz): δ (ppm)=−106.6.

From the results shown above, it was confirmed that the compound (III) had a structure shown below.

[Chemical Formula 52]

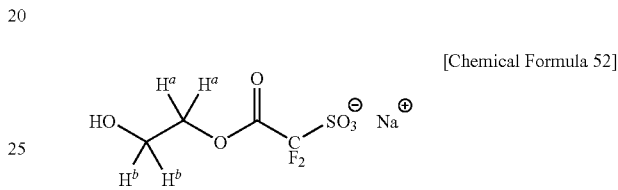

(ii)

Subsequently, 1.00 g of the compound (III) and 3.00 g of acetonitrile were prepared, and 0.82 g of 1-adamantanecarbonyl chloride and 0.397 g of triethylamine were dropwise added thereto upon cooling in ice. Following dropwise addition, the resultant was stirred at room temperature for 20 hours and was then filtered. The obtained filtrate was concentrated and solidified, dissolved in 30 g of dichloromethane, and washed three times with water. Thereafter, the resulting organic layer was concentrated and dried, thereby obtaining 0.82 g of a compound (IV) (yield: 41%).

[Chemical Formula 53]

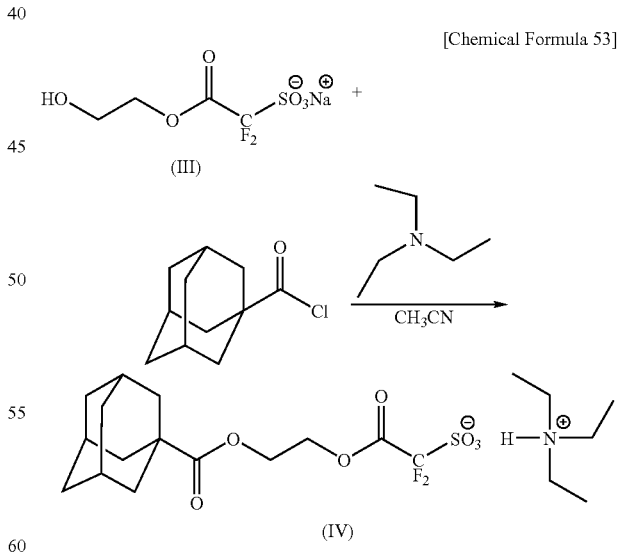

The obtained compound (IV) was analyzed by NMR.
$^1$H-NMR (DMSO-d6, 400 MHz): δ (ppm)=8.81 (s, 1H, H$^e$), 4.37-4.44 (t, 2H, H$^d$), 4.17-4.26 (t, 2H, H$^c$), 3.03-3.15 (q, 6H, H$^b$), 1.61-1.98 (m, 15H, Adamantane), 1.10-1.24 (t, 9H, H$^a$).
$^{19}$F-NMR (DMSO-d6, 376 MHz): δ (ppm)=−106.61.

From the results shown above, it was confirmed that the compound (IV) had a structure shown below.

[Chemical Formula 54]

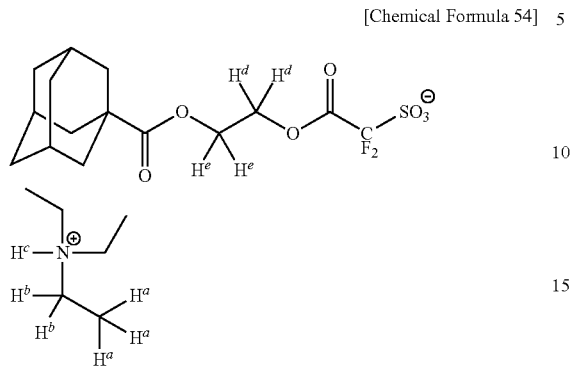

(iii)
Subsequently, 0.384 g of a compound (V) shown below was dissolved in 3.84 g of dichloromethane and 3.84 g of water, and 0.40 g of the compound (IV) was then added to the resulting solution. The resultant was stirred for 1 hour, and was then subjected to liquid separation to collect an organic layer. The obtained organic layer was washed three times with 3.84 g of water. Thereafter, the resulting organic layer was concentrated and solidified, thereby obtaining 0.44 g of a compound (VI) (yield: 81.5%).

[Chemical Formula 55]

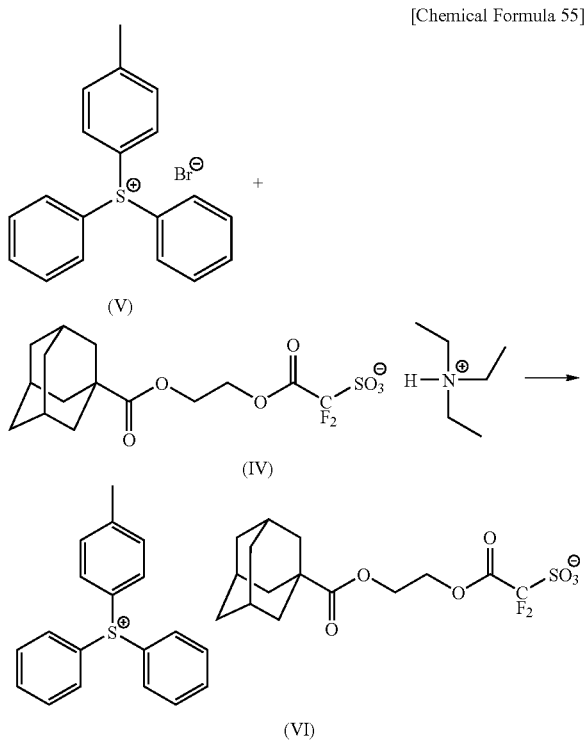

The obtained compound (VI) was analyzed by NMR.
$^1$H-NMR (DMSO-d6, 400 MHz): δ (ppm)=7.57-7.87 (m, 14H, Phenyl), 4.40-4.42 (t, 2H, H$^b$), 4.15-4.22 (t, 2H, H$^a$), 2.43 (s, 3H, H$^e$), 1.60-1.93 (m, 15H, Adamantane).
$^{19}$F-NMR (DMSO-d6, 376 MHz): δ (ppm)=−106.7.
From the results shown above, it was confirmed that the compound (VI) had a structure shown below.

[Chemical Formula 56]

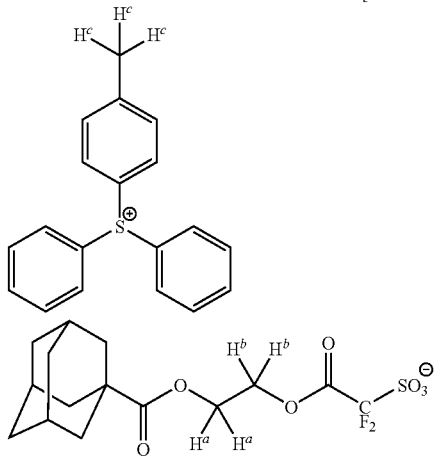

Synthesis of (B)-5 (Compound (X))

(i)
To 60.75 g of methanesulfonic acid controlled to 20° C. or lower was added 8.53 g of phosphorus oxide, 8.81 g of 2,5-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction liquid was dropwise added to 109.35 g of pure water cooled to 15° C. or lower. Thereafter, 54.68 g of dichloromethane was added and stirred, and the dichloromethane phase was collected. 386.86 g of hexane at a temperature of 20 to 25° C. was charged into a separate vessel, and the dichloromethane phase was dropwise added thereto. Then, the resultant was matured at 20 to 25° C. for 30 minutes, followed by filtration, thereby obtaining 17.14 g of an objective compound (i) (yield: 70.9%).

The obtained compound (i) was analyzed by NMR.
$^1$H-NMR (DMSO-d6, 600 MHz): δ (ppm)=7.61-7.72 (m, 10H, phenyl), 7.14 (s, 2H, H$^e$), 3.12 (s, 3H, H$^b$), 2.22 (s, 6H, H$^a$).

From the results shown above, it was confirmed that the compound (i) had a structure shown below.

[Chemical Formula 57]

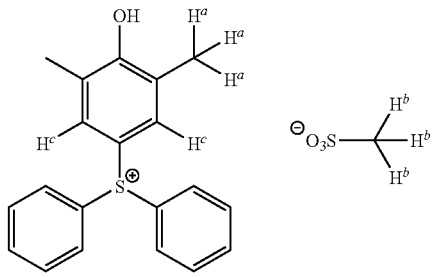

(ii)
4 g of the compound (i) was dissolved in 79.8 g of dichloromethane. After confirming that the compound (i) had dissolved in dichloromethane, 6.87 g of potassium carbonate was added thereto, and 3.42 g of bromoacetic acid methyl adamantane was further added. A reaction was effected under reflux for 24 hours, followed by filtration, washing with water, and crystallization with hexane. The resulting powder was dried under reduced pressure, thereby obtaining 3.98 g of an objective compound (ii) (yield: 66%).

The obtained compound (ii) was analyzed by NMR.

$^1$H-NMR (CDCl$_3$, 400 MHz): δ (ppm)=7.83-7.86 (m, 4H, Phenyl), 7.69-7.78 (m, 6H, Phenyl), 7.51 (s, 2H, H$^d$), 4.46 (s, 2H, H$^c$), 2.39 (s, 6H, H$^a$), 2.33 (s, 2H, Adamantane), 2.17 (s, 2H, Adamantane), 1.71-1.98 (m,11H, Adamantane), 1.68 (s, 3H, H$^b$), 1.57-1.61 (m, 2H, Adamantane).

From the results shown above, it was confirmed that the compound (II) had a structure shown below.

[Chemical Formula 58]

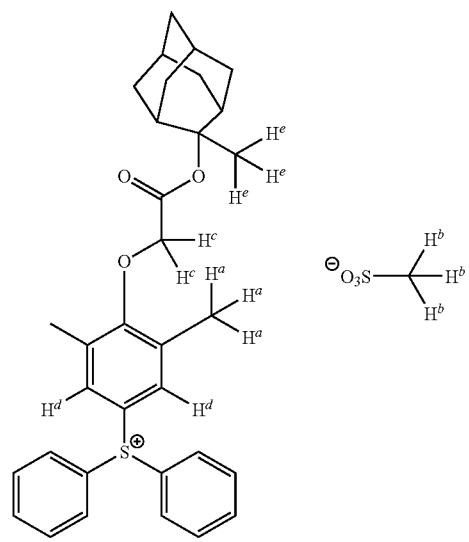

(iii)

4.77 g of the compound (ii) was dissolved in 23.83 g of dichloromethane and 23.83 g of pure water, and 3.22 g of the compound (IV) was then added to the resulting solution. The resultant was stirred for 1 hour, and was then subjected to liquid separation to collect an organic layer. The obtained organic layer was washed three times with 3.84 g of water. Thereafter, the resulting organic layer was concentrated and solidified, thereby obtaining 4.98 g of a compound (X) (yield: 87%).

[Chemical Formula 59]

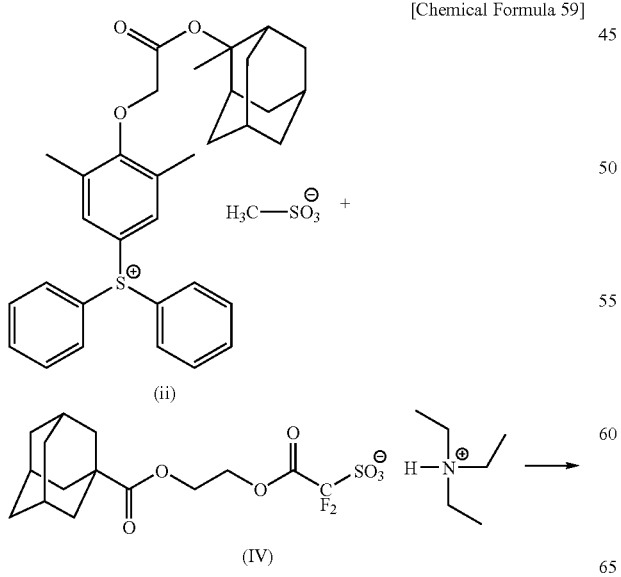

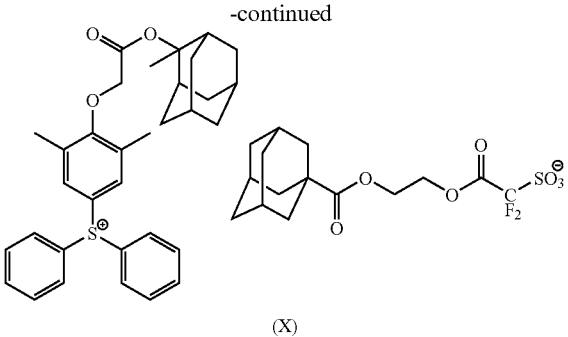

(X)

The obtained compound (X) was analyzed by NMR.

$^1$H-NMR (DMSO-d6, 400 MHz): δ (ppm)=7.76-7.88 (m, 10H, Phenyl), 7.62 (s, 2H, Phenyl), 4.64 (s, 2H, H$^b$), 4.43-4.44 (t, 2H, H$^e$), 4.22-4.23 (t, 2H, H$^d$), 1.51-2.36 (m, 38H, Adamantane+Ha+H$^c$).

$^{19}$F-NMR (DMSO-d6, 376 MHz): δ (ppm)=−106.7.

From the results shown above, it was confirmed that the compound (X) had a structure shown below.

[Chemical Formula 60]

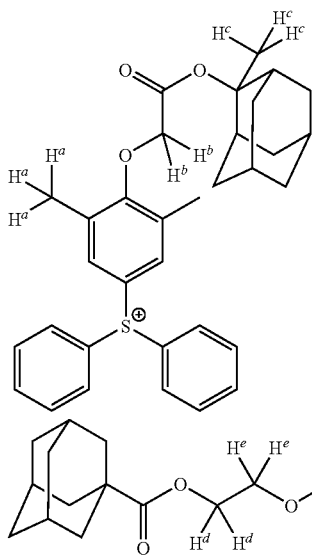

Polymer Synthesis Examples 8 to 15

Objective compounds were obtained by synthesizing using the same method as in Polymer Synthesis Examples 1 to 7 described above.

For each polymeric compound, the weight average molecular weight (Mw) and the dispersity (Mw/Mn) determined by the polystyrene equivalent value as measured by gel permeation chromatography (GPC) are shown in Table 5.

Further, each polymeric compound was analyzed by carbon 13 nuclear magnetic resonance spectroscopy (600 MHz, $^{13}$C-NMR) to determine the compositional ratio of the copolymer (ratio (molar ratio) of the respective structural units within the structural formula). The structural formula and compositional ratio of the copolymer for each polymeric compound are shown in Table 5.

TABLE 5

| Polymeric compound | Monomer composition (molar ratio) | | | Molecular weight | Dispersity | Structural formula | Compositional ratio of copolymers |
| --- | --- | --- | --- | --- | --- | --- | --- |
| | (1) | (6) | (4) | | | | |
| 1X | 75 | 25 | | 8,800 | 2.84 | A'-1 | m/n = 74.3/25.7 |
| 1Y | 75 | 25 | | 7,300 | 2.77 | A'-1 | m/n = 74.9/25.1 |
| 1Z | 60 | 40 | | 6,800 | 2.22 | A'-1 | m/n = 58.0/42.0 |
| 2A | 75 | 20 | 5 | 6,700 | 2.51 | A'-2 | l/m/n = 75.5/20.1/4.4 |
| 2B | 60 | 20 | 20 | 5,500 | 1.99 | A'-2 | l/m/n = 59.1/21.3/19.6 |
| 2C | 75 | 15 | 10 | 6,000 | 2.35 | A'-2 | l/m/n = 76.4/15.2/8.4 |
| 2D | 60 | 15 | 25 | 5,700 | 1.96 | A'-2 | l/m/n = 59.1/16.3/24.6 |
| 2E | 65 | 20 | 15 | 6,000 | 2.0 | A'-2 | l/m/n = 64.4/21.0/14.6 |

The compounds (1), (4) and (6) and structural formulas A'-1 and A'-2 shown in Table 5 indicate the following.

[Chemical Formula 61]

(1)
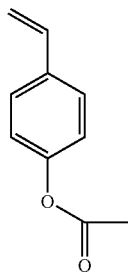

(6)
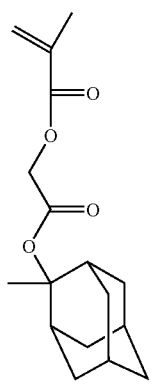

(4)
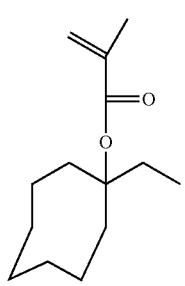

[Chemical Formula 62]

A'-1
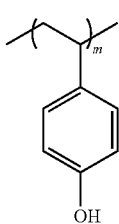

A'-2
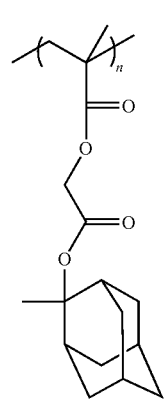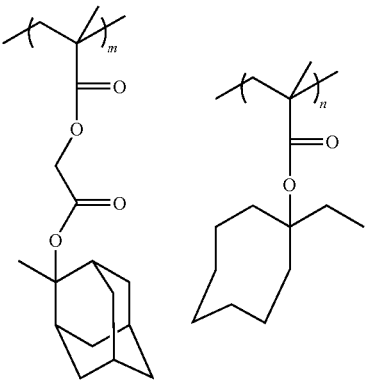

<Preparation of Positive Resist Composition Solution>

Examples 10 to 19, Comparative Examples 8 and 9

The components shown in Table 6 were mixed together and dissolved to obtain positive resist composition solutions.

TABLE 6

|  | Component (A)' | | Component (B) | | Component (D) | Component (E) | Component (S) |
|---|---|---|---|---|---|---|---|
| Ex. 10 | (A)'-1 [33] | (A)'-2 [67] | (B)-1 [23] | — | (D)-1 [1.0] | — | (S)-1 [4,900] |
| Ex. 11 | (A)'-1 [33] | (A)'-2 [67] | (B)-2 [14.6] | (B)-3 [12.4] | (D)-1 [1.5] | (E)-1 [0.6] | (S)-1 [4,900] |
| Ex. 12 | (A)'-1 [33] | (A)'-2 [67] | (B)-2 [29.2] | — | (D)-1 [1.0] | (E)-1 [0.4] | (S)-1 [4,900] |
| Ex. 13 | (A)'-1 [33] | (A)'-2 [67] | (B)-4 [29.5] | — | (D)-1 [1.5] | (E)-1 [0.6] | (S)-1 [4,900] |
| Ex. 14 | (A)'-1 [33] | (A)'-2 [67] | (B)-5 [40.1] | — | (D)-1 [1.5] | (E)-1 [0.6] | (S)-1 [4,900] |
| Ex. 15 | (A)'-3 [100] | — | (B)-1 [23] | — | (D)-1 [1.0] | — | (S)-1 [4,900] |
| Ex. 16 | (A)'-3 [100] | — | (B)-2 [14.6] | (B)-3 [12.4] | (D)-1 [1.0] | (E)-1 [0.6] | (S)-1 [4,900] |
| Ex. 17 | (A)'-3 [100] | — | (B)-2 [29.2] | — | (D)-1 [1.0] | (E)-1 [0.4] | (S)-1 [4,900] |
| Ex. 18 | (A)'-3 [100] | — | (B)-4 [29.5] | — | (D)-1 [1.0] | (E)-1 [0.6] | (S)-1 [4,900] |
| Ex. 19 | (A)'-3 [100] | — | (B)-5 [40.1] | — | (D)-1 [1.5] | (E)-1 [0.6] | (S)-1 [4,900] |
| Comp. Ex. 8 | (A')'-1 [100] | — | (B)-1 [23] | — | (D)-1 [1.0] | — | (S)-1 [4,900] |
| Comp. Ex. 9 | (A')'-1 [65] | (A')'-2 [35] | (B)-1 [23] | — | (D)-1 [1.0] | — | (S)-1 [4,900] |

In Table 6, the values in brackets [ ] indicate the amount (in terms of parts by weight) of the component added.
Further, in Table 6, the reference characters indicate the following.
(A)'-1: the aforementioned polymeric compound 2A
(A)'-2: the aforementioned polymeric compound 2B
(A)'-3: the aforementioned polymeric compound 2E
(A')'-1: the aforementioned polymeric compound 1Y
(A')'-2: the aforementioned polymeric compound 1Z
(B)-1: the compound represented by the aforementioned chemical formula (B)-1
(B)-2: the compound represented by the aforementioned chemical formula (B)-2
(B)-3: the compound represented by the aforementioned chemical formula (B)-3
(B)-4: the compound represented by the aforementioned chemical formula (B)-4
(B)-5: the compound represented by the aforementioned chemical formula (B)-5
(D)-1: tri-n-octylamine
(E)-1: salicylic acid
(S)-1: a mixed solvent of PGMEA/PGME = 6/4 (weight ratio)

Using the obtained positive resist composition solutions, the following evaluations were conducted.
<Evaluation of Lithography Properties>
[Evaluation of Resist Pattern Formation]

Using a coater ("Clean Track ACT-8" (a product name), manufactured by Tokyo Electron Co., Ltd.), each of the resist compositions was uniformly applied onto an 8-inch silicon substrate which had been treated with hexamethyldisilazane (HMDS) at 90° C. for 30 seconds, and was then subjected to a bake treatment (PAB) at a temperature indicated in Table 7 for 60 seconds, thus forming a resist film (film thickness: 60 nm).

This resist film was then subjected to direct patterning (exposure) with an electron beam lithography apparatus HL-800D (VSB) (manufactured by Hitachi, Ltd.) at an accelerating voltage of 70 keV, and was subsequently subjected to a bake treatment (PEB) at a temperature indicated in Table 7 for 60 seconds, developed for 60 seconds in a 2.38% by weight aqueous tetramethylammonium hydroxide (TMAH) solution (product name: NMD-3; manufactured by Tokyo Ohka Kogyo Co., Ltd.) at 23° C., and then rinsed with pure water for 15 seconds.

As a result, in each of the examples, a line and space (L/S) pattern with a line width of 100 nm and a pitch of 200 nm was formed.
[Evaluation of Sensitivity and Resolution]

In the formation of the above-mentioned resist pattern, the optimum exposure dose Eop (μC/cm$^2$) for formation of an L/S pattern with a line width of 100 nm and a pitch of 200 nm was determined. The results are shown in Table 7.

Further, the critical resolution (nm) at the above Eop value was determined, and the results are shown in Table 7 as "Resolution".
[Evaluation of Line Width Roughness (LWR)]

With respect to each of the L/S patterns formed with the above Eop and having a line width of 100 nm and a pitch of 200 nm, the line width at 5 points in the lengthwise direction of the line were measured using a measuring scanning electron microscope (SEM) (product name: S-9220, manufactured by Hitachi, Ltd.), and from the results, the value of 3 times the standard deviation s (i.e., 3s) was calculated as a yardstick of LWR. The smaller this 3s value is, the lower the level of roughness of the line width, indicating that an L/S pattern with a uniform width was obtained. The results are shown in Table 7.
[Evaluation of Pattern Shape]

Each of the L/S patterns having a line width of 100 nm and a pitch of 200 nm and formed with the above Eop was observed using a scanning electron microscope (product name: S-9220, manufactured by Hitachi, Ltd.), and the cross-sectional shape of the L/S pattern was evaluated with the following criteria. The results are shown in Table 7.

A: The line side walls were perpendicular with respect to the substrate surface at the interfacial portion with the substrate, and the rectangularity of the pattern was high.

B: Although the line side walls were perpendicular with respect to the substrate surface at the interfacial portion with the substrate, and the top portions of the pattern were slightly rounded.

C: The pattern had a T-top shape and the rectangularity of the pattern was low.

TABLE 7

| Positive resist composition | PAB (° C.) | PEB (° C.) | Eop (μC/cm²) | Resolution (nm) | LWR (nm) | Pattern shape |
|---|---|---|---|---|---|---|
| Ex. 10 | 80 | 80 | 38 | 50 | 14.8 | A |
| Ex. 11 | 100 | 80 | 66 | 50 | 11.5 | A |
| Ex. 12 | 100 | 80 | 60 | 50 | 12.5 | A |
| Ex. 13 | 100 | 80 | 40 | 50 | 12.0 | A |
| Ex. 14 | 100 | 80 | 58 | 50 | 10.2 | A |
| Ex. 15 | 80 | 80 | 38 | 50 | 14.5 | A |
| Ex. 16 | 100 | 80 | 66 | 50 | 11.0 | A |
| Ex. 17 | 100 | 80 | 60 | 50 | 12.2 | A |
| Ex. 18 | 100 | 80 | 40 | 50 | 11.5 | A |
| Ex. 19 | 100 | 80 | 58 | 50 | 10.0 | A |
| Comp. Ex. 8 | 80 | 80 | 68 | 60 | 15.2 | C |
| Comp. Ex. 9 | 80 | 80 | 54 | 60 | 15.0 | B |

As is evident from the above results, the positive resist compositions obtained in Examples 10 to 19 were superior in terms of resolution, shape, and LWR, as compared to the resist compositions obtained in Comparative Examples 8 and 9. In particular, the positive resist compositions obtained in Examples 11 to 14 and 16 to 19 exhibited favorable levels of LWR.

Polymer Synthesis Examples 16 to 30

Objective compounds were obtained by synthesizing using the same method as in Polymer Synthesis Examples 1 to 7 described above.

For each polymeric compound, the weight average molecular weight (Mw) and the dispersity (Mw/Mn) determined by the polystyrene equivalent value as measured by gel permeation chromatography (GPC) are shown in Table 8.

Further, each polymeric compound was analyzed by carbon 13 nuclear magnetic resonance spectroscopy (600 MHz, $^{13}$C-NMR) to determine the compositional ratio of the copolymer (ratio (molar ratio) of the respective structural units within the structural formula). The structural formula and compositional ratio of the copolymer for each polymeric compound are shown in Table 8.

The compounds (1), (2), (4) and (7) and structural formulas A-1 and A"-2 to A"-4 shown in Table 8 indicate the following.

[Chemical Formula 63]

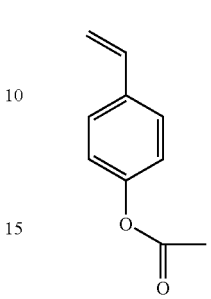

(1)

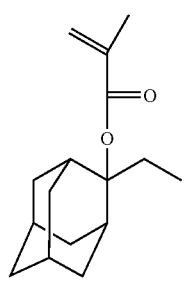

(2)

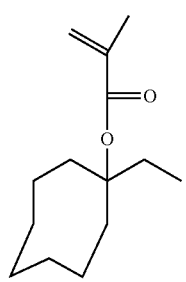

(4)

TABLE 8

| Polymeric compound | Monomer composition (molar ratio) | | | Molecular weight | Dispersity | Structural formula | Compositional ratio of copolymers |
|---|---|---|---|---|---|---|---|
| | (1) | (2) | (4) | | | | |
| 1L | 75 | 25 | | 6,700 | 1.79 | A-1 | m/n = 73.0/27.0 |
| 1H | 60 | 40 | | 6,700 | 1.83 | A-1 | m/n = 59.5/40.5 |
| 2A' | 75 | 20 | 5 | 6,100 | 1.89 | A"-2 | l/m/n = 74.5/21.3/4.2 |
| 2B' | 60 | 20 | 20 | 7,300 | 1.91 | A"-2 | l/m/n = 60.4/20.4/19.2 |
| 2C' | 75 | 15 | 10 | 6,800 | 2.03 | A"-2 | l/m/n = 74.8/16.7/8.5 |
| 2D' | 60 | 15 | 25 | 7,700 | 1.97 | A"-2 | l/m/n = 60.8/15.4/23.8 |
| 2E' | 65 | 15 | 15 | 7,300 | 2.0 | A"-2 | l/m/n = 69.3/16.6/14.1 |
| | (1) | (7) | (4) | | | | |
| 3L' | 75 | 25 | | 6,700 | 2.02 | A"-3 | m/n = 75.5/24.5 |
| 3H' | 60 | 40 | | 6,300 | 1.79 | A"-3 | m/n = 61.4/38.6 |
| 4A | 75 | 20 | 5 | 6,100 | 2.08 | A"-4 | l/m/n = 76.2/19.4/4.4 |
| 4B | 60 | 20 | 20 | 5,700 | 1.83 | A"-4 | l/m/n = 61.1/18.9/20.0 |
| 4C | 75 | 15 | 10 | 6,300 | 2.13 | A"-4 | l/m/n = 76.2/15.2/8.6 |
| 4D | 60 | 15 | 25 | 5,700 | 1.83 | A"-4 | l/m/n = 61.2/14.5/24.3 |
| 4E | 65 | 20 | 15 | 6,000 | 1.9 | A"-4 | l/m/n = 64.0/21.4/14.6 |
| 4F | 70 | 15 | 15 | 6,000 | 1.9 | A"-4 | l/m/n = 69.5/15.5/15 |

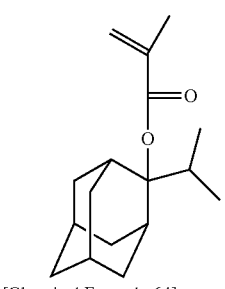

[Chemical Formula 64]

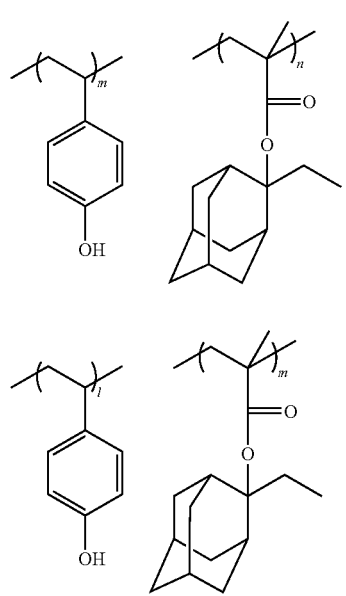

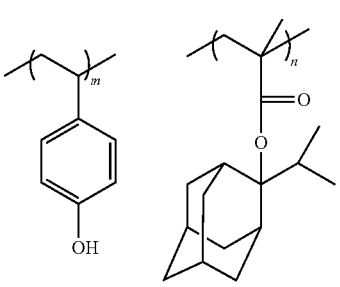

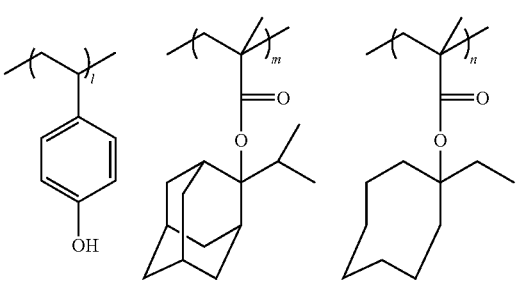

<Preparation of Positive Resist Composition Solution>

Examples 20 to 29, Comparative Examples 10 and 11

The components shown in Table 9 were mixed together and dissolved to obtain positive resist composition solutions.

TABLE 9

|  | Component (A)" | | Component (B) | | Component (D) | Component (E) | Component (S) |
|---|---|---|---|---|---|---|---|
| Ex. 20 | (A)"-1 | (A)"-2 | (B)-1 | — | (D)-1 | — | (S)-1 |
|  | [67] | [33] | [23] |  | [1.0] |  | [4,900] |
| Ex. 21 | (A)"-3 | — | (B)-1 | — | (D)-1 | — | (S)-1 |
|  | [100] |  | [23] |  | [1.0] |  | [4,900] |
| Ex. 22 | (A)"-3 | — | (B)-3 | — | (D)-1 | — | (S)-1 |
|  | [100] |  | [21.5] |  | [1.0] |  | [4,900] |
| Ex. 23 | (A)"-4 | — | (B)-1 | — | (D)-1 | — | (S)-1 |
|  | [100] |  | [23] |  | [1.0] |  | [4,900] |
| Ex. 24 | (A)"-3 | — | (B)-2 | (B)-3 | (D)-1 | (E)-1 | (S)-1 |
|  | [100] |  | [14.6] | [12.4] | [1.9] | [0.75] | [4,900] |
| Ex. 25 | (A)"-3 | — | (B)-2 | — | (D)-1 | (E)-1 | (S)-1 |
|  | [100] |  | [29.2] |  | [1.5] | [0.6] | [4,900] |
| Ex. 26 | (A)"-3 | — | (B)-4 | — | (D)-1 | (E)-1 | (S)-1 |
|  | [100] |  | [29.5] |  | [1.9] | [0.75] | [4,900] |
| Ex. 27 | (A)"-1 | (A)"-2 | (B)-5 | — | (D)-1 | (E)-1 | (S)-1 |
|  | [33] | [67] | [40.1] |  | [1.9] | [0.75] | [4,900] |
| Ex. 28 | (A)"-5 | — | (B)-1 | — | (D)-1 | — | (S)-1 |
|  | [100] |  | [23] |  | [1.0] |  | [4,900] |
| Ex. 29 | (A)"-5 | — | (B)-5 | — | (D)-1 | (E)-1 | (S)-1 |
|  | [100] |  | [40.1] |  | [1.9] | [0.75] | [4,900] |
| Comp. Ex. 10 | (A')"-1 | (A')"-2 | (B)-1 | — | (D)-1 | — | (S)-1 |
|  | [33] | [67] | [23] |  | [1.0] |  | [4,900] |

TABLE 9-continued

| | Component (A)" | Component (B) | Component (D) | Component (E) | Component (S) |
|---|---|---|---|---|---|
| Comp. Ex. 11 | (A')"-2 [100] | (B)-1 [23] | (D)-1 [1.0] | — | (S)-1 [4,900] |

In Table 9, the values in brackets [ ] indicate the amount (in terms of parts by weight) of the component added.
Further, in Table 9, the reference characters indicate the following.
(A)"-1: the aforementioned polymeric compound 2C'
(A)"-2: the aforementioned polymeric compound 2D'
(A)"-3: the aforementioned polymeric compound 2A'
(A)"-4: the aforementioned polymeric compound 2B'
(A)"-5: the aforementioned polymeric compound 2E'
(A')"-1: the aforementioned polymeric compound 1L
(A')"-2: the aforementioned polymeric compound 1H
(B)-1: the compound represented by the aforementioned chemical formula (B)-1
(B)-2: the compound represented by the aforementioned chemical formula (B)-2
(B)-3: the compound represented by the aforementioned chemical formula (B)-3
(B)-4: the compound represented by the aforementioned chemical formula (B)-4
(B)-5: the compound represented by the aforementioned chemical formula (B)-5
(D)-1: tri-n-octylamine
(E)-1: salicylic acid
(S)-1: a mixed solvent of PGMEA/PGME = 6/4 (weight ratio)

Using the obtained positive resist composition solutions, the following evaluations were conducted.

<Evaluation of Lithography Properties>

[Evaluation of Resist Pattern Formation]

Using a coater ("Clean Track ACT-8" (a product name), manufactured by Tokyo Electron Co., Ltd.), each of the resist compositions was uniformly applied onto an 8-inch silicon substrate which had been treated with hexamethyldisilazane (HMDS) at 90° C. for 30 seconds, and was then subjected to a bake treatment (PAB) at a temperature indicated in Table 10 for 60 seconds, thus forming a resist film (film thickness: 60 nm).

This resist film was then subjected to direct patterning (exposure) with an electron beam lithography apparatus HL-800D (VSB) (manufactured by Hitachi, Ltd.) at an accelerating voltage of 70 keV, and was subsequently subjected to a bake treatment (PEB) at a temperature indicated in Table 10 for 60 seconds, developed for 60 seconds in a 2.38% by weight aqueous tetramethylammonium hydroxide (TMAH) solution (product name: NMD-3; manufactured by Tokyo Ohka Kogyo Co., Ltd.) at 23° C., and then rinsed with pure water for 15 seconds.

As a result, in each of the examples, a line and space (L/S) pattern with a line width of 100 nm and a pitch of 200 nm was formed.

[Evaluation of Sensitivity and Resolution]

In the formation of the above-mentioned resist pattern, the optimum exposure dose Eop ($\mu C/cm^2$) for formation of an L/S pattern with a line width of 100 nm and a pitch of 200 nm was determined. The results are shown in Table 10.

Further, the critical resolution (nm) at the above Eop value was determined, and the results are shown in Table 10 as "Resolution".

[Evaluation of Line Width Roughness (LWR)]

With respect to each of the L/S patterns formed with the above Eop and having a line width of 100 nm and a pitch of 200 nm, the line width at 5 points in the lengthwise direction of the line were measured using a measuring scanning electron microscope (SEM) (product name: S-9220, manufactured by Hitachi, Ltd.), and from the results, the value of 3 times the standard deviation s (i.e., 3s) was calculated as a yardstick of LWR. The smaller this 3s value is, the lower the level of roughness of the line width, indicating that an L/S pattern with a uniform width was obtained. The results are shown in Table 10.

[Evaluation of Pattern Shape]

Each of the L/S patterns having a line width of 100 nm and a pitch of 200 nm and formed with the above Eop was observed using a scanning electron microscope (product name: S-9220, manufactured by Hitachi, Ltd.), and the cross-sectional shape of the L/S pattern was evaluated with the following criteria. The results are shown in Table 10.

A: The line side walls were perpendicular with respect to the substrate surface at the interfacial portion with the substrate, and the rectangularity of the pattern was high.

B: Although the line side walls were perpendicular with respect to the substrate surface at the interfacial portion with the substrate, and the top portions of the pattern were slightly rounded.

C: The pattern had a T-top shape and the rectangularity of the pattern was low.

[Evaluation of Exposure Margin (EL)]

With respect to the above Eop, the exposure dose with which an L/S pattern having a dimension of the target dimension (line width: 100 nm) ±10% (i.e., 95 nm to 105 nm) was determined, and the EL margin (unit: %) was determined by the following formula. The results are shown in Table 10.

EL margin (%)=(|E1−E2|/Eop)×100

(In the formula, E1 refers to an exposure dose (mJ/cm$^2$) for forming an L/S pattern having a line width of 95 nm, and E2 refers to an exposure dose (mJ/cm$^2$) for forming an L/S pattern having a line width of 105 nm.)

TABLE 10

| Positive resist composition | PAB (° C.) | PEB (° C.) | Eop ($\mu C/cm^2$) | Resolution (nm) | LWR (nm) | Pattern shape | EL (%) |
|---|---|---|---|---|---|---|---|
| Ex. 20 | 80 | 80 | 38 | 60 | 20.1 | A | 17.3 |
| Ex. 21 | 80 | 80 | 40 | 50 | 15.5 | A | 25.3 |
| Ex. 22 | 80 | 80 | 40 | 50 | 13.4 | A | 18.7 |
| Ex. 23 | 80 | 80 | 36 | 50 | 17.2 | B | 14.4 |
| Ex. 24 | 100 | 80 | 66 | 50 | 12.5 | A | 19.2 |
| Ex. 25 | 100 | 80 | 60 | 50 | 14.4 | A | 15.4 |
| Ex. 26 | 100 | 80 | 50 | 50 | 12.2 | A | 23.1 |
| Ex. 27 | 100 | 80 | 66 | 50 | 11.4 | A | 17.6 |
| Ex. 28 | 80 | 80 | 38 | 60 | 19.5 | A | 17.8 |
| Ex. 29 | 100 | 80 | 66 | 50 | 11.0 | A | 18.0 |
| Comp. Ex. 10 | 80 | 80 | 42 | 60 | 19.9 | C | 14.1 |
| Comp. Ex. 11 | 80 | 80 | 40 | 70 | 15.0 | C | 17.6 |

As is evident from the above results, according to the positive resist compositions obtained in Examples 20 to 29, a resist pattern having an excellent shape could be formed.

Further, when the positive resist compositions obtained in Examples 20, 28 and 29 and that obtained in Comparative Example 10 were compared, in which the protection ratios for the components (A)" used (i.e., the proportion of the structural unit having an acid dissociable, dissolution inhibiting group (mol %)) were equivalent, those obtained in Examples 20, 28 and 29 were superior in terms of shape and EL. The same trend was also observed when Example 23 and Comparative Example 11 were compared.

Furthermore, the positive resist compositions obtained in Examples 21, 24, 25, 26, 27 and 29 also exhibited favorable levels of LWR.

Examples 30 to 37, Comparative Examples 12 and 13

<Preparation of Positive Resist Composition Solution>

The components shown in Table 11 were mixed together and dissolved to obtain positive resist composition solutions.

TABLE 11

|  | Component (A)" | | Component (B) | Component (D) | Component (S) |
| --- | --- | --- | --- | --- | --- |
| Ex. 30 | (A)-6 | — | (B)-1 | (D)-1 | (S)-1 |
|  | [100] |  | [23] | [1.5] | [4,900] |
| Ex. 31 | (A)-6 | (A)-7 | (B)-1 | (D)-1 | (S)-1 |
|  | [67] | [33] | [23] | [1.5] | [4,900] |
| Ex. 32 | (A)-7 | — | (B)-1 | (D)-1 | (S)-1 |
|  | [100] |  | [23] | [1.5] | [4,900] |
| Ex. 33 | (A)-8 | — | (B)-1 | (D)-1 | (S)-1 |
|  | [100] |  | [23] | [1.5] | [4,900] |
| Ex. 34 | (A)-8 | (A)-9 | (B)-1 | (D)-1 | (S)-1 |
|  | [67] | [33] | [23] | [1.5] | [4,900] |
| Ex. 35 | (A)-9 | — | (B)-1 | (D)-1 | (S)-1 |
|  | [100] |  | [23] | [1.5] | [4,900] |
| Ex. 36 | (A)-10 | — | (B)-1 | (D)-1 | (S)-1 |
|  | [100] |  | [23] | [1.5] | [4,900] |
| Ex. 37 | (A)-11 | — | (B)-1 | (D)-1 | (S)-1 |
|  | [100] |  | [23] | [1.5] | [4,900] |
| Comp. Ex. 12 | (A')"-3 | (A')"-4 | (B)-1 | (D)-1 | (S)-1 |
|  | [33] | [67] | [23] | [1.5] | [4,900] |
| Comp. Ex. 13 | (A')"-4 | — | (B)-1 | (D)-1 | (S)-1 |
|  | [100] |  | [23] | [1.5] | [4,900] |

In Table 11, the values in brackets [ ] indicate the amount (in terms of parts by weight) of the component added.
Further, among the reference characters indicated in Table 11, (B)-1, (D)-1 and (S)-1 are as defined above, and other characters indicate the following.
(A)-6: the aforementioned polymeric compound 4A
(A)-7: the aforementioned polymeric compound 4B
(A)-8: the aforementioned polymeric compound 4C
(A)-9: the aforementioned polymeric compound 4D
(A)-10: the aforementioned polymeric compound 4E
(A)-11: the aforementioned polymeric compound 4F
(A')"-3: the aforementioned polymeric compound 3L'
(A')"-4: the aforementioned polymeric compound 3H'

Using the obtained positive resist composition solutions, the same evaluations as those described above (in Examples 20 to 29 and Comparative Examples 12 and 13) were conducted. The results are shown in Table 12.

TABLE 12

| Positive resist composition | PAB (° C.) | PEB (° C.) | Eop (μC/cm$^2$) | Resolution (nm) | LWR (nm) | Pattern shape | EL (%) |
| --- | --- | --- | --- | --- | --- | --- | --- |
| Ex. 30 | 80 | 80 | 32 | 50 | 14.0 | A | 23.2 |
| Ex. 31 | 80 | 80 | 36 | 50 | 10.5 | A | 23.8 |
| Ex. 32 | 80 | 80 | 36 | 50 | 11.7 | A | 17.7 |
| Ex. 33 | 80 | 80 | 28 | 50 | 14.2 | A | 27.3 |
| Ex. 34 | 80 | 80 | 32 | 50 | 12.4 | A | 26.4 |
| Ex. 35 | 80 | 80 | 34 | 50 | 11.0 | A | 19.4 |
| Ex. 36 | 80 | 80 | 36 | 50 | 10.3 | A | 24.0 |
| Ex. 37 | 80 | 80 | 32 | 50 | 12.0 | A | 26.0 |
| Comp. Ex. 12 | 80 | 80 | 40 | 70 | 12.5 | C | 18.7 |
| Comp. Ex. 13 | 80 | 80 | 38 | 60 | 13.7 | C | 16.6 |

As is evident from the above results, according to the positive resist compositions obtained in Examples 30 to 37, a resist pattern having an excellent shape could be formed.

Further, when the positive resist compositions obtained in Examples 31, 34 and 37 and the positive resist composition obtained in Comparative Example 12 were compared, in which the protection ratios for the components (A)" used were equivalent, those obtained in Examples 31, 34 and 37 were superior in terms of shape, resolution, EL and LWR, and the positive resist composition obtained in Example 31 particularly exhibited a low level of LWR. Likewise, when the positive resist compositions obtained in Examples 32 and 35 and the positive resist composition obtained in Comparative Example 13 were compared, those obtained in Examples 32 and 35 were superior in terms of shape, resolution, EL and LWR.

<Evaluation Using EUV Exposure>
[Evaluation of Resist Pattern Formation]

Using the resist compositions of Example 23 and a resist composition that included the components indicated in Table 13 shown below (Comparative Example 14), evaluations were conducted using EUV exposure, thereby obtaining a line and space pattern (L/S pattern) with a line width of 34 nm and a pitch of 68 nm.

Note that the conditions for PAB, PEB, developing, and rinse treatments were the same as those described above in Example 23 for forming a resist pattern using an electron beam (EB).

[Evaluation of Sensitivity and Line Width Roughness (LWR)]

The sensitivity and LWR were evaluated in the same method as described above in the section for [Evaluation of resist pattern formation], apart from the differences in the line width. The results are shown in Table 13.

[Evaluation of Depth of Focus (DOF)]

With respect to the resist composition obtained in Example 23, an evaluation of depth of focus (DOF) was also conducted as follows.

With the sensitivity indicated in Table 13, the focus was appropriately shifted up and down, and the depth of focus (DOF; unit: nm) within the range in which an L/S pattern could be formed was determined. The results are shown in Table 13.

The "DOF" is the range of depth of focus in which a resist pattern having a predetermined size within the range corresponding to the target size can be formed when the exposure focus is moved upwardly or downwardly with the same exposure dose, i.e., the range in which a resist pattern faithful to the mask pattern can be obtained. Larger DOF is more preferable.

TABLE 13

|  | Component (A)'' | Component (B) | Component (D) | Component (S) | Sensitivity (mJ/cm$^2$) | LWR (nm) | DOF (nm) |
|---|---|---|---|---|---|---|---|
| Ex. 23 | (A)''-4 [100] | (B)-1 [23] | (D)-1 [1.0] | (S)-1 [4,900] | 21 | 5.0 | 350 |
| Comp. Ex. 14 | (A)-12 [100] | (B)-1 [23] | (D)-1 [1.0] | (S)-1 [4,900] | 13 | 7.7 | 200 |

In Table 13, (A)-12 refers to a polymeric compound represented by formula (A)-12 shown below having a molecular weight of 8,000 and a dispersity of 1.5.

[Chemical Formula 65]

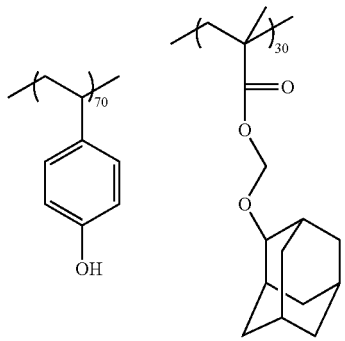

(A)-12

From the results shown in Table 13, it was confirmed that the LWR level of the resist composition obtained in Example 23 was superior to that of the resist composition obtained in Comparative Example 14 when using EUV exposure.

Furthermore, it was confirmed that the resist composition obtained in Example 23 was also superior to the resist composition obtained in Comparative Example 14 in terms of DOF. It is thought that the results are due to the favorable action of a combination of two types of protective groups having different levels of deprotection energy.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising:
   a base material component (A) that exhibits increased solubility in an alkali developing solution under action of an acid; and
   an acid generator component (B) that generates an acid upon exposure,
   wherein said base material component (A) includes a polymeric compound (A1) having a structural unit (a10) derived from hydroxystyrene and a structural unit (a11) represented by general formula (a11-1) shown below:

[Chemical Formula 1]

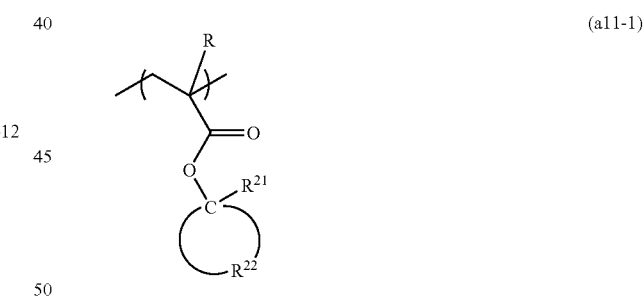

(a11-1)

wherein R represents a hydrogen atom, an alkyl group of 1 to 5 carbon atoms, or a halogenated alkyl group of 1 to 5 carbon atoms; $R^{21}$ represents an alkyl group; and $R^{22}$ represents a group that forms an aliphatic monocyclic group of 7 to 10-membered ring together with the carbon atom to which this $R^{22}$ group is bonded.

2. The positive resist composition according to claim 1, wherein the amount of said structural unit (a11) within said polymeric compound (A1), based on the combined total of all structural units constituting said polymeric compound (A1) is within a range from 5 to 60 mol %.

3. The positive resist composition according to claim 1, wherein said structural unit (a10) is represented by general formula (a10-1) shown below:

[Chemical Formula 2]

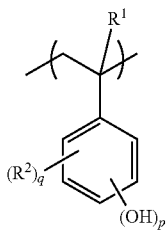

(a10-1)

wherein R¹ represents a hydrogen atom or an alkyl group of 1 to 5 carbon atoms; R² represents a halogen atom, an alkyl group of 1 to 5 carbon atoms or a halogenated alkyl group of 1 to 5 carbon atoms; p represents an integer of 1 to 3 and q represents an integer of 0 to 4, with the proviso that p+q is 1 to 5.

4. The positive resist composition according to claim 1, which further comprises a nitrogen-containing organic compound (D).

5. A method of forming a resist pattern comprising:
applying a positive resist composition of claim 1 on a substrate to form a resist film on the substrate;
subjecting said resist film to selective exposure, and
subjecting said resist film to alkali developing to form a resist pattern.

6. A positive resist composition comprising:
a base material component (A)' that exhibits increased solubility in an alkali developing solution under action of an acid; and
an acid generator component (B) that generates an acid upon exposure,
wherein said base material component (A)' includes a polymeric compound (A1)' having a structural unit (a10) derived from hydroxystyrene, a structural unit (a11)' represented by general formula (a11-1)' shown below, and a structural unit (a13) represented by general formula (a13-1) shown below:

[Chemical Formula 3]

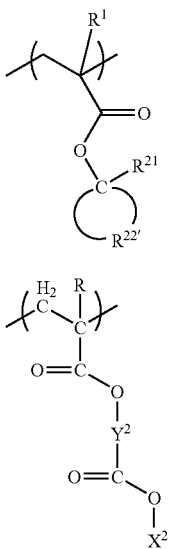

(a11-1)'

(a13-1)

wherein R represents a hydrogen atom, an alkyl group of 1 to 5 carbon atoms, or a halogenated alkyl group of 1 to 5 carbon atoms; R²¹ represents an alkyl group; R²²' represents a group that forms an aliphatic monocyclic group together with the carbon atom to which this R²²' group is bonded; Y² represents a divalent linking group; and X² represents an acid dissociable, dissolution inhibiting group.

7. The positive resist composition according to claim 6, wherein the combined amount of said structural units (a11)' and (a13) within said polymeric compound (A1)', relative to the combined total of all the structural units constituting said polymeric compound (A1)', is within a range from 20 to 50 mol %.

8. The positive resist composition according to claim 6,
wherein said structural unit (a10) is represented by general formula (a10-1) shown below:

[Chemical Formula 4]

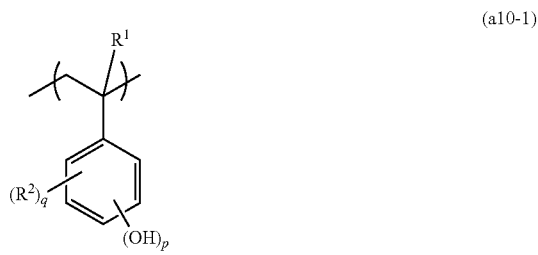

(a10-1)

wherein R¹ represents a hydrogen atom or an alkyl group of 1 to 5 carbon atoms; R² represents a halogen atom, an alkyl group of 1 to 5 carbon atoms or a halogenated alkyl group of 1 to 5 carbon atoms; p represents an integer of 1 to 3 and q represents an integer of 0 to 4, with the proviso that p+q is 1 to 5.

9. The positive resist composition according to claim 6, which further comprises a nitrogen-containing organic compound (D).

10. A method of forming a resist pattern comprising:
applying a positive resist composition of claim 6 on a substrate to form a resist film on the substrate;
subjecting said resist film to selective exposure, and
subjecting said resist film to alkali developing to form a resist pattern.

11. A positive resist composition comprising:
a base material component (A)" that exhibits increased solubility in an alkali developing solution under action of an acid; and
an acid generator component (B) that generates an acid upon exposure,
wherein said base material component (A)" includes a polymeric compound (A1)" having a structural unit (a10) derived from hydroxystyrene, a structural unit (a11)' represented by general formula (a11-1)' shown below, and a structural unit (a12) represented by general formula (a12-1) shown below:

[Chemical Formula 5]

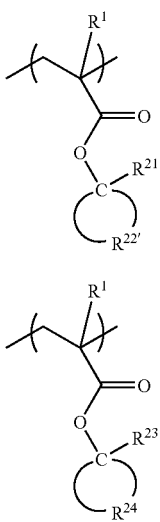

(a11-1)'

(a12-1)

wherein R represents a hydrogen atom, an alkyl group of 1 to 5 carbon atoms, or a halogenated alkyl group of 1 to 5 carbon atoms; $R^{21}$ represents an alkyl group; $R^{22'}$ represents a group that forms an aliphatic monocyclic group together with the carbon atom to which this $R^{22'}$ group is bonded; $R^{23}$ represents an alkyl group; $R^{24}$ represents a group that forms an aliphatic polycyclic group together with the carbon atom to which this $R^{24}$ group is bonded.

12. The positive resist composition according to claim 11, wherein the combined amount of said structural units (a11)' and (a12) within said polymeric compound (A1)", relative to the combined total of all the structural units constituting said polymeric compound (A1)", is within a range from 20 to 50 mol %.

13. The positive resist composition according to claim 11, wherein said structural unit (a10) is represented by general formula (a10-1) shown below:

[Chemical Formula 6]

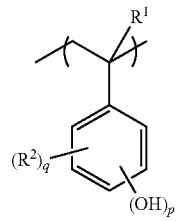

(a10-1)

wherein $R^1$ represents a hydrogen atom or an alkyl group of 1 to 5 carbon atoms; $R^2$ represents a halogen atom, an alkyl group of 1 to 5 carbon atoms or a halogenated alkyl group of 1 to 5 carbon atoms; p represents an integer of 1 to 3 and q represents an integer of 0 to 4, with the proviso that p+q is 1 to 5.

14. The positive resist composition according to claim 11, which further comprises a nitrogen-containing organic compound (D).

15. A method of forming a resist pattern comprising:
applying a positive resist composition of claim 11 on a substrate to form a resist film on the substrate;
subjecting said resist film to selective exposure, and
subjecting said resist film to alkali developing to form a resist pattern.

* * * * *

UNITED STATES PATENT AND TRADEMARK OFFICE
CERTIFICATE OF CORRECTION

PATENT NO.        : 8,232,040 B2
APPLICATION NO.   : 12/620339
DATED             : July 31, 2012
INVENTOR(S)       : Jun Iwashita and Takeyoshi Mimura It is certified that error appears in the above-identified patent and that said Letters Patent is hereby corrected as shown below:

At column 13, Line 60 (Approx.), Change "norbonyl" to --norbornyl--.

At Column 14, Line 25, Change "(a-4-1)" to --(a4-1)--.

At Column 14, Line 25, Change "(a-4-5)" to --(a4-5)--.

At Column 15, Line 32 (Approx.), Change "(a-4-1)" to --(a4-1)--.

At Column 15, Line 32 (Approx.), Change "(a-4-5)," to --(a4-5),--.

At Column 15, Line 36, Change "(18)" to --(a18)--.

At Column 15, Line 39, Change "(18)," to --(a18),--.

At Column 47, Line 51, Change "(a1'-1)'," to --(a11-1)',--.

At Column 53, Line 65, Change "$R^{2'}$" to --$R^{2'''}$--.

At Column 59, Lines 4-20,

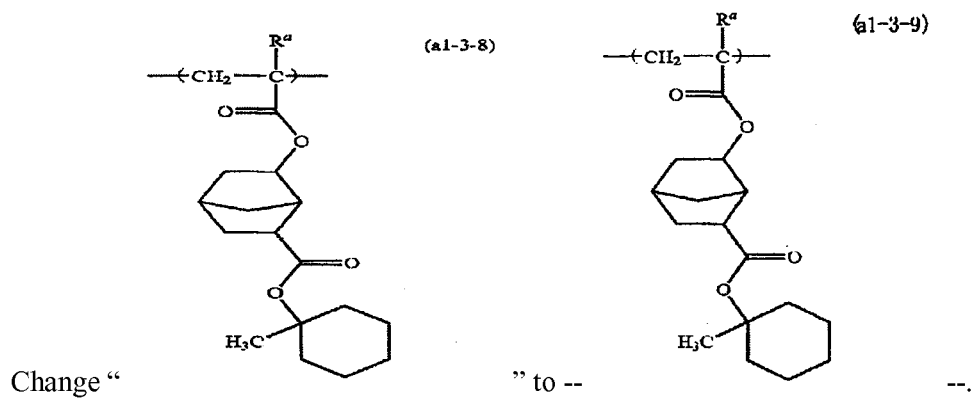

Change " " to -- --.

Signed and Sealed this
Twelfth Day of February, 2013

Teresa Stanek Rea
*Acting Director of the United States Patent and Trademark Office*

CERTIFICATE OF CORRECTION (continued)
U.S. Pat. No. 8,232,040 B2

At Column 76, Line 63, Change "(18)" to --(a18)--.

At Column 76, Line 65, Change "(18)," to --(a18),--.

At Column 92, Line 65, Change "(F)-1:" to --(E)-1:--.

At Column 96, Line 60, Change "(1-1)" to --(I-1)--.

At Column 96, Line 62, Change "(1-2)" to --(I-2)--.

At Column 97, Line 45, Change "(1)" to --(I)--.

At Column 98, Line 64, Change "H$^e$)," to --H$^c$),--.

At Column 99, Line 64, Change "H$^e$)," to --H$^c$),--.

At Column 100, Line 41, Change "H$^e$)," to --H$^c$),--.

At Column 117, Lines 45-55, In Claim 6,

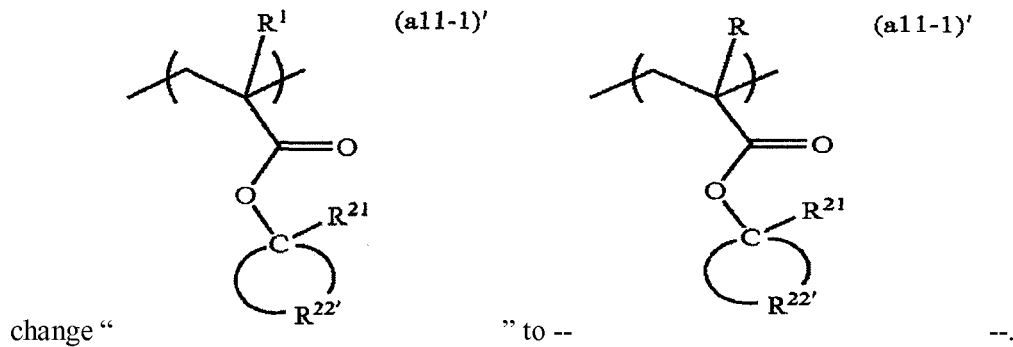

change " " to -- --.